(12) United States Patent
Rohde et al.

(10) Patent No.: US 10,958,410 B2
(45) Date of Patent: Mar. 23, 2021

(54) ADAPTIVE TIMING SYNCHRONIZATION FOR RECEPTION FOR BURSTY AND CONTINUOUS SIGNALS

(71) Applicant: Fraunhofer-Gesellschaft zur Foerderung der angewandten Forschung e.V., Munich (DE)

(72) Inventors: Christian Rohde, Erlangen (DE); Carmen Wagner, Erlangen (DE); Stefan Lipp, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/825,661

(22) Filed: Mar. 20, 2020

(65) Prior Publication Data
US 2020/0220706 A1    Jul. 9, 2020

Related U.S. Application Data

(63) Continuation of application No. PCT/EP2018/074349, filed on Sep. 10, 2018.

(30) Foreign Application Priority Data

Sep. 20, 2017 (EP) .................... 17192257

(51) Int. Cl.
*H04L 7/00* (2006.01)
*H04B 1/10* (2006.01)
(Continued)

(52) U.S. Cl.
CPC .......... *H04L 7/0029* (2013.01); *H03L 7/1075* (2013.01); *H04B 1/1027* (2013.01);
(Continued)

(58) Field of Classification Search
CPC ... H04L 7/0029; H04L 7/0083; H04L 7/0079; H04B 1/1027; H04B 7/2041; H04B 7/204; H03L 7/1075; H04W 52/0245
(Continued)

(56) References Cited

U.S. PATENT DOCUMENTS

| 6,108,538 A | 8/2000 | Blasiak et al. |
| 6,788,485 B2 | 9/2004 | Ashley et al. |

(Continued)

FOREIGN PATENT DOCUMENTS

| EP | 1981198 A1 | 10/2008 |
| EP | 2114011 A1 | 11/2009 |
| EP | 2256958 A2 | 12/2010 |

OTHER PUBLICATIONS

Alerti, X, et al., "System capacity optimization in time and frequency for multibeam multi-media satellite systems", 2010 5th Advanced Satellite Multimedia Systems Conference and the 11th Signal Processing for Space Communications Workshop, Cagliari, pp. 226-233.
(Continued)

*Primary Examiner* — Hirdepal Singh
(74) *Attorney, Agent, or Firm* — Perkins Coie LLP; Michael A. Glenn

(57) ABSTRACT

There are provided examples of receivers, controller units and related methods, wherein one receiver includes: an adjustable sample provider configured to provide samples of an input signal using an adjustable sample timing; a feedback path configured to provide a feedback signal to the adjustable sample provider on the basis of a timing error, wherein the feedback path includes a loop filter configured to provide sample timing information to the adjustable sample provider; and a replacement value provider configured to provide a replacement sample timing information replacing the sample timing information provided by the
(Continued)

feedback path when an input signal does not fulfil a predetermined requirement for a feedback-based sample timing adaptation, wherein the replacement value provider is configured to provide the replacement sample timing information considering a timing error information, or a quantity derived from the timing error information, over a longer time period when compared to a time period considered by the loop filter for a provision of the sample timing information.

32 Claims, 18 Drawing Sheets

(51) Int. Cl.
    *H03L 7/107* (2006.01)
    *H04L 25/03* (2006.01)
    *H04B 7/204* (2006.01)

(52) U.S. Cl.
    CPC .......... *H04L 7/0004* (2013.01); *H04L 7/0062* (2013.01); *H04L 7/0079* (2013.01); *H04L 25/03057* (2013.01); *H04B 7/204* (2013.01)

(58) Field of Classification Search
    USPC .......................................................... 375/355
    See application file for complete search history.

(56) References Cited

U.S. PATENT DOCUMENTS

| | | | | |
|---|---|---|---|---|
| 8,442,172 | B1* | 5/2013 | Dokania | H04B 1/7073 375/354 |
| 10,009,093 | B2* | 6/2018 | Purkayastha | H04W 64/00 |
| 10,278,130 | B2* | 4/2019 | Yang | H04W 48/16 |
| 2002/0016157 | A1 | 2/2002 | Arsenault et al. | |
| 2007/0009074 | A1* | 1/2007 | Ma | G11B 20/18 375/371 |
| 2007/0176825 | A1* | 8/2007 | Goldberg | H04B 7/02 342/378 |
| 2016/0112214 | A1* | 4/2016 | Currivan | H04L 27/2605 375/222 |
| 2016/0353372 | A1* | 12/2016 | Bishop, Jr. | H04W 72/005 |
| 2017/0227625 | A1* | 8/2017 | Markhovsky | G01S 1/042 |
| 2018/0026688 | A1* | 1/2018 | Weng | H04L 1/0033 375/267 |

OTHER PUBLICATIONS

Anzalchi, J, et al., "Beam Hopping in Multi-Beam Broadband Satellite Systems", 2010 5th Advanced Satellite Multimedia Systems (ASMS) Conference and the 11th Signal Processing for Space Communications (SPSC) Workshop, Cagliari, pp. 248-255.

Dmochowski, Pawel A, et al., "Joint timing and pilot symbol channel estimation for diversity receivers in rayleigh fading channels", Personal, Indoor and Mobile Radio Communications, 2004, PIMRC 2004. 15th IEEE International Symposium on Barcelona, Spain; vol. 3, Sep. 5, 2004 (Sep. 5, 2004), pp. 1658-1663, XP010754222, DOI: 10.1109/PIMRC.2004.1368282; ISBN: 978-0-7803-8523-8, Sep. 5, 2004, pp. 1658-1663.

ETSI, "Digital Video Broadcasting (DVB); Second generation framing structure, channel coding and modulation systems ( . . . ); Part 2: DVB-S2 Extension (DVB-S2X)", EN 302 307-2 V1.1.1, Oct. 2014.

Feltrin, Eros, et al., "Eutelsat Quantum-Class Satellite: Beam Hopping", 3rd ESA Workshop on Advanced Flexible Telecom Payloads, 8 pp.

Fenech, H, et al., "Eutelsat Quantum-a Game Changer", 33rd AIAA International Communications Satellite Systems Conference (ICSSC), QT Surfers Paradise, Gold Coast QLD Australia, Sep. 7-10, 2015.

Lei, Wang, et al., "Improved timing recovery loop in laser communication", 2016 2nd IEEE International Conference on Computer and Communications (ICCC), IEEE, XP033094849; DOI: 10.1109/COMPCOMM.2016.7925082, [retrieved on May 10, 2017], pp. 2159-2163.

Mengali, D'Andrea, "Synchronization Techniques for Digital Receivers", Plenum Press, New York, USA, 1997.(Chapter 7 + 8, pp. 353476), pp. 353-476.

Meyr, et al., "Digital Communication Receivers: Synchronization, Channel Estimation, and Signal Processing", Wiley Series in Telecommunications and Signal Processing, John Wiley & Sons, Inc., New York, USA, 1998 (pp. 79-147, 229-232), 1998, pp. 79-147, 229-232.

Nezami, Mohamed K., et al., "New schemes for improving non data-aided symbol timing recovery for QAM receivers in flat fading channels", EUROCOMM 2000. Information Systems for Enhanced Public Safety and Security. IEEE/AFCEA May 17, 2000, Piscataway, NJ, USA,IEEE, Jan. 1, 2000 (Jan. 1, 2000 ), XP010515044, ISBN: 978-0-7803-6323-6, Jan. 1, 2000, pp. 75-79.

Rohde, C, et al., "Super-Framing: A Powerful Physical Layer Frame Structure for Next Generation Satellite Broadband Systems", Int. Journal of Satellite Communications and Networking (IJSCN), Wiley Press, vol. 34, No. 3, SAT-15/0037.R1. Available: http://dx.doi.org/10.1002/sat.1153, pp. 413-438.

Rohde, Christian et al., "Application of DVB-S2X Super-Framing for Beam-hopping Systems", 23rd Ka and Broadband Communications Conference, Oct. 2017, Trieste, Italy, 7 pp.

* cited by examiner

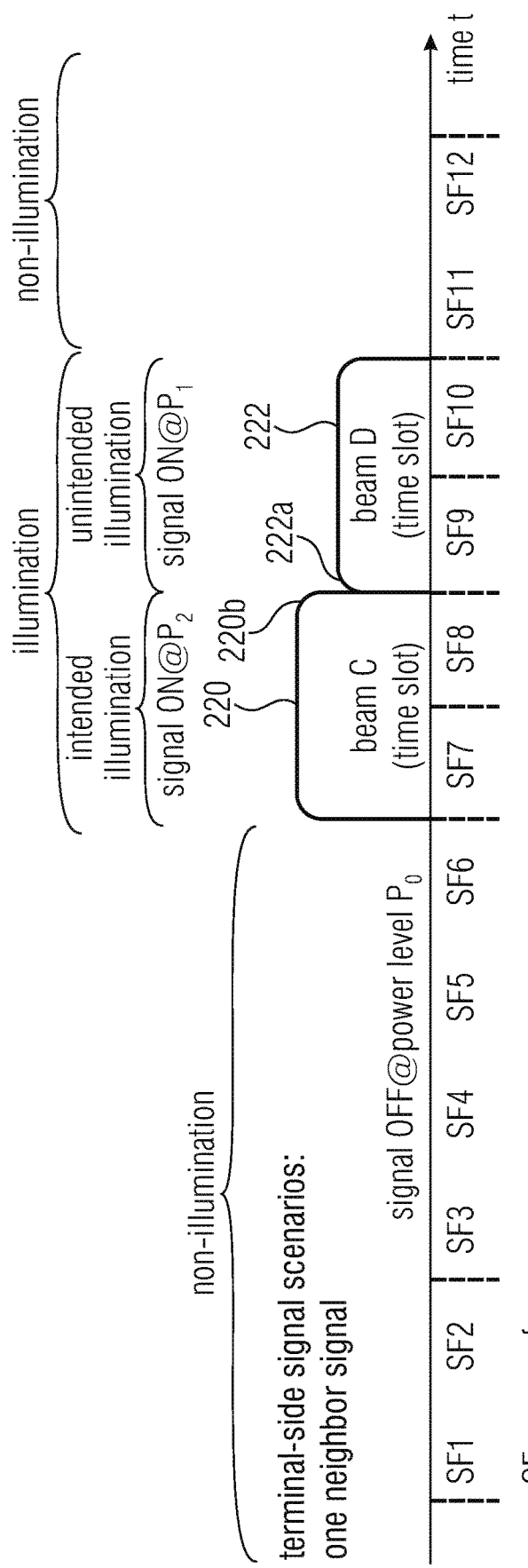
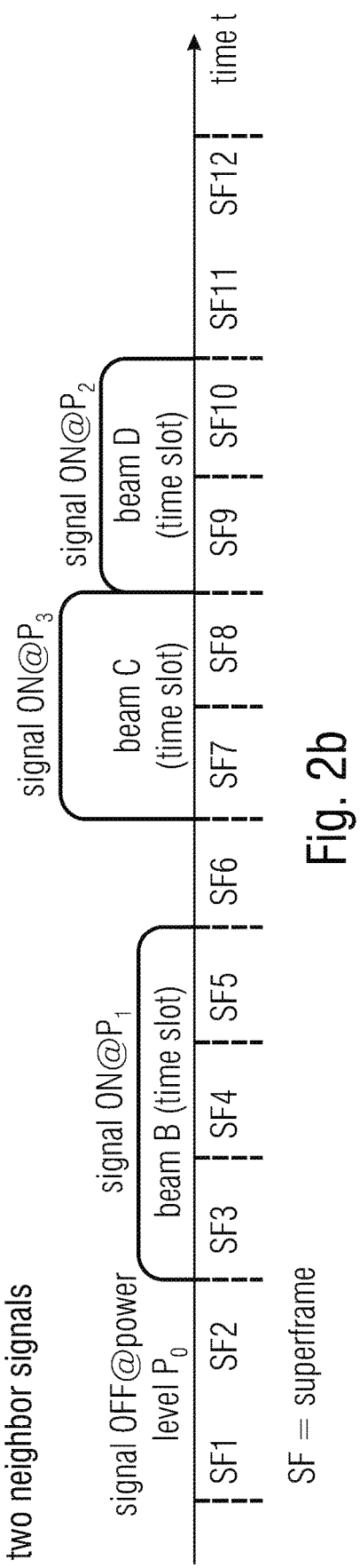

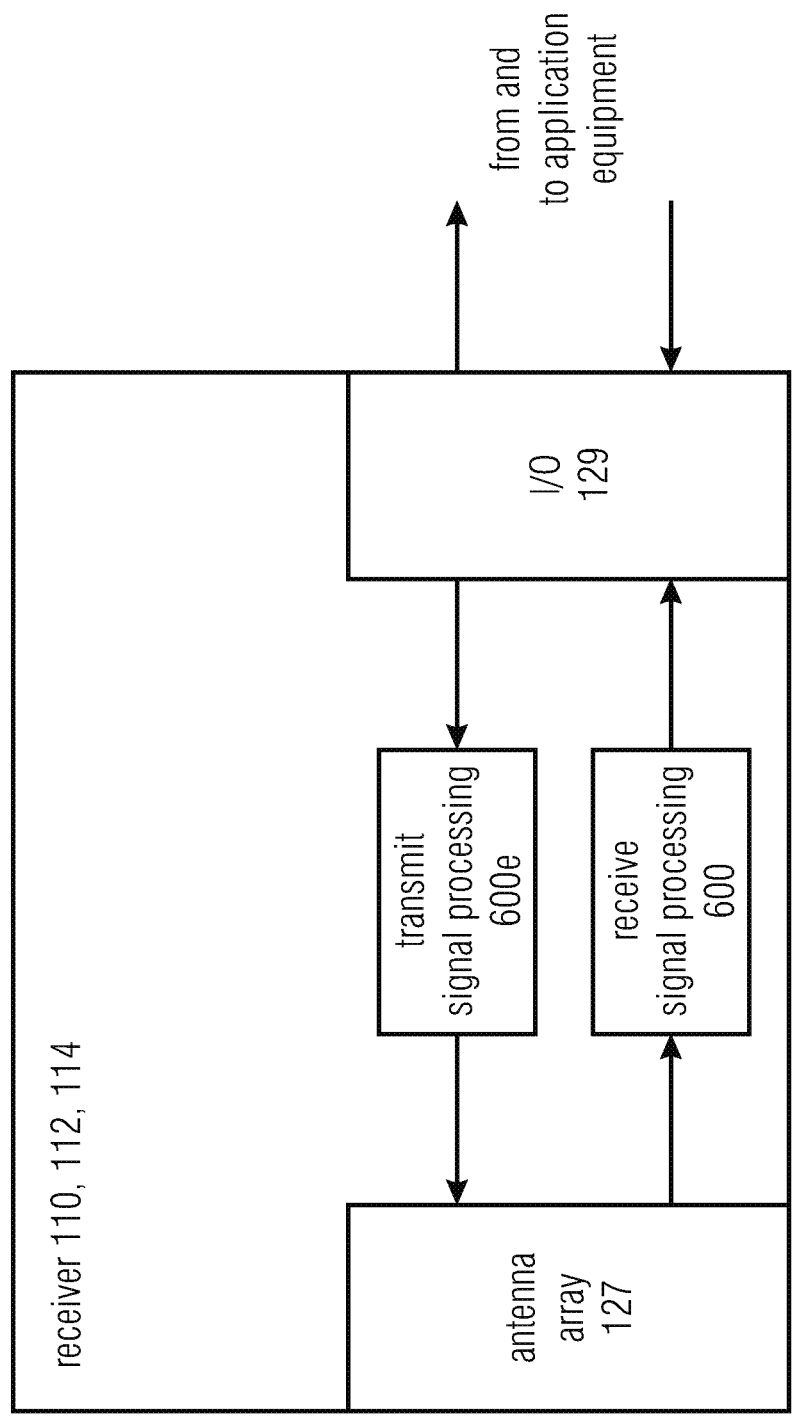

| time period | | power interval | | rank |
|---|---|---|---|---|
| SF11 | SF6 | $P_0 - \varepsilon_1$ | $P_0 + \varepsilon_2$ | 3 |
| SF9 | SF10 | $P_1 - \varepsilon_1$ | $P_1 + \varepsilon_2$ | 2 |
| SF7 | SF8 | $P_2 - \varepsilon_1$ | $P_2 + \varepsilon_2$ | 1 |

$P_0$ } assumed as noise $P_1$ } assumed as $P_2$ } chosen as illumination period 752a  752b  754a  754b
752   754   756
750

Fig. 7d

ADAPTIVE TIMING SYNCHRONIZATION FOR RECEPTION FOR BURSTY AND CONTINUOUS SIGNALS

CROSS-REFERENCES TO RELATED APPLICATIONS

This application is a continuation of copending International Application No. PCT/EP2018/074349, filed Sep. 10, 2018, which is incorporated herein by reference in its entirety, and additionally claims priority from European Application No. EP 17 192 257.8, filed Sep. 20, 2017, which is incorporated herein by reference in its entirety.

In the following, different inventive embodiments, examples and aspects will be described.

Also, further embodiments will be defined by the enclosed claims.

Embodiments as defined by the claims can be supplemented by any of the details (features and functionalities) described in the following chapters.

Embodiments described in the following chapters can be used individually, and can also be supplemented by any of the features in another chapter, or by any feature included in the claims.

Individual aspects described herein can be used individually or in combination. Thus, details can be added to each of said individual aspects without adding details to another one of said aspects.

BACKGROUND OF THE INVENTION

The present disclosure describes, explicitly or implicitly, features of a mobile communication device and of a receiver and of a mobile communication system. Thus, any of the features described herein can be used in the context of a mobile communication device and in the context of a mobile communication system (e.g. comprising a satellite). Therefore, disclosed techniques are suitable for all fixed satellite services (FSS) and mobile satellite services (MSS).

Moreover, features and functionalities disclosed herein relating to a method can also be used in an apparatus. Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

Hereinafter, embodiments of the invention may also be referred to as examples.

INTRODUCTION

A wireless receiver needs to be synchronized to a receive signal in order to decode it. A timing loop is an approach for synchronizing to continuous signals. For bursty signals however, it is possible to freeze the loop-feedback when no signal is present.

A first part (first aspect) of the invention refers, e.g., to additional means to the loop-feedback to enhance the open loop accuracy so that quick re-synchronization with little offset results. These additional means may imply the calculation of an accurate replacement value at numerically controlled oscillator (NCO)-input and control of the loop-feedback path depending on freezing is set ON or OFF. A low complexity embodiment is proposed and proven to achieve the same accuracy as the alternative large complexity embodiment.

A second part of the invention (second aspect) refers, e.g., to how the freezing signal is generated. The generation of the freezing signal may be used independently from the first aspect or in combination with the first aspect. According to the invention, a freezing controller may evaluate information from a power-level detection method and/or a known-sequence detector (e.g. via correlation). Having both and the knowledge of the burst-size granularity, the freezing controller can adaptively switch between the continuous signal reception mode or the bursty signal reception mode. In the latter case, the two detection methods may be used to identify and schedule the appropriate configuration for switching to freeze or not.

A third part (third aspect) regards an auxiliary module to the data frame synchronization. It may compensate and tackle a problem resulting from the quick timing loop re-synchronization at the beginning of each bursty signal reception. After re-convergence of the timing loop there is an uncertainty very few symbols w.r.t. the expected data framing grid. Thus, this module "Framing Verification and Correction" may estimate this offset and compensate for it.

SUMMARY

An embodiment may have a controller unit for recognizing a transmission to be received, wherein the controller unit is configured to: perform a determination whether a power of a receive signal, or a quantity derived from the power, lies within a limited interval, and recognize a transmission to be received based on the determination that the power of the receive signal, or the quantity derived from the power, lies within the limited interval, and recognize different power levels of the receive signal, or of the quantity derived from the power, and periods of time during which the different power levels are present, so as to rank the different time periods to recognize the time periods for the transmission to be received and/or to re-configure a receiver differently for different time periods.

According to another embodiment, a method for recognizing a transmission to be received may have the steps of: determining if a power of a receive signal, or a quantity derived from the power lies within a limited interval, and recognizing a transmission to be received based on the determination that the power of the receive signal, or the quantity derived from the power, lies within the limited interval recognizing different power levels of the receive signal, or of the quantity derived from the power, and periods of time during which the different power levels are present, so as to rank the different time periods to recognize the time periods for the transmission to be received and/or to re-configure a receiver differently for different time periods.

Another embodiment may have a non-transitory digital storage medium having a computer program stored thereon to perform the method for recognizing a transmission to be received, the method having the steps of: determining if a power of a receive signal, or a quantity derived from the power lies within a limited interval, and recognizing a transmission to be received based on the determination that the power of the receive signal, or the quantity derived from the power, lies within the limited interval recognizing different power levels of the receive signal, or of the quantity derived from the power, and periods of time during which the different power levels are present, so as to rank the different time periods to recognize the time periods for the transmission to be received and/or to re-configure a receiver differently for different time periods, when said computer program is run by a computer.

BRIEF DESCRIPTION OF THE DRAWINGS

Embodiments of the present invention will be detailed subsequently referring to the appended drawings, in which:

FIGS. 2A and 2B: show terminal-side receive signal scenarios with multiple illuminations.

FIG. 6e: shows an example of a receiver.

FIG. 7d: shows a table stored in a memory unit according to an example.

DETAILED DESCRIPTION OF THE INVENTION

Transmission and Signal Reception Scenarios

It is a global trend to have faster and more flexible communication all over the world. Terrestrial networks are well suited for serving densely populated areas. However, this trend will include oceans, sky, diverse and sparsely populated areas as well—a satellite communication scenario that may be enveloped in its requirements. In order to optimally adapt the technology to changing traffic demands over time and location, a novel beam-hopping concept has been introduced. In contrast to the quasi-static illumination in a conventional multi-beam satellite system, the satellite switches its beams on and off according to a specific schedule, which is derived from the traffic demands and the user terminal locations. The gains in terms of system capacity optimization and better matching the traffic demands are shown in [1] and [2].

The upcoming Eutelsat Quantum-Class Satellite is a software defined Ku-band satellite that offers in-orbit flexibility in all the operational parameters of the payload including service area definition, frequency plan and power allocation [3]. It also supports the beam-hopping function which will provide a presence over the visible earth as seen by the satellite with great flexibility in capacity allocation. It is believed to be the first open standard beam-hopping system and will support independent beam hopping networks [4]. The system, due for service in 2019, utilises rapid and seamless beam-forming reconfiguration that can be applied to a variety of applications such as mobility, disperse geographical areas and emergency and Governmental services.

Figure 1:
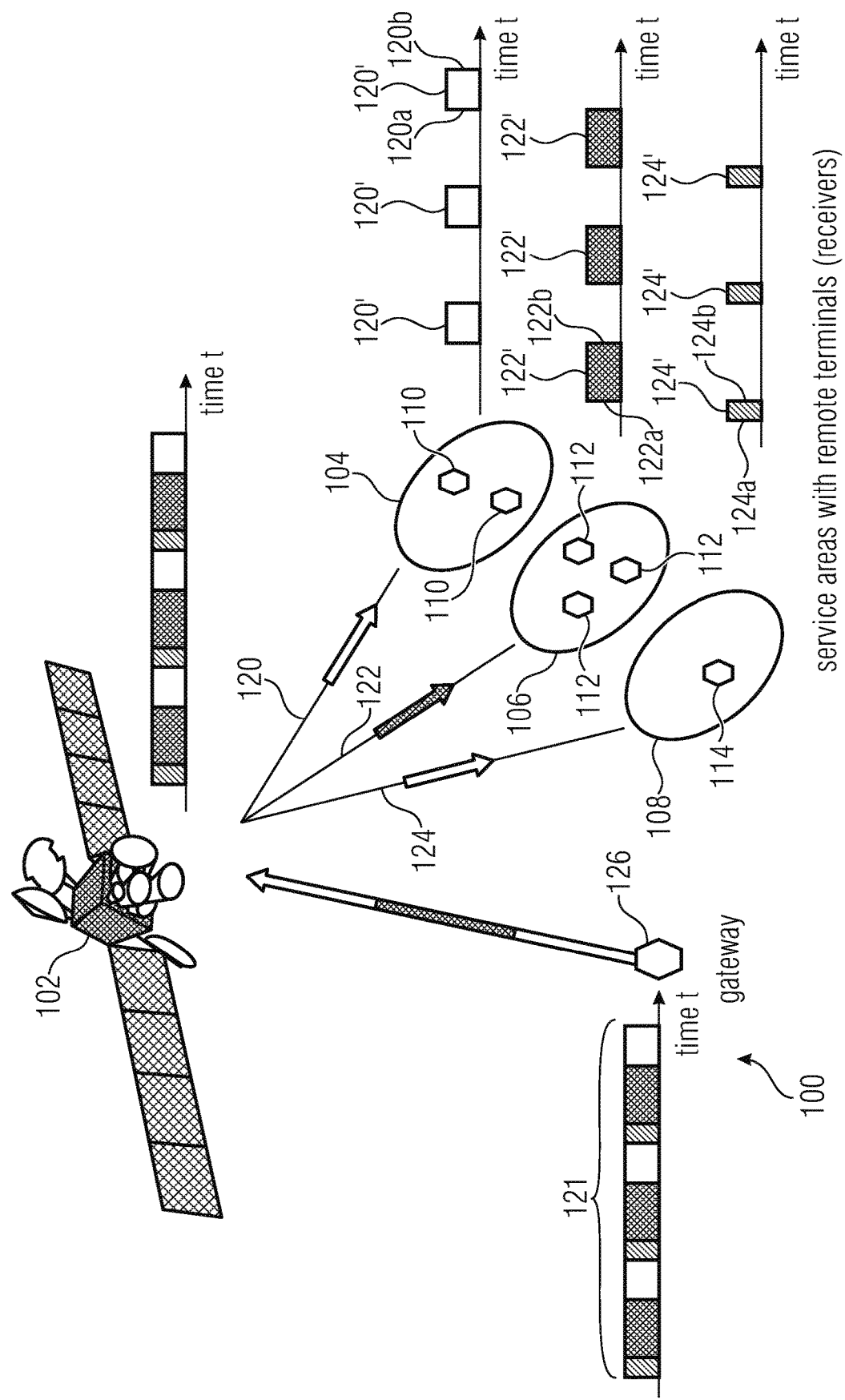
FIG. 1: shows an example of a system with a transmitter and receivers. Time slots are distributed to different service areas via beam-hopping satellite system.

In order to run, for example, such a system, a suitable waveform plays a major role. A suitable one is the super-framing specification of the recently released DVB-S2X standard [5]. A corresponding application example is shown in FIG. 1, where a satellite 102 (transmitter) serves three service areas 104, 106, 108 (e.g., geographically distinguished terrestrial areas) according to a beam-switching time plan (BSTP) 121.

The concept of BSTP may be understood as a generalization of a scheduling plan: time is subdivided into periodic time slots of individual duration per each particular coverage area, and each time slot is in turn subdivided into a plurality of super-frames. Each time slot may be an illuminated time slot (or period) or a non-illuminated time slot. Each receiver in the coverage area is meant at receiving a beam signal from the transmitter during an illuminated time slot. Each receiver in the coverage area is in general not meant at receiving a beam from the transmitter during a non-illuminated time slot. The definition of the BSTP is in general performed to optimize the transmission from the transmitter to the receivers in order to meet data traffic demands, which vary over time and location.

The definition of the particular BSTPs 121 may result from the different amounts of remote terminals (receivers) 110, 112, 108 per service area 104, 106, 108 and therefore different traffic demand. Consequently, different numbers of super-frames are transmitted to the different service areas (e.g., on the basis of a switching activity performed by the satellite 102). Since the demands change over time and location, a scheduler at the gateway 116 calculates new BSTPs 121 and forwards (e.g., by signalling) the obtained switching schedule (e.g., BTSPs) to the satellite 102 (or other device which will be the transmitter). As found in [6], the so-called super-framing formats 2, 3, and 4 are ready to use for beam-hopping systems. (In some examples, the gateway may be integrated in the transmitter.) In FIG. 1, showing a system 100, the satellite 102 (e.g., receiving communications form a gateway 116 and/or following the chosen BTSPs) directs a beam 120 towards the remote terminals 110 at coverage area 104 during time slots 120'; beam 122 towards the remote terminals 112 at coverage area 106 during time slots 122'; and a beam 124 towards the remote terminals 114 at coverage area 108 during time slots 124'. For each of the remote terminals, the time slots in which it receivers the beam from the transmitter are illuminated time slots. For the terminals 110, time slots 120' are illuminated time slots, while time slots 122' and 124' are non-illuminated time slots to the terminals 110. In some examples, the time slots 120', 122', 124' are meant at not being superposed with each other realizing a time multiplex. Therefore, it is in general advantageous that the terminals 110 are able to reliably distinguish the illuminated time slots 120' from the non-illuminated time slots 122' and 124'.

A satellite such as the satellite 102 may support several beam-hopping networks, i.e. several systems such as system 100.

Note that the transmission example in FIG. 1 represents only one possible example among a multitude of possible system configurations. An important feature of the concept lies in the ability to re-configure nearly arbitrarily to best meet the traffic demands. Fortunately, one can count on the granularity of illumination duration to be a multiple of super-frames duration. The satellite works based on time slots and will have a supported granularity of e.g. 1 µs in order to be freely configurable and provide support of a large variety of symbol rates. However, the applied waveform used for data transmission offers a granularity based on the super-frame duration or the described baseline super-frame duration. The terminal exploits the waveform features. Note that other framing concepts and conventions than the super-framing can be applied as well. E.g., one can specify cascaded super-frame durations, where there is a short baseline super-frame duration and the other super-frame durations are multiples of this baseline super-frame duration.

From the remote terminal (110, 112, 114) perspective, four reception scenarios can occur in a beam-hopping satellite system w.r.t. one carrier frequency:

Repetitive illumination receiving signal of one beam (for one service area or coverage), which corresponds to the case shown in FIG. 1. As may be seen in FIG. 1, the start 120a (or 122a, 124a) and the end 120b (or 122b, 124b) of the illuminations correspond with the start and the end of the receptions: the receiver 110, for example, does not receive a beam 122 or 124 directed towards another area. Notably, there may be problems for the timing of the receiver when the receiver is not illuminated.

Repetitive illumination receiving signal of multiples beams (for different service areas or coverages). For smooth handover of terminals, neighboring coverages can be subjected to a small overlap. Consequently, the terminal at edge of coverage can receive the illuminations of at least two beams as shown in FIG. 2A. For example, beam C (which is, correctly, meant to be received by a particular receiver during the illuminated slot 220 formed by the super-frames SF7 and SF8) is received at maximum power $P_2$; However, beam D (which is actually meant to be received by a different neighboring service area during the slot 222 formed by the super-frames SF9 and SF10) is also received, even if at a power level $P_1$ which is smaller than $P_2$. It is noted that at the end 220b of the illumination by beam C, which also corresponds to the start 222a of the illumination by beam D, only a slight reduction in power $P_2$-$P_1$ occurs. This phenomenon can result in undesired effects: a receiver may want to avoid to receive unnecessary transmissions. By avoiding the decoding of undesired transmissions, for example, power consumption could be reduced. On the other hand, reception could be advantageous to enhance the terminal synchronization exploiting the unintended transmissions, which may have, for example, a high signal to noise (SNR) ratio. It has been noted, however, that exploiting the unintended transmissions needs also more sophisticated synchronization procedures to cope with this challenge. If the terminal synchronization procedures are not aware of this scenario, they can get confused and terminal synchronization would fail.

Continuous illumination with one signal is the other extreme. All users are in one service area (coverage area) e.g. a fleet of ships and only beam-forming is used to adapt the beam steering. Therefore, the optimum configuration is to permanently illuminate the service area.

No illumination. This happens when all terminals are off and no demand is stated. However once, the first terminal in a service area is switched on. Then a secondary system control channel may be used by the terminal to demand illumination, e.g., by signalling the request to the transmitter (e.g., satellite 102). After that, the gateway 116 (e.g. informed by the satellite 102) will define super-frames adapted to the communications with the first terminal and will issue a BSTP update including the new coverage area. After this, the first terminal will therefore operate according to one of the scenarios above.

The length of each illumination can change with a BSTP update and the duty cycle of illumination.

Problems and Challenges

From the terminal (110-114) point of view, a major problem is to achieve an accurate timing (re-) synchronization, to be robust enough to handle all the above stated scenarios. Initial coarse acquisition can be accomplished also quite straight forward. At end of illumination (e.g., 120b, 122b, 124b, 220b) all the synchronization algorithms may have converged and offsets may have been compensated. However, a challenge lies rather in immediate re-synchronization when illumination starts again (e.g., at 120a, 122a, 124a), to continue with payload data demodulation after a potentially present preamble sequence. The needed accuracy lies in the order of fractions of a symbol duration, i.e. the timing or sampling phase. Sampling phase offsets generate self-interference, which can lead to data demodulation errors.

Having a close look to the immediate re-synchronization, another issue has been identified. During the timing re-synchronization at the start of illumination, the preamble sequence detection marks the start-of-burst and (re-)initialize the data framing tracker. This tracker marks the different data fields and payload data frames according to the burst structure. Since timing re-synchronization and preamble sequence detection may run in parallel, there is an uncertainty of very few symbols w.r.t. the framing grid (expected from previous bursts by signaling or history and/or common burst structure). Due to impairments like noise, there is a chance/probability that the timing re-synchronization converges to a steady state symbol grid, which is +/−1 or +/−2 symbols away from the expected symbol-precise data framing grid. This can occur since the convergence time can be in the same order or even longer than the duration of the start-of-burst preamble sequence and its detection. If uncompensated, this symbol offset yields data demodulation and decoding errors of the whole burst.

A further problem is to have a suitable and dependable detection strategy for determining the start and end of illumination. The latter information shall reliably be estimated and signalled to other functions and/or or equipment like those managing the timing synchronization. If start of illumination is erroneously determined too early, only noise samples, instead of data, are processed and the synchronization is disturbed. If start of illumination is determined late, valuable synchronization data are lost, and time, because not exploited for re-synchronization, is wasted. Again data demodulation errors and data loss are the consequence.

Another aspect is the demand for wideband communication, i.e. high-speed data transmission. This comes from the time-multiplex approach of the data transmission. If a conventional system serves each of e.g. 10 service areas permanently with 30 MHz symbol rate, then a beam-hopped system needs a 300 MHz wide carrier shared into 10 illumination time slots in order to achieve the same throughput. In consequence, the terminal has to support a considerable processing power to cope with the high data throughput during illumination.

Solutions in the Prior Art and Their Shortcomings

There are two conventional concepts to deal with the main problem stated above. However, both show some short comings, which are overcome by examples according to aspects of the invention.

Figure 3:
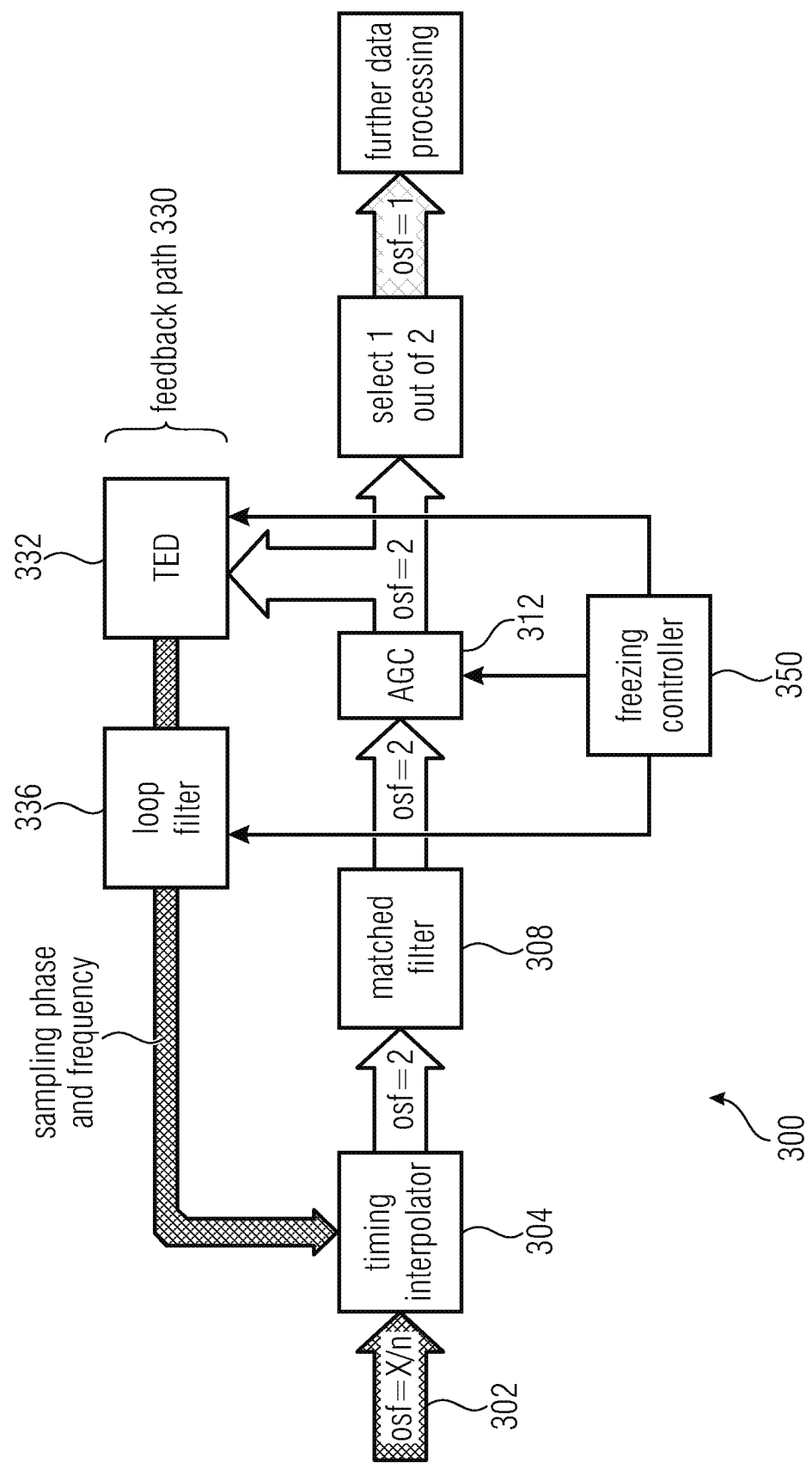
FIG. 3: shows a timing loop with an added freezing controller according to the prior art.

1. Detect & Buffer:
    This concept applies first a detection stage, where start and end of illumination is detected. Non-data-aided (NDA) power detection based algorithms can be used for this and/or data-aided (DA) known-sequence detection (e.g. by correlation). Based on this detection and decision received data samples are stored in a buffer. Coarse and fine synchronization (w.r.t. timing and frequency) and all further processing are made based on the buffered data. Thanks to this storage, the synchronization processing can work iteratively/recursively on the buffered data to refine the offset compensation.
2. Freezing timing loop during absent illumination:
    The timing loop concept as shown in the signal processing 300 of FIG. 3 is a standard approach to synchronize the sampling offset in a recursive way. Different configurations and processing rules concerning the modules "timing interpolator" 304, "automated gain control (AGC)" 312, "timing error detector (TED)" 332, and "loop filter" 336 can be found in standard literature like [7] and [8]. A matched filter 308 is also used.
    The timing interpolator 332 does resampling of input data 302 according to the control signal of the feedback path 330 from the loop filter 336. With the loop filter 336 the adaptation rate and dynamic characteristics of the whole loop can be influenced. This filter 336 has normally a low-pass and averaging character to smooth the instantaneous timing errors/offsets calculated in the TED 332. This principle works fine for continuous signal reception. After an initial convergence of this control loop, it provides accurate re-sampling to compensate for timing offsets (sampling phase and sampling frequency) thanks to permanent re-adjustment via the feedback path 330.
    A freezing controller 350 holds the adaptation processes constant once freezing is switched ON. This may be needed if no illumination or too weak illumination is present.

Concept 1 seems appealing to be a practical solution for this problem. However, it may potentially need very large buffers to handle also long illuminations. It may also suffer from throughput limitations w.r.t. support of different scenarios and worst-case system configuration like a continuous signal reception. So this approach is more suitable for middle to lower symbol rates and rather low duty cycles. These low duty cycles refer to either a conventional burst mode reception scenario, so that only the own data frame is received and not a complete super-frame with other user data as well, or a sufficiently long illumination absence duration in combination with only on or a few super-frames per illumination.

Concept 2 is in principle applicable under the condition that the freezing controller works accurately in order to not compromise the already achieved offset compensation. However, in depth investigations turn out that the control signal of the feedback path of the timing loop shows too much jitter. This is an issue since the last value will be frozen and is kept constant over the whole time of illumination absence. Therefore, the actual error of the value accumulates since no updates of the loop can be made. In consequence, re-synchronization at start of illumination will start at a random amount of symbols off the expected grid so that the preamble/known sequence will be located at a non-expected point in time w.r.t. the assumed sampling.

Power detection methods seem to be straight forward. And the term detection does not specify exactly what is detected. Intuitively, one would aim for detecting the rising edge and the falling edge of the (potentially averaged) receive power. Two classical approaches are analyzed in the following:

Threshold-based power detector:
    From the averaged receive power signal the minimum and maximum power is determined over an observation time. Thresholds are then calculated from these min/max power values for rising edge detection and falling edge detection. This procedure can be iterated to tracking slightly change receive power over time.

Slope-based power detector:
    The slope is calculated from the averaged receive power signal by means of a differential signal, i.e. subtracting power values of time distance $\Delta$. Once the power changes significantly, there will be a peak in the differential signal, which can be checked against a threshold.

Figure 4:
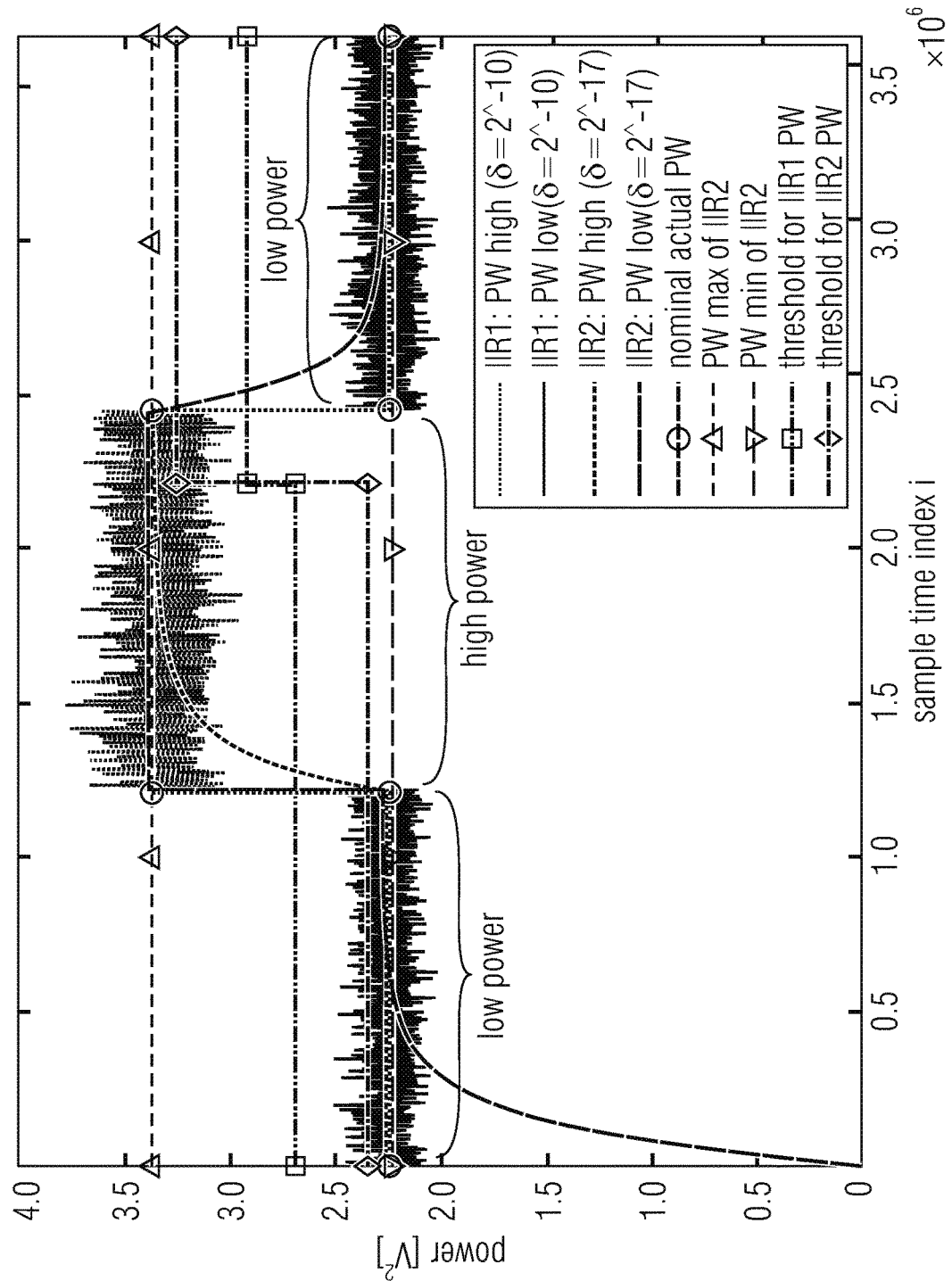
FIG. 4: shows a power detection using a threshold-based detector evaluating min/max power.
Figure 5:
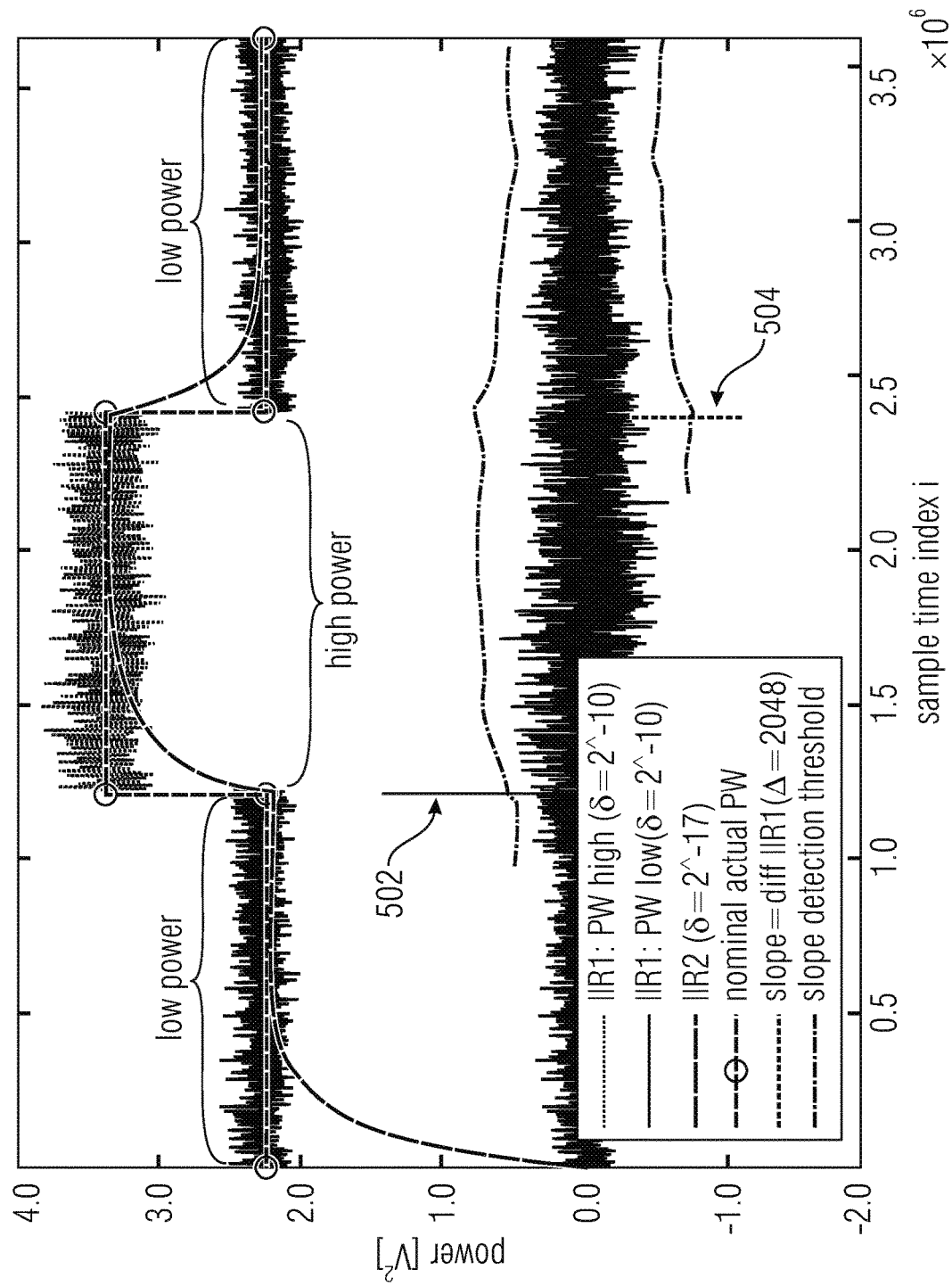
FIG. 5: shows a power detection using a slope-based detector.

Below simulation results of these two types are provided for a single illumination at SNR=−3 dB (assumed worst SNR to be expected). In FIG. 4 and FIG. 5 a threshold-based detector and a slope-based detector are considered, respectively. In both cases, first an averaging of the instantaneous power values is made because the fluctuation of the instantaneous power values would be too high. Here, averaging is implemented by infinite impulse response (IIR)-filters, where two configurations w.r.t. averaging depth are compared: IIR1 and IIR2. FIGS. 4 and 5 indicate detection of power high/low. However, other methods like linear averaging are in principle possible as well.

In FIG. 4, maximum and minimum mean power values are determined from IIR2 because of more precision due to strong averaging ("PW max (IIR2)", "PW min (IIR2)"). From this the threshold values are calculated "Thresh (IIR1)" and "Thresh (IIR2)". This detection was successful for both evaluated IIR configurations because of considering the scenario of receiving only a single beam. However, tests in different scenarios as those shown in FIG. 2A reveal that different beam signals cannot be distinguished properly, which leads to missing rise or fall detections. As a consequence, massive effort for case handling and error detection would be needed.

In FIG. 5, the differential signal is calculated based on IIR1 using $\Delta$=2048 samples. It is shown fluctuating around zero. Although peaks 502 and 504 in the differential signal can be, at least theoretically, observed and detected, there is some chance (e.g., under low SNR) that the detection is not successful. This is due to the noise enhancing nature of differential signal calculation. This unreliable detection performance becomes even more severe in multiple beam scenarios as shown in FIG. 2A: when transitioning from 220 to 222 (220b), the magnitude of the peak 504 will be reduced by an amount which is not extremely large, and there arises the undesired possibility that the peak 504 is confused with the noise.

For the problem of unexpected symbol offset after timing re-synchronization convergence, the two traditional approaches perform differently. Concept 1 will not exhibit this problem at all since the iterative/recursive refinement of the synchronization will compensate automatically. This is because synchronization quality is measured after each refinement iteration yielding detection of the symbol offset. Concept 2 in its straight-forward implementation will offer only a framing grid detection by means of the preamble sequence detection. So there are no counter-measures in concept 2 to treat the problem of unexpected symbol offset adequately.

In conclusion, the straight forward or conventional approaches do not solve the problems adequately.

Citation of Prior Art Documents

US 2002/0186802 A1 discloses a method for adaptively adjusting parameters of a timing loop. A loop filter obtains a phase error from a phase detector. The loop filter comprises a first gain or scaling stage (having an initial gain α) and a second gain stage (having an initial gain β). The timing loop parameters α and β may be modified on the basis of the difference between the average frequency error and the current frequency error being below or above a predetermined threshold.

US 2014/0312943 A1 discloses a phase locked loop, PLL.

US 2015/0002198 A1 discloses a PLL which may operate in a normal mode or in a speed mode. The speed mode is activated, for example, when the magnitude of the difference between the current phase error value and a value stored in a memory is less than a threshold.

However, the prior art fasil to address the problems discussed above. For example, the prior art does not permit to distinguish between a correctly illumination scenario and an incorrect illumination scenario. Further, the prior art does not permit to avoid freezing a timing value during non-illumination periods.

Summary of the Invention

In accordance to aspects, there is provided a receiver, comprising:
an adjustable sample provider configured to provide samples of an input signal using an adjustable sample timing;
a feedback path configured to provide a feedback signal to the adjustable sample provider on the basis of a timing error, wherein the feedback path comprises a loop filter configured to provide sample timing information to the adjustable sample provider; and
a replacement value provider configured to provide a replacement sample timing information replacing the sample timing information provided by the feedback path when an input signal does not fulfil a predetermined requirement for a feedback-based sample timing adaptation,
wherein the replacement value provider is configured to provide the replacement sample timing information considering a timing error information, or a quantity derived from the timing error information, over a longer time period when compared to a time period considered by the loop filter for a provision of the sample timing information.

In accordance to aspects, there is provided a receiver, comprising
an adjustable sample provider configured to provide samples of an input signal using an adjustable sample timing;
a feedback path configured to provide a feedback signal to the adjustable sample provider on the basis of a timing error, wherein the feedback path comprises a loop filter configured to provide sample timing information to the adjustable sample provider; and
a replacement value provider configured to provide a replacement sample timing information replacing the sample timing information provided by the feedback path when an input signal does not fulfil a predetermined requirement for a feedback-based sample timing adaptation;
wherein the replacement value provider is configured to temporally smoothen sample timing information provided by the loop filter and/or loop filter-internal timing information, in order to obtain the replacement sample timing information.

The replacement value provider may be configured to average sample timing information provided by the loop filter and/or timing error information and/or a quantity derived from the timing error information over a period of time which is longer than a period of time for which timing error information is considered by the loop filter to provide a current sample timing information.

The replacement value provider may be configured to filter or average over a longer time period when compared to loop filter, in order to provide the replacement sample timing information.

The loop filter may be a low pass filter and may be configured to perform an equally weighted averaging or an averaging putting comparatively smaller weight on past input values when compared to current input values.

The replacement value provider may be configured to perform linear averaging by means of equal or different weights for the input values of sample timing information provided by the loop filter, and/or timing error information, and/or a quantity derived from the timing error information.

The replacement value provider may be configured to select samples of the sample timing information to perform filtering or averaging on the selected samples.

The replacement value provider may be configured to perform an analysis of the signal so as to adaptively select samples of the timing error information, or of a quantity derived from the timing error information to perform filtering or averaging on the selected samples,
wherein the receiver is configured to reduce a distance between the selected samples and/or to increase a number of the selected samples for signals having a comparatively higher noise when compared to signals having a comparatively smaller noise.

The replacement value provider may be configured to adaptively select samples to perform filtering or averaging on the selected samples, so as to increase the averaging gain for an averaging length or filter length.

The replacement value provider may be configured to use a downsampled version to perform filtering or averaging on the downsample version.

The replacement value provider may be configured to use a downsampled version of the timing error information, or a quantity derived from the timing error information to perform filtering or averaging on the downsample version, so that the sampling rate of the downsampled version is at a first sampling rate which is between 100 times and 10000 times, or between 500 times and 2000 times, slower than a sampling rate of the timing error information or a quantity derived from the timing error information.

The replacement value provider may be configured to selectively consider samples of the timing error information, or of a quantity derived from the timing error information for the provision of the replacement timing information, such that a current replacement timing information is obtained on the basis of samples of at least two different considered time periods of the input signal during which the input signal fulfils a predetermined condition.

The replacement value provider may be configured to select samples of the timing error information, or a quantity derived from the timing error information, based on configuration data and/or a lookup table in dependence on a configuration or in dependence on a communication scenario.

The replacement value provider may be configured to adaptively select samples of the timing error information, or a quantity derived from the timing error information for the derivation of the replacement sample timing information on the basis of an analysis of the timing error information, or of a quantity derived from the timing error information.

The receiver may be configured to increase the loop gain and/or loop filter characteristic for an initial transitory interval.

The receiver may be configured to re-configure the loop gain/loop filter characteristic during operation on the basis of changed reception conditions.

The receiver may be configured to increase the loop gain and/or loop filter characteristic of the loop filter for a signal with a comparatively higher signal to noise ratio, SNR, with respect to a signal with a comparatively lower SNR, and/or to decrease the loop gain and/or loop filter characteristic of the loop filter for a signal with a comparatively lower SNR with respect to a signal with a comparatively higher SNR.

The receiver may be configured to switch between a feedback mode in which the feedback signal from the feedback path is provided to the adjustable sample provider, and a replacement value provision mode in which the replacement sample timing information is provided to the adjustable sample provider.

The receiver may be configured to switch to
an intermediate mode in which intermediate values are provided to the adjustable sample provider, the intermediate values being obtained as values between the values of the feedback signal and the replacement sample timing information,
the switching is from the feedback mode to the intermediate mode and from the intermediate mode to the replacement value provision mode, and/or
the switching is from the replacement value provision mode to the intermediate mode and from the intermediate mode to the feedback mode.

The receiver may be configured, in the intermediate mode, to provide intermediate replacement sample timing information to smoothen the transition from the feedback mode to the replacement value provision mode and/or vice versa.

The receiver may be configured to provide reconfiguration information and/or data from the replacement value provider to the loop filter.

In accordance to aspects, there is provided a controller unit for recognizing a transmission to be received,
wherein the controller unit may be configured:
to perform a determination whether a power of a receive signal, or a quantity derived from the power, lies within a limited interval, and
to recognize a transmission to be received based on the determination.

The controller unit may be configured to identify whether the receive signal comprises a previously determined power level.

The controller unit may be configured to determine how long the power of the receive signal, or the quantity derived from the receive signal, lies within the limited interval, in order to recognize a length of at least one limited time period during which the receive signal comprises a power level.

The controller unit may be configured to check whether the recognized length of the limited time period during which the receive signal may comprise the power level fulfils a predetermined condition, in order to support the recognition of a transmission to be received.

The controller unit may be configured to recognize different power levels of the receive signal, or of the quantity derived from the power.

The controller unit may be configured to track durations during which the different power levels are present, to derive a power level scheduling information.

The controller unit may be configured to check whether a current power level lies within a limited interval, interval boundaries of which are determined on the basis of the previously derived power level scheduling information.

The controller unit may be configured to selectively switch a receiver or a processing or components of the receiver or of the processing to a reduced-power-consumption mode on the basis of the derived power level scheduling information.

The controller unit may be configured to recognize different power levels of the receive signal, or of the quantity derived from the power, and periods of time during which the different power levels are present, so as to rank the different time periods to recognize the time periods for the transmission to be received and/or to re-configure the receiver differently for different time periods.

The controller unit may be configured to recognize different power levels of the receive signal, or of the quantity derived from the power, so as to choose, as the time period for the transmission to be received, a time period with comparatively higher power level with respect to a time period with comparatively lower power level.

The controller unit may be configured to store time information characterizing time portions of different levels of the receive signal, and to store information on the power levels of the receive signal, or the quantity derived from the power,
and wherein the controller unit is configured to recognize, in subsequent instants, time periods associated to the transmission to be received on the basis of at least the stored time information.

The controller unit may include a special activation mode, "exploit other illumination", based on the detection of different illumination power levels and qualification of the other illumination(s).

The controller unit may be configured to determine the start and/or the end of a period of a transmission to be received on the basis of the power level.

The controller unit may be configured to decode and/or detect at least one information encoded in the receive signal, so as to determine the start and/or the end of a period of a transmission to be received.

The controller unit may be configured to recognize the start and/or the end of the period of the transmission to be received by a redundant or supporting technique comprising at least one of:
  detecting a slope in the power under or over a predetermined threshold;
  using time information obtained with previous power level determinations;
  decoding a particular information encoded in received signal; and/or
  detecting quality information or deducing it from other modules;
  using data signalled from and/or commands from a transmitter.

The controller unit may be configured to recognize and/or dynamically define at least one power level on the basis of the determination that at least two consecutive power samples lie within limited intervals associated with a particular power level.

The controller unit may be configured to determine:
  as a first condition, if a current sample of a power of a receive signal, or of a quantity derived from the power, lies within an interval determined by a first preceding sample of the power of a receive signal, or of the quantity derived from the power, and
  to determine, as a second condition, if the current sample of the power of a receive signal, or of the quantity derived from the power, also lies within an interval determined by a second preceding sample of the power of a receive signal, or of the quantity derived from the power, and
  the controller unit may be configured to recognize a continuation of a power level if both the first condition and the second condition are fulfilled.

The controller unit may be configured to tolerate a predetermined number of consecutive samples of the power of the receive signal, or of the quantity derived from the power, which do not fulfil the first condition and/or the second condition without recognizing an end of a power level,
  and to recognize an end of a power level if more than the predetermined number of consecutive samples of the power of the receive signal, or of the quantity derived from the power, do not fulfil the first condition or the second condition.

The controller unit may be configured to also determine whether a current sample of a power of a receive signal, or of a quantity derived from the power, lies outside of a tolerance interval, which is larger than an interval determined by a directly preceding sample of the power of the receive signal, or of the quantity derived from the power, and the controller unit may be configured to recognize an end of a power level when the current sample of the power of a receive signal, or of the quantity derived from the power, lies outside of the tolerance interval for the first time.

The controller unit may be configured to operate according at least a first and a second operational mode, wherein in at least one of the first and second operational modes the controller unit may be configured to perform at least one of the following techniques:
  determining if a power of a receive signal, or a quantity derived from the power lies within a limited interval;
  verifying if a power is determined at an expected time period;
  decoding or detecting a particular information encoded in the signal to be received;
  checking quality information;
  checking a fulfilment of criteria according to information signalled from a transmitter;
  detecting whether a slope in the power is under or over a predetermined threshold;
  wherein the controller unit is configured to use at least one different technique in the first operational mode with respect to the second operational mode.

The controller unit may be configured to operate according to at least two operational modes:
  a first mode in which the controller unit determines if a power of the receive signal, or the quantity derived from the power, lies within a limited interval, without considering information encoded in the signal; and
  a second mode in which the controller unit both:
    determine if a power of the receive signal, or the quantity derived from the power, lies within a limited interval; and
    verify the correctness of the determination on the basis of whether information encoded in the received signal is compliant to a recognition of a transmission to be received on the basis of the power.

The controller unit may be configured to derive or obtain, from an automatic gain control, AGC, and/or matched filter a quantity derived from the power.

The controller unit wherein the quantity associated to the power may be an infinite impulse response, IIR,-filtered version of a power information.

The controller unit may be configured to perform an initialization procedure to obtain parameters associated to at least one or a combination of:
  power so as to determine at least one power level to be subsequently used to recognize a transmission to be received;
  time information;
  quality information;
  wherein the controller unit may be configured to analyze a temporal evolution of the power, or of the quantity derived from the power, over a period of the receive signal in order to perform the initialization, or to receive a signalled information in order to perform the initialization.

The controller unit may be configured to adaptively modify a lower interval boundary value and an upper interval boundary value for the power on the basis of historical values of the power.

The controller unit may be configured to control the receiver.

The controller unit may be configured to control the receiver of above and/or below so as to select between:
  a first status, in which the feedback path provides the feedback signal to the adjustable sample provider; and
  a second status, in which the replacement value provider provides the replacement sample timing information to the adjustable sample provider.

The controller unit may be configured to control the receiver of at least one of the above and/or below so as to determine the predetermined requirement to be fulfilled by the input signal.

The controller unit may be configured to control the receiver of at least one of the above and/or below so as to select that:
  the feedback path provides the feedback signal to the adjustable sample provider when the controller unit may recognize that the transmission is to be received; and/or the replacement value provider may provide the replacement sample timing information to the adjustable sample provider when the controller unit recognizes no transmission or that the transmission is not a transmission to be received.

The receiver may further comprise the controller unit of any above and/or below.

In accordance to aspects, a system may comprise a transmitter and a receiver, the receiver being according to any of the above and/or below, the transmitter being configured to transmit a signal to the receiver.

In accordance to aspects there is a system wherein the transmitter may be a satellite.

The system wherein the transmitter may be configured to perform transmission according to a scheduling transmission and/or according to a beam-switching time plan, BSTP, transmission,
   wherein the scheduling and/or BSTP may be defined so that for at least one first interval the signal is intended to be transmitted to the receiver, and for at least one second interval the signal is not intended to be transmitted to the receiver.

The system may comprise a plurality of receivers, wherein the transmitter may be configured to temporarily direct a particular beam to an intended receiver according to a scheduling and/or BSTP, so that the signal power is temporarily increased in the direction of the intended receiver.

The receiver may be configured to use the feedback signal at the determination that the transmission is directed to the receiver, and to use the replacement sample timing information at the non-determination of a transmission from the transmitter and/or at the determination that the transmission is not for the receiver.

The transmitter may be configured to operate according to at least:
   a bursty signal condition, in which different beams are directed to different receivers, and a
   continuous signal condition, in which a beam is continuously directed to a receiver.

A method for receiving an input signal, may comprise:
   processing samples of the input signal using an adjustable sample timing;
   adapting the sample timing on the basis of feedback signal based on a timing error, wherein the feedback signal is obtained using a loop filter which provides sample timing information; and
   providing a replacement sample timing information replacing the sample timing information provided with the feedback signal when the input signal does not fulfil a predetermined requirement for a feedback-based sample timing adaptation,
   wherein the replacement sample timing information is obtained considering a timing error information, or a quantity derived from the timing error information, over a longer time period when compared to a time period considered by the loop filter for a provision of the sample timing information.

A method for receiving an input signal, may comprise:
   processing samples of the input signal using an adjustable sample timing;
   adapting the sample timing on the basis of feedback signal based on a timing error, wherein the feedback signal is obtained using a loop filter which provides sample timing information; and
   providing a replacement sample timing information replacing the sample timing information provided with the feedback signal when the input signal does not fulfil a predetermined requirement for a feedback-based sample timing adaptation;
   wherein the replacement sample timing information is obtained by temporally smoothening sample timing information provided by the loop filter, in order to obtain the replacement sample timing information.

A method for recognizing a transmission to be received, which may comprise:
   determining if a power of a receive signal, or a quantity derived from the power lies within a limited interval, and
   recognizing a transmission to be received based on the determination.

A method may comprise:
   the method above and/or below; and
   wherein the provision of the feedback signal and the provision of the replacement sample timing information of the method above and/or below may be controlled by the method above and/or below.

A computer program which, when executed by a processor, may perform at least one of the methods above and/or below.

In accordance to aspects there is provided a receiver, comprising a data processor configured to:
   find:
      a first frame candidate at an expected position; and
      at least one second frame candidate shifted from the first frame candidate for a predetermined offset;
   evaluate properties of the first frame candidate and of the at least one second frame candidate;
   identify the correct frame on the basis of the evaluation.

The receiver may be configured to:
perform cross correlation processes between:
   each frame candidate; and
   a known sequence of symbols,
so as to identify the correct frame on the basis of the cross correlation processes.

The receiver may be configured to:
demodulate and/or decode a frame header of the first and second frame candidates;
re-modulate and/or re-encode the sequence of symbols; and
perform the cross correlation processes between:
   each frame candidate frame header; and
   the re-modulated and/or re-encoded version of the frame candidate frame header,
so as to identify the correct frame on the basis of the cross correlation processes.

The receiver may be configured to:
perform a correction procedure to frame symbols and/or start/end of frame signalling to compensate for the detected temporal offset between the frame symbols and the frame signalling.

The receiver may be configured to:
perform an evaluation operation on the results of the correlation processes so as to validate the correct frame.

The receiver may be configured to:
compare each of the cross correlation results associated to each frame candidate with a first threshold, to validate the correct frame if the correct frame is the unique frame candidate associated to a correlation value larger than the first predetermined threshold.

The receiver may be configured to:
compare each of the cross correlation results associated to each frame candidate with a larger threshold and a smaller predetermined threshold, to refrain from validating the correct frame if at least a predetermined number of frame candidates is associated to cross correlation values within the larger predetermined threshold and the smaller predetermined threshold; and notify an error at the verification that the predetermined number of frame candidates is associated to cross correlation values larger than the larger predetermined threshold and at least a predetermined number of frame candidates is associated to a cross correlation value smaller than the smaller predetermined threshold.

The receiver may be configured to:

compare each of the cross correlation results associated to each frame candidate with a larger predetermined threshold and a smaller predetermined threshold, to refrain from validating the correct frame if at least a predetermined number of frame candidates is associated to cross correlation values larger than the larger predetermined threshold and at least a predetermined number of frame candidates is associated to a cross correlation value smaller than the smaller predetermined threshold; and notify an error at the verification that the predetermined number of frame candidates is associated to cross correlation values larger than the larger predetermined threshold and at least a predetermined number of frame candidates is associated to a cross correlation value smaller than the smaller predetermined threshold.

In accordance to aspects, there is provided a receiver, comprising:

an adjustable sample provider [e.g. timing interpolator] configured to provide samples of an input signal using an adjustable sample timing [for example, determined by the sample timing information];

a feedback path [e.g. TED, Loop Filter] configured to provide a feedback signal to the adjustable sample provider [e.g. timing interpolator] on the basis of a timing error [e.g. determined by a timing error detector], wherein the feedback path comprises a loop filter configured to provide sample timing information to the adjustable sample provider [wherein the loop filter may for example filter or average timing error values provided by the timing error detector]; and a replacement value provider configured to provide a replacement sample timing information replacing the sample timing information provided by the feedback path when an input signal does not fulfil a predetermined requirement [e.g., a requirement associated to the absence of illumination, and/or on the basis of a control exerted by a controller, e.g., on the basis of power and/or power level associated to the input signal and/or on the basis of a particular sequence encoded in the input signal] for a feedback-based sample timing adaptation, wherein the replacement value provider is configured to provide the replacement sample timing information considering a timing error information, or a quantity derived from the timing error information, over a longer time period when compared to a time period considered by the loop filter for a provision of the sample timing information.

In accordance to examples, there is provided a receiver, comprising an adjustable sample provider [e.g. timing interpolator] configured to provide samples of an input signal using an adjustable sample timing [for example, determined by the sample timing information];

a feedback path [e.g. TED, Loop Filter] configured to provide a feedback signal to the adjustable sample provider [e.g. timing interpolator] on the basis of a timing error [e.g. determined by a timing error detector TED], wherein the feedback path comprises a loop filter configured to provide sample timing information to the adjustable sample provider [wherein the loop filter may for example filter or average timing error values provided by the timing error detector]; and a replacement value provider configured to provide a replacement sample timing information replacing the sample timing information provided by the feedback path when an input signal does not fulfil a predetermined requirement [e.g., a requirement associated to the absence of illumination, and/or on the basis of a control exerted by a controller, e.g., on the basis of power and/or power level associated to the input signal and/or on the basis of a particular sequence encoded in the input signal] for a feedback-based sample timing adaptation;

wherein the replacement value provider is configured to temporally smoothen [e.g. low-pass-filter order time average] sample timing information provided by the loop filter and/or loop filter-internal timing information, in order to obtain the replacement sample timing information.

The replacement value provider may be configured to average sample timing information provided by the loop filter and/or timing error information and/or a quantity derived from the timing error information over a period of time which is longer than a period of time for which timing error information is considered by the loop filter to provide a current sample timing information [time period considered by the loop filter for a provision of the sample timing information][e.g. filter length of a FIR filter used as the loop filter].

The replacement value provider may be configured to filter or average over a longer time period when compared to loop filter

[for example, in that an impulse response of the replacement value provider to a value of the timing error information is longer than an impulse response of the loop filter to a value of the timing error information; or in that the replacement value provider considers values of the timing error information over a first period of time for providing a current replacement sample time information, while the loop filter only considers values of the timing error information over a second period of time, which is shorter than the first period of time, for providing a current sample time information] [wherein the loop filter may, for example, be a low pass filter and consequently also perform an equally weighted averaging or an averaging putting comparatively smaller weight on past input values when compared to current input values] in order to provide the replacement sample timing information.

The replacement value provider may be configured to perform linear averaging by means of equal or different weights for the input values of sample timing information provided by the loop filter, and/or timing error information, and/or a quantity derived from the timing error information [for example, the output of the loop filter, like the sample timing information provided by the loop filter, or an internal or intermediate quantity available within the loop filter].

The replacement value provider may be configured to perform averaging with equal weights of timing error information, or of a quantity derived from the timing error information.

The replacement value provider may be configured to select samples [e.g., associated to particular snapshots] of the timing error information, or of a quantity derived from the timing error information which have a larger temporal spacing than the samples of the timing error information, or of the quantity derived from the timing error information [for example, the output of the loop filter, like the sample timing information provided by the loop filter, or an internal or intermediate quantity available within the loop filter] to perform filtering or averaging on the selected samples [such that the replacement value provider evaluates less samples per time unit than the loop filter].

The replacement value provider may be configured to perform an analysis of the signal [e.g. of the input signal to or a signal derived from the input signal] so as to adaptively select samples [e.g., associated to particular snapshots] of the timing error information, or of a quantity derived from the timing error information [for example, the output of the loop filter, like the sample timing information provided by the loop filter, or an internal or intermediate quantity available within the loop filter] to perform filtering or averaging on the selected samples, wherein the receiver is configured to reduce a distance between the selected samples and/or to increase a number of the selected samples for signals having a comparatively higher noise when compared to signals having a comparatively smaller noise.

The replacement value provider may be configured to adaptively select samples [e.g., associated to particular snapshots] of the timing error information, or of a quantity derived from the timing error information [for example, the output of the loop filter, like the sample timing information provided by the loop filter, or an internal or intermediate quantity available within the loop filter] to perform filtering or averaging on the selected samples, so as to increase the average gain for an averaging depth or filter length.

The replacement value provider may be configured use a downsampled version [for example, sub-sampled version] of the timing error information or of a quantity derived from the timing error information [e.g., associated to particular snapshots, e.g., adaptively] [for example, the output of the loop filter, like the sample timing information provided by the loop filter, or an internal or intermediate quantity available within the loop filter] to perform filtering or averaging on the downsample version.

The replacement value provider may be configured to use a downsampled version [for example, sub-sampled version] [e.g., associated to particular snapshots e.g., adaptively] of the timing error information [e.g., the output of the TED], or a quantity derived from the timing error information [for example, the output of the loop filter, like the sample timing information provided by the loop filter, or an internal or intermediate quantity available within the loop filter] to perform filtering or averaging on the downsample version, so that the sampling rate [or sample rate] of the downsampled version is at a first sampling rate which is between 100 times and 10000 times, or between 500 times and 2000 times, slower than a sampling rate [or sample rate] of the timing error information or a quantity derived from the timing error information [for example, the output of the loop filter, like the sample timing information provided by the loop filter, or an internal or intermediate quantity available within the loop filter].

The replacement value provider may be configured to vary a rate of samples [e.g., associated to particular snapshots e.g., adaptively] of the timing error information, or a of quantity derived from the timing error information [for example, the output of the loop filter, like the sample timing information provided by the loop filter, or an internal or intermediate quantity available within the loop filter], which is processed by the replacement value provider to perform filtering or averaging at least by a factor of 2 or at least by a factor of 8 or at least by a factor of 16 or at least by a factor of 32 or at least by a factor of 64 and/or at least by a factor of a power of 2 [for example, in dependence on a signal-to-noise ratio of the input signal or in dependence on other criteria][wherein, for example, a total number of samples used by the replacement value provider in order to provide a current replacement sample timing information may be constant].

The replacement value provider may be configured to adaptively select samples [e.g., associated to particular snapshots] of the timing error information, or a quantity derived from the timing error information [for example, the output of the loop filter, like the sample timing information provided by the loop filter, or an internal or intermediate quantity available within the loop filter] to perform filtering or averaging on the selected samples between a lower sampling rate and a higher sampling rate [ wherein the sampling rate is configurable and/or controlled so that its lower end is configured considering at least one condition, such as the maximum illumination time, for example].

The replacement value provider may be configured to selectively consider [e.g. process, or average, or select] samples [e.g., associated to particular snapshots] of the timing error information, or of a quantity derived from the timing error information [for example, the output of the loop filter, like the sample timing information provided by the loop filter, or an internal or intermediate quantity available within the loop filter] for the provision of the replacement timing information, such that a current replacement timing information is obtained on the basis of samples of at least two different considered time periods of the input signal during which the input signal fulfils a predetermined condition [for example, the predetermined requirement or another requirement] while skipping a time period which lies between two different considered time periods and during which the input signal does not fulfil the predetermined condition [e.g., different time periods and/or different values associated to different time periods, such as average or filter outputs associated to different time periods].

The replacement value provider may be configured to [e.g., adaptively] select samples [e.g., associated to particular snapshots] of the timing error information, or a quantity derived from the timing error information [for example, the output of the loop filter, like the sample timing information provided by the loop filter, or an internal or intermediate quantity available within the loop filter], based on configuration data and/or a lookup table in dependence on a configuration or in dependence on a communication scenario.

The replacement value provider may be configured to adaptively select samples [e.g., associated to particular snapshots] of the timing error information, or a quantity derived from the timing error information [for example, the output of the loop filter, like the sample timing information provided by the loop filter, or an internal or intermediate quantity available within the loop filter] for the derivation of the replacement sample timing information on the basis of an analysis of the timing error information, or of a quantity derived from the timing error information [e.g., by correlation and/or autocorrelation].

The replacement value provider may be configured to adaptively select samples [e.g., associated to particular snapshots] of the timing error information, or a quantity derived from the timing error information [for example, the output of the loop filter, like the sample timing information provided by the loop filter, or an internal or intermediate quantity available within the loop filter] to perform filtering or averaging on the selected samples on the basis of at least one of or a combination of:
  target signal to noise, SNR, ratio;
  supported timing offset range;
  supported carrier frequency offset range;
  convergence speed requirements;
  the scheme used for the time error detection;
  data signal characteristics;
  the used roll-off of the transmit-side pulse-shaping filter and/or the used roll-off of a receiver-side matched filter.

The receiver may be configured to increase the loop gain and/or loop filter characteristic for an initial transitory interval.

The receiver may be configured to re-configure the loop gain/loop filter characteristic during operation on the basis of changed reception conditions [e.g. lower SNR than previously].

The receiver may be configured to increase the loop gain and/or loop filter characteristic of the loop filter for a signal with a comparatively higher signal to noise ratio, SNR, with respect to a signal with a comparatively lower SNR, and/or to decrease the loop gain and/or loop filter characteristic of the loop filter for a signal with a comparatively lower SNR with respect to a signal with a comparatively higher SNR.

The receiver may be configured to switch between a feedback mode in which the feedback signal from the feedback path is provided to the adjustable sample provider, and a replacement value provision mode in which the replacement sample timing information is provided to the adjustable sample provider,
  and an intermediate mode in which intermediate values are provided to the adjustable sample provider, the intermediate values being obtained as values between the values of the feedback signal and the replacement sample timing information [e.g., average values],
  wherein the switching is from the feedback mode to the intermediate mode and from the intermediate mode to the replacement value provision mode, and/or
  wherein the switching is from the replacement value provision mode to the intermediate mode and from the intermediate mode to the feedback mode.

The receiver may be configured, in the intermediate mode, to provide intermediate replacement sample timing information intermediate to smoothen the transition from the feedback mode to the replacement value provision mode and/or vice versa.

The receiver may be configured to provide reconfiguration information and/or data from the replacement value provider to the loop filter [e.g., to avoid a "signal jump" and/or to continue interpolation and/or adaptation with the replacement value as a baseline].

A controller (e.g., a controller unit) for recognizing a transmission to be received, wherein the controller may be configured to perform a determination whether a power of a receive signal, or a quantity derived from the power [for example, a low-pass-filtered version of a power level information], lies within a limited interval [for example, bounded by a lower interval boundary value and an upper interval boundary value; this may for example constitute an identification of a "power level" or of a "power range"], and to recognize a transmission to be received based on the determination [whether a power of a receive signal, or a quantity derived from the power lies within a limited interval] [wherein the limited interval may be dynamically defined, for example][ e.g., at least one power level may be dynamically defined on the basis of the determination that at least two consecutive power samples lie within limited intervals associated with a particular power level].

The controller may be configured to identify whether the receive signal comprises a previously determined power level [for example, a power niveau][for example out of more than two power levels to be distinguished, wherein the at least two power levels or niveaus may be associated with different signal contents, different beams, different receivers . . . ].

The controller further may be configured to determine how long the power of the receive signal, or the quantity derived from the receive signal [for example, a low-pass-filtered version of a power level information] lies within the limited interval, in order to recognize a length of at least one limited time period [for example, a length of a signal burst, or a length of an illumination of a certain spatial region] during which the receive signal comprises a power level [e.g., by counting the number of consecutive samples in the same power level and/or by analysing the time distance between samples within a predetermined search time period] [whether a power of a receive signal, or a quantity derived from the power lies within a limited interval] [wherein the limited interval may be dynamically defined, for example][ e.g., at least one power level may be dynamically defined on the basis of the determination that at least two consecutive power samples lie within limited intervals associated with a particular power level].

The controller may be configured to check whether the recognized length of the limited time period during which the receive signal comprises the power level fulfils a predetermined condition [for example, is at least approximately a multiple of a scheduling granularity, or complies with a time schedule of a given transmission out of a plurality of different transmissions], in order to support the recognition of a transmission to be received [for example, by allowing to recognize erroneous determination].

The controller further may be configured to recognize [for example, distinguish] different power levels [for example, more than 2 different power levels, of which one may be a noise power level and of which two or more power levels may be associated with different beams or different transmissions] of the receive signal, or of the quantity derived from the power [for example, a low-pass-filtered version of a power information].

The controller may be configured to track durations during which the different power levels are present, to derive a scheduling information [for example, being configured to recognize that, within a predetermined search time period, a plurality of samples are within a particular power range so as to recognize a particular power level].

The controller may be configured to check whether a current power lies within a limited interval, interval boundaries of which are determined on the basis of the previously derived scheduling information.

The controller may be configured to selectively switch a receiver or components of it to a reduced-power-consumption mode on the basis of the derived scheduling information [for example, for periods of time for which it is estimated, on the basis of the derived scheduling information, that there is no transmission to be received by the receiver] [wherein the receiver may also be switched back to a "normal"

reception mode form the reduced-power-consumption mode when a transmission to be received is expected on the basis of the derived scheduling information].

The controller may be configured to recognize different power levels of the receive signal, or of the quantity derived from the power [for example, a low-pass-filtered version of a power information], and periods of time during which the different power levels are present, so as to rank the different time periods [for example, determine during which periods of time there is the highest power level, the second highest power level, and so on] to recognize the time periods for the transmission to be received [for example, by choosing the time period during which there is the highest power level].

The controller may be further configured to recognize different power levels of the receive signal, or of the quantity derived from the power [for example, a low-pass-filtered version of a power information], so as to choose, as the time period for the transmission to be received, a time period with comparatively higher power level [or a comparatively highest power level] with respect to a time period with comparatively lower power level.

The controller may be further configured to store time information characterizing [or describing] time portions of different levels of the receive signal, and to store information on the power levels of the receive signal, or the quantity derived from the power [for example, a low-pass-filtered version of a power information], and wherein the controller is configured to recognize, in subsequent instants, time periods associated to the transmission to be received on the basis of at least the stored time information.

The controller may be configured to also use the stored information on the power level of the receive signal during different time portions for the recognition of the time periods associated to the transmission to be received [for example, for setting interval boundaries].

The controller may be further configured to determine the start and/or the end of a period of a transmission to be received on the basis of the power level [for example, the low-pass-filtered version of a power information].

The controller may be further configured to decode and/or detect at least one information [e.g., a sequence and/or a preamble and/or a particular bitstream] encoded in the receive signal, so as to determine the start and/or the end of a period of a transmission to be received [for example, both the power level and the decoding may be used, and a transmission to be received may be recognized already when a characteristic information has been decoded, even if the power is still not within the limited interval].

The controller may be further configured to receive signalling transmissions from a transmitter regarding time information [e.g., scheduling-related and/or BTSP-related information and/or modification] and/or lower interval boundary value and/or an upper interval boundary value associated to at least one power level [e.g., range] [e.g. the controller being configured to obtain signalling transmissions so as to be at least partially controlled by the signalling transmissions and/or obtain side-information].

The controller may be further configured to recognize the start and/or the end of the period of the transmission to be received by a redundant or supporting technique comprising at least one [or a combination of at least two] of:

detecting a slope in the power under or over a predetermined threshold [e.g., by determining that an increment in the detected power of the received signal in respect to the time is greater an upper threshold, indicating a fast increment of the lower, and/or by determining that a negative increment in the detected power of the received signal in respect to the time is lower than a negative lower threshold, indicating a fast decrease of the detected power];

using time information obtained with previous power level determinations [for example, to predict a time when the transmission to be received is expected to start using a time extrapolation];

decoding [or detecting] a particular information [e.g., a sequence and/or a preamble and/or a particular bitstream] encoded in received signal; and/or detecting quality information [e.g., signal to noise ratio] or deducing it from other modules [e.g. signal to noise ratio estimator];

using data signalled from and/or commands from a transmitter;

[e.g., so as to verify, on the basis of the redundant/supporting technique, the correctness of the determination based on the power level].

The controller may be further configured to recognize and/or dynamically define at least one power level on the basis of the determination that at least two consecutive power samples lie within limited intervals associated with a particular power level.

The controller may be configured to determine, as a first condition, if a current sample of a power of a receive signal, or of a quantity derived from the power, lies within an interval determined by a first preceding sample of the power of a receive signal, or of the quantity derived from the power [for example, an interval extending upward and downward from the first preceding sample value], and to determine, as a second condition, if the current sample of the power of a receive signal, or of the quantity derived from the power, also lies within an interval determined by a second preceding sample of the power of a receive signal, or of the quantity derived from the power [for example, an interval extending upward and downward from the second preceding sample value] [for example, $p_{act}[i] \in [p_{act}[i-1] \pm p_{margin}] \cap p_{act}[i] \in [p_{act}[i-2] \pm p_{margin}]$], and wherein the controller is configured to recognize a continuation of a power level if both the first condition and the second condition are fulfilled.

The controller may be configured to tolerate a predetermined number of consecutive samples [for example, 1 sample] of the power of the receive signal, or of the quantity derived from the power, which do not fulfil the first condition and/or the second condition without recognizing an end of a power level, and to recognize an end of a power level if more than the predetermined number of consecutive samples of the power of the receive signal, or of the quantity derived from the power, do not fulfil the first condition or the second condition.

The controller may be configured to also determine whether a current sample of a power of a receive signal, or of a quantity derived from the power [for example, a low-pass-filtered version of a power level information], lies outside of a tolerance interval [described by "additional thresholds"], which is larger than an interval determined by a directly preceding sample of the power of the receive signal, or of the quantity derived from the power, and wherein the controller is configured to [immediately] recognize an end of a power level when the current sample of the power of a receive signal, or of the quantity derived from the power, lies outside of the tolerance interval for the first time [while it is tolerated at least one time that the current sample lies outside of the interval determined by the directly preceding sample without recognizing an end of a power level].

The controller may be further configured to operate according at least a first and a second operational mode [e.g., the second mode being initiated in correspondence with the end of the first mode], wherein in at least one of the first and second modes the controller is configured to perform at least one of the following techniques [possible in combination with any other technique] or a combination of at least two of the following techniques [optionally in combination with any other technique]:
  determining if a power of a receive signal, or a quantity derived from the power [for example, a low-pass-filtered version of a power information] lies within a limited interval;
  verifying if a power is determined at an expected time period [e.g., as extrapolated from previous measurements];
  decoding or detecting a particular information [e.g., a sequence and/or a preamble and/or a particular bit-stream] encoded in the signal to be received;
  checking quality information [e.g., signal to noise ratio];
  checking a fulfilment of criteria according to information signalled from a transmitter;
  detecting whether a slope in the power is under or over a predetermined threshold [e.g., by determining that an increment in the detected power of the received signal in respect to the time is greater an upper threshold, indicating a fast increment of the lower, and/or by determining that a negative increment in the detected power of the received signal in respect to the time is lower than a negative lower threshold, indicating a fast decrease of the detected power];
  wherein the controller may be configured to use at least one different technique in the first mode with respect to the second mode.

The controller may be further configured to operate according to at least two operational modes:
  a first mode in which the controller determines if a power of the receive signal, or the quantity derived from the power [for example, a low-pass-filtered version of a power information], lies within a limited interval [e.g. on the basis of power measurements], without considering information encoded in the signal; and
  a second mode [e.g., initiated in correspondence with the end of the first mode] in which the controller both:
    determines if a power of the receive signal, or the quantity derived from the power [for example, a low-pass-filtered version of a power information], lies within a limited interval [e.g. on the basis of power measurements]; and
    verifies the correctness of the determination on the basis of whether information encoded in the received signal is compliant to a recognition of a transmission to be received on the basis of the power.

The controller may be further configured to derive or obtain, from an automatic gain control, AGC, a quantity derived from the power [for example, a low-pass-filtered version of a power information].

The controller may be further configured to derive, from a matched filter, a quantity associated to the power [or derived from the power][for example, a low-pass-filtered version of a power information].

The controller of the above and/or below, wherein the quantity associated to the power [or derived from the power] may be an infinite impulse response, IIR,-filtered version of a power information.

The controller may be further configured to perform an initialization procedure to obtain parameters associated to at least one or a combination of:
  power [for example, bounded by a lower interval boundary value and an upper interval boundary value] so as to determine at least one power level to be subsequently used to recognize a transmission to be received;
  time information [e.g., scheduling information and/or time instants in which different power levels have been detected];
  quality information [e.g., signal to noise ratio];
  wherein the controller is configured to analyze a temporal evolution of the power, or of the quantity derived from the power, over a period of the receive signal in order to perform the initialization, or to receive a signalled information in order to perform the initialization.
    [for example, the parameters may be obtained by measuring and/or by receiving signalled information from a receiver].

The controller may be configured to adaptively modify a lower interval boundary value and an upper interval boundary value for the power [and/or other parameters associated to the transmission to be received] on the basis of historical values of the power.

The controller may be configured to control the receiver of at least one of any of the above and/or below.

The controller may be configured to control the receiver of one of the above and/or below so as to select between:
  a first status [e.g., a feedback status], in which the feedback path provides the feedback signal to the adjustable sample provider; and
  a second status, [e.g., a freeze status], in which the replacement value provider provides the replacement sample timing information to the adjustable sample provider.

The controller may be configured to control the receiver of at least one of the above and/or below so as to determine the predetermined requirement [e.g., a requirement associated to the absence of illumination, e.g., on the basis of power and/or power level associated to the input signal and/or on the basis of a particular sequence encoded in the input signal] to be fulfilled by the input signal.

The controller may be configured to control the receiver of at least one of the above and/or below so as to select that:
  the feedback path provides the feedback signal to the adjustable sample provider when the controller recognizes that the transmission is to be received; and/or
  the replacement value provider provides the replacement sample timing information to the adjustable sample provider when the controller recognizes no transmission or that the transmission is not a transmission to be received.

The receiver may further comprise a controller of the above and/or below.

A system comprising a transmitter [e.g., with a plurality of transmitting antennas] and a receiver [e.g., with a plurality of receiving antennas], the receiver being as above and/or below, the transmitter being configured to transmit a signal [e.g., a beam-formed or beam-switched signal] to the receiver.

The transmitter may be a satellite [e.g. in amplify and forward mode or in signal processing and forward mode or in signal generation mode].

The transmitter may be configured to perform transmission according to a scheduling transmission and/or according to a beam-switching time plan, BSTP, transmission,
  wherein the scheduling and/or BSTP are defined so that for at least one first interval the signal is intended to be transmitted to the receiver, and for at least one second interval the signal is not intended to be transmitted to the receiver.

The system may further comprise a plurality of receivers, wherein the transmitter may be configured to temporarily direct a particular beam to an intended receiver according to a scheduling and/or BSTP, so that the signal power is temporarily increased in the direction of the intended receiver.

The receiver may be configured to use the feedback signal at the determination that the transmission is directed to the receiver, and to use the replacement sample timing information at the non-determination of a transmission from the transmitter and/or at the determination that the transmission is not for the receiver.

The transmitter may be configured to operate according to at least:
  a bursty signal condition, in which different beams are directed to different receivers [e.g., according to a scheduling or BSTP], and a
  continuous signal condition, in which a beam is continuously directed to a receiver.

A method for receiving an input signal, may comprise:
  processing samples [e.g., by timing interpolation] of the input signal using an adjustable sample timing [for example, determined by sample timing information];
  adapting the sample timing on the basis of feedback signal [e.g. TED, Loop Filter] based on a timing error [e.g. determined by a timing error detector], wherein the feedback signal is obtained using a loop filter which provides sample timing information; and
  providing a replacement sample timing information replacing the sample timing information provided with the feedback signal when the input signal does not fulfil a predetermined requirement [e.g., a requirement associated to the absence of illumination, and/or on the basis of a control exerted by a controller, e.g., on the basis of power and/or power level associated to the input signal and/or on the basis of a particular sequence encoded in the input signal] for a feedback-based sample timing adaptation,
  wherein the replacement sample timing information is obtained considering a timing error information, or a quantity derived from the timing error information, over a longer time period when compared to a time period considered by the loop filter for a provision of the sample timing information.

A method for receiving an input signal, may comprise:
  processing samples [e.g., by timing interpolation] of the input signal using an adjustable sample timing [for example, determined by sample timing information];
  adapting the sample timing on the basis of feedback signal [e.g. TED, Loop Filter] based on a timing error [e.g. determined by a timing error detector], wherein the feedback signal is obtained using a loop filter which provides sample timing information; and
  providing a replacement sample timing information replacing the sample timing information provided with the feedback signal when the input signal does not fulfil a predetermined requirement [e.g., a requirement associated to the absence of illumination, and/or on the basis of a control exerted by a controller, e.g., on the basis of power and/or power level associated to the input signal and/or on the basis of a particular sequence encoded in the input signal] for a feedback-based sample timing adaptation;
  wherein the replacement sample timing information is obtained by temporally smoothening [e.g. low-pass-filter order time average] sample timing information provided by the loop filter, in order to obtain the replacement sample timing information.

A method for recognizing a transmission to be received, may comprise:
  determining if a power of a receive signal, or a quantity derived from the power [for example, a low-pass-filtered version of a power information], lies within a limited interval [for example, bounded by a lower interval boundary value and an upper interval boundary value; this may for example constitute an identification of a "power level" or of a "power range"], and
  recognizing a transmission to be received based on the determination.

A method may comprise:
  the method of any of the above and/or below
  wherein the provision of the feedback signal and the provision of the replacement sample timing information of the method of the above and/or below may be controlled by the method of the above and/or below.

A computer program which, when executed by a processor, perform at least one of the methods above and/or below.

Embodiments:
  Innovative Aspect 1: Keeping Sampling Accuracy during Adaptation Freezing Even if FIGS. 1 and 2 have been used for discussing the prior art, they may also be used for describing a system 100 according to the invention. The system 100 may comprise, therefore, a transmitter (e.g., satellite 102), receivers (e.g., terminals) 110-114 dislocated in different coverage areas 104-108 to receive beams 120-124 at illuminated time slots 120'-124' according to super-frames defined by the gateway 116 (which may be integrated in the transmitter 102, for example). The scenario of FIG. 2A can also occur: a receiver may receive, besides the intended beam C at the power $P_2$, also a non-intended beam D, which is meant, according to the BSTP, to be received by a different receiver.

FIG. 6e shows receiver (e.g., one of the terminals 110, 112, 114). The receiver may comprise, for example, an antenna array 127 for performing transmissions and/or receptions. The antenna array 127 may be connected to a receiver signal processing 600 and/or a transmit signal processing 600e. the receiver signal processing 600 and/or a transmit signal processing 600e may be connected to an input/output port 129 which may be connected to external devices and/or application-running equipment (in some cases, the application-running equipment may be integrated in the receiver and/or in at least one of the processings 600 or 600e).

Each receiver may comprise hardware and functional means (e.g., antennas and/or antenna arrays, communication controllers, digital signal processors, etc.) to perform the processing 600.

The signal processing 600 (which may be embodied by any of the inventive remote terminals 110-114) is input with a signal 602 (which may be obtained from any of the beams 120-124). The signal 602 is processed to be provided to a data processing block 620. Processing blocks are for example, an adjustable sample provider (604) [e.g. timing interpolator], a matched filter 608, an automatic gain control block 612, a selector 616, for example (in alternative embodiments, one or some of these blocks may be avoided). The matched filter 608 may be a low pass filter (e.g., a linear low pass filter) which matches with the transmit-side pulse-shaping filter. Signal to noise ratio (SNR) may therefore be maximized according to communications theory. The automated gain control (AGC) 612 may analyze the signal power of a version 610 of the input signal 602 (e.g., as output by the matched filter 610). The AGC 612 may scale the signal to achieve a target power level at its output (version 614 of the input signal 602). An optional selector 616 may drop every second sample of a version 614 of the input signal 602 (other kinds of selectors may be defined in alternative embodiments).

Further, a feedback path 630 (with a timing error detector, TED, 632, and a loop filter 636) and a replacement value provider 640 are provided.

The TED 632 may, for example, obtain an instantaneous timing offset from samples. The TED 632 may comprise, for example, an early-late detector, zero-crossing detector, and/or Müller&Müller detector. The TED 632 may output timing error information 634 which may be associated to the detected instantaneous timing offset.

The loop filter 636 may perform operations such as averaging, scaling, and/or integration. It may be a low-pass filter, whose settings control its loop convergence and tracking characteristic. The loop filter 636 may provide feedback-based information 638 which considers timing errors which are based, for example, on the timing error information 634.

The loop filter 636 may perform an equally or exponentially weighted averaging or an averaging putting comparatively smaller weight on past input values when compared to current input values. The output 638 of the loop filter 636 (here referred to as "sample timing information") may represent a smoothened and integrated version of the timing error information 634. The sample timing information 638 may be the feedback-based information used by the adjustable sample provider 604 to compensate for the errors in synchronization. The sample timing information 638 may consider a filtered value or an average value calculated for a particular period of time (e.g., a determined period, associated to the last K number of samples).

According to the first inventive aspect, during non-illuminated time periods, the timing interpolation is not performed using feedback values, as in FIG. 3 (prior art), but using a replacement value 642. When illumination ends (e.g., at 120b, 122b, 124b), the signal processing 600 has no possibility of obtaining a reliable timing error information from the feedback path 630 (which would therefore be based on noise). Should the teachings of the prior art be followed, then the last timing would be frozen and be used during the whole non-illumination period. However, it has been noted that there is no guarantee that the last timing is correct or accurate enough. By freezing the last timing, there arises the possibility that, throughout the whole non-illuminated period, a big timing error accumulates. However, with the inventive aspect, at the end of illumination (e.g., at 120b, 122b, 124b) the last timing is not frozen but, instead, a replacement value 642 (in general calculated over a longer time period and therefore in principle accurate) is used, hence reducing the possibility of incorrect timing.

Basically, with this aspect of the invention, a feedback strategy is activated when most convenient (during the illuminated time periods), while a feedforward strategy is activated when most convenient (during the non-illuminated time periods).

The adjustable sample provider 604 (timing interpolator) may provide samples of the input signal 602 using an adjustable sample timing. The adjustable sample provider 604 may resample the received input signal 602, so as to permit synchronization, demodulation, and decoding of the data encoded in the input signal 602. Accordingly, it is possible to compensate for timing offsets (sampling phase and sampling frequency).

The adjustable sample provider 604 may therefore rely on the feedback path 630, which may provide, in real time, feedback-based information 638 on the timing errors (sample timing information) that have previously occurred.

The feedback path 630 may comprise the timing error detector (TED) 632, which derives a timing error value, e.g., based on previous portions of the input signal 602 (previous samples, etc.). Timing error information 634 may therefore be provided by the TED 632. However, according to the present inventive aspect, the signal processing 600 does not uniquely make use of the feedback path 630.

The signal processing 600 may comprise a replacement value provider 640, which may provide replacement sample timing information 642 (with the purpose of replacing the sample timing information 638, e.g., for non-illuminated periods). Hence, in some instants, the feedback path 630 may be deactivated, while the replacement value provider 640 is activated, and vice versa. The timing interpolator 604 may use in alternative:

the sample timing information 638 (obtained from the feedback path 630 and based on the error information impairing the previous samples), e.g., according to a feedback technique; and the replacement sample timing information 642 (obtained from the replacement value provider 640), e.g., according to a feedforward technique.

Figure 6:
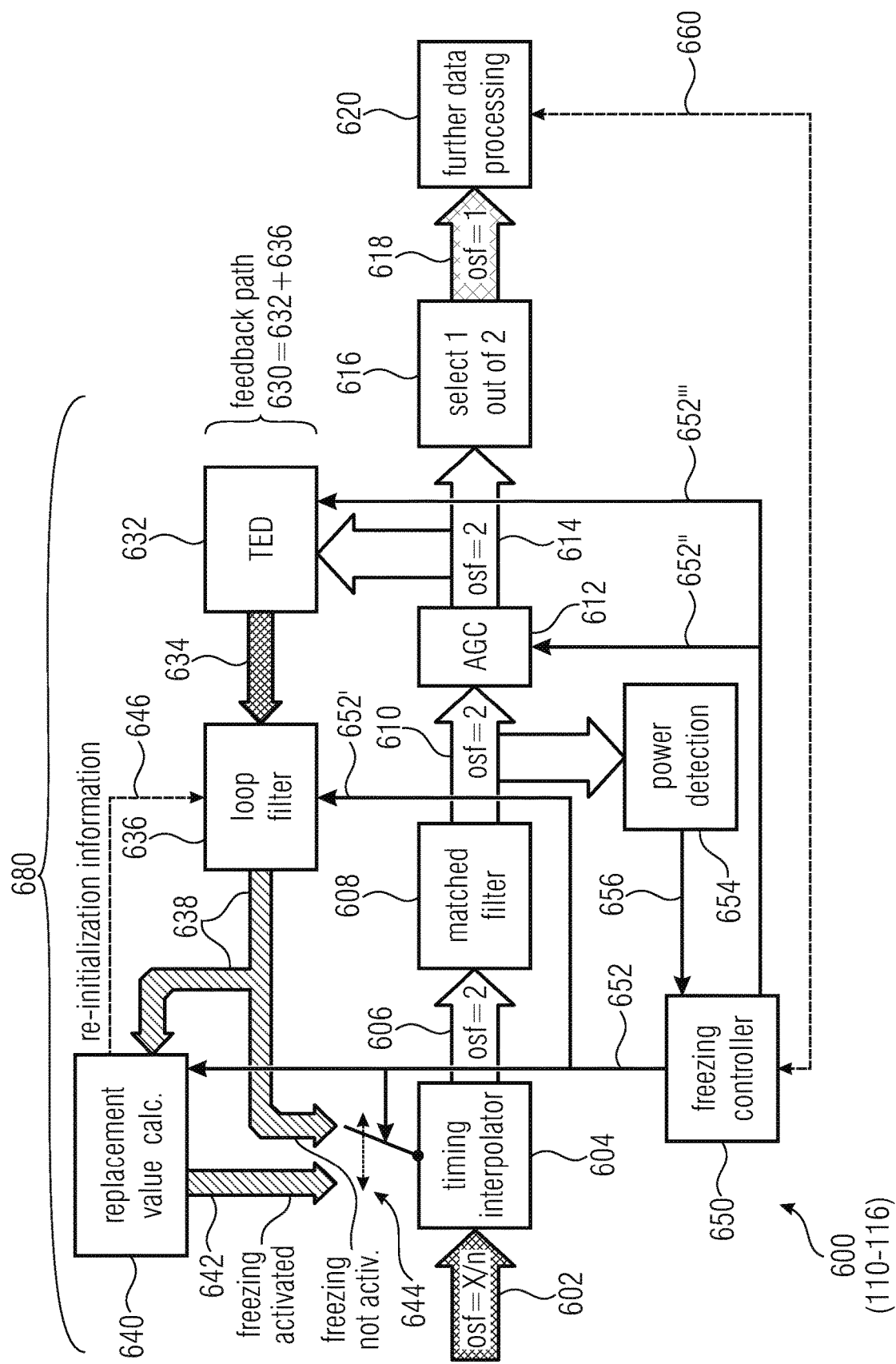
FIG. 6: shows a block scheme of receiver signal processing of a receiver, illustrating in particular a timing loop with replacement value calculation and a freezing controller evaluating power detection data.

This selection between two alternative timings is represented, in FIG. 6, by the selector 644.

For bursty signal receptions (e.g., in non-continuously illuminated environments, such as in FIGS. 1 and 2), during non-illuminated periods, the replacement sample timing information 642 may be provided to the timing interpolator 604, while the sample timing information 638 may be provided to the timing interpolator 604 during illuminated time-periods.

More in general, the replacement sample timing information 642 may be provided to the timing interpolator 604 when a predetermined requirement is not fulfilled (which may be a requirement for determining whether an input signal is being received). The requirement may be associated, for example, to the presence of illumination, and/or may be based on a control exerted by a controller, e.g., the determination of power and/or power level associated to the input signal and/or a particular sequence (e.g., a pilot sequence and/or a preamble) encoded in the input signal 602 (e.g., in the initial part of the frame associated to the input signal).

Therefore, the processing 600 of the receiver may have at least two modes (three modes in some optional examples):

a feedback mode, in which the feedback path 630 is activated, and provides a sample timing information 638 to the timing interpolator 604 (the feedback mode being associated, for example, to the fulfilment of the predetermined requirement, such as presence of illumination);

a replacement value provision mode (e.g., operating according to a feedforward technique), in which the sample timing information 638 is deactivated and the replacement sample timing information 642 actively provides replacement sample timing information 642 to the timing interpolator 604 (the replacement value provision mode being associated, for example, to the non-fulfilment of the predetermined requirement, and may therefore be associated to the absence of illumination);

(optionally) an intermediate mode (see also below).

The replacement sample timing information 642 may be generated, by the replacement value provider 640, on the basis of timing error information 634 or a quantity obtained from the timing error information 634, such as the sample timing information 638 provided by the loop filter 636 or an intermediate information (e.g., internal to the loop filter 636). However, the replacement sample timing information 642 may be generated by considering a timing error information 634, or a quantity derived therefrom, over a time period which is longer than the time period considered by the loop filter 636 when providing the sample timing information 638.

In addition or alternative, the replacement value provider 640 may temporally smoothen (e.g. low-pass-filter or time average) sample timing information provided by the loop filter 636 and/or loop filter-internal timing information, in order to provide the replacement sample timing information 642.

It has been noted that, by using the more accurate replacement sample timing information 642 during the non-illuminated periods, the jitter is reduced when the illumination is restarted. During the non-illuminated periods, in fact, the last value of the output 634 or 638 is not used anymore (after having been frozen). To the contrary, during the non-illuminated periods, a value (642) may be used which is the result of a filtering or averaging on a more prolonged temporal basis, keeping into account historical data. For example, there is less probability that, during the non-illuminated periods, incorrect timing information accumulates. Otherwise, by freezing the last value 634 or 638 as in the prior art, a larger jitter would be accumulated in the timing interpolator 604.

The replacement value provider 640 may consider values of the timing error information 634 (or 638) over a first period of time for providing a current replacement sample time information. The loop filter 636 may consider values of the timing error information (634) over a second period of time, which is shorter than the first period of time, for providing a current sample time information 638. Therefore, the replacement sample timing information 642 is in general based on a more enlarged time period and is therefore less prone to random errors, and more dependable, in general.

The replacement sample timing information 642 may be derived over a period of time which is longer than a period of time for which timing error information 634 is considered by the loop filter 636 to provide a current sample timing information 638 [e.g., time period considered by the loop filter for a provision of the sample timing information][e.g., filter length of a FIR filter used as the loop filter].

In some examples, the impulse response of the replacement value provider 640 to a value of the information 634 (or 638) is longer than an impulse response of the loop filter 636 to a value of the timing error information 634 (or 638).

The replacement value provider 640 may perform linear averaging by means of equal or different weights.

Examples of techniques for obtaining the replacement sample timing information 642 are here provided.

One could imagine that the replacement value provider 640 generates the replacement sample timing information 642 by massively averaging the values 634 (or 638) relating an extremely extended time period (and a great number of samples). However, it has been noted that it is beneficial for the replacement value provider 640 to reduce the complexity and the memory requirements by considering only a selected number of samples per time unit. While the selected samples will be averaged or filtered by the replacement value provider 640, the non-selected ones will not be used by the replacement value provider 640.

For examples, the replacement value provider 640 may select samples which have a larger temporal spacing than the samples of the information 634 or 638. The replacement value provider 640 may therefore evaluate less samples per time unit than the loop filter. Therefore, the computation effort required by the generation of the replacement sample timing information 642 is not excessive, but the replacement sample timing information 642 still provides historical information, as compared to the values provided by the loop filter.

For example, the replacement value provider 640 may generate the replacement sample timing information 642 by considering, instead of all the samples of the information 634 (or 638), only a downsampled version (e.g., sub-sampled version) of the information 634 (or 638). For example, the replacement value provider 640 may average (or perform filtering by considering) only a particular percentage of the samples of the information 634 (or 638), while discarding the other samples. The downsampled version of the information 634 (or 638) may have a first sampling rate between 100 times and 10000 times, or between 500 times and 2000 times, slower than the sampling rate of the information 634 or 638. In examples, the replacement value provider 640 may vary (downsample) a rate of samples of the information 634 or 638, by a factor of 2, hence generating the replacement sample timing information 642 hence discarding one out of two samples. In other examples, the rate of samples may be varied by a factor of 8 or at least by a factor of 16 or at least by a factor of 32 or at least by a factor of 64 and/or at least by a factor of a power of 2.

The replacement value provider 640 may adaptively select samples of the timing error information 634 to perform filtering or averaging on the selected samples between a lower sampling rate and a higher sampling rate.

Further, it has been noted that it is possible for the replacement value provider 640 to adaptively select the number of samples of the information 634 (or 638). Therefore, the distance between two consecutive selected samples of the information 634 (or 638) may be increased or reduced on the basis of determinations performed on the input signal 602 (or on any of the information 606, 610, 634, 638, in examples). For examples:

if the input signal is noisy, the distance between the samples of information 634 (or 638) which are selected for calculating the sample timing information 642 will be reduced (e.g., with high noise, the downsample factor is small, e.g., 2 or 4);

if the if the input signal is not noisy, the distance between the samples of information 634 (or 638) which are selected for calculating the sample timing information 642 will be increased (e.g., with low noise, the downsample factor is large, e.g., 32 or 64).

Accordingly, there may be a measurement on the fly of the SNR of the received signal: the higher the SNR, the lower the downsampling rate. Therefore, the noisier the input, the lower the distance between the used samples.

If the input signal 602 is noisy, the information 642 that can be obtained may be in principle assumed as non-particularly reliable. To cope with this issue, the replacement value provider 640 increases the number of samples per time unit (and/or reduced distance between the selected samples)

to be averaged, so that the resulting information 642 is based on more samples. Therefore, for noisy signals the replacement value provider 640 may consider, per time unit, an increased number of samples of the information 634 (or 638) than for less noisy signals.

In general terms, in dependence on a signal-to-noise ratio of the input signal or in dependence on other criteria, it is possible to perform different downsampling techniques for obtaining the information 642. For example, the lower the signal-to-noise ratio, the higher the downsampling.

In examples, filtering or averaging on the selected samples may be performed by the replacement value provider 640 on the basis of at least one of or a combination of target signal to noise, SNR, ratio, supported timing offset range, supported carrier frequency offset range, convergence speed requirements, the scheme used for the time error detection, data signal characteristics, the used roll-off of the transmit-side pulse-shaping filter and/or the used roll-off of a receiver-side matched filter (608).

The replacement value provider 640 may have signal processing capabilities and/or may process an analysis of the information 634 or 638, e.g., by correlation and/or autocorrelation, to optimize the downsampling, and may calculate the signal-to-noise ratio, for example.

Notably, however, it is in general advantageous not to indefinitely up-scale the distance between two consecutive selected samples of information 634 or 638 (or not to indefinitely reduce the sampling rate of the information 634 or 638). In fact, those samples, that the replacement value provider 640 shall average or filter, shall be obtained during the illumination time. Therefore, a maximum distance is defined. The sampling rate of the information 634 or 638 (as input to the replacement value provider 640) may therefore be configurable and/or controllable so that its lower end is configured considering the maximum and minimum illumination time (other conditions may be defined). Accordingly, it is ensured that the replacement value provider 640 does not try to obtain samples of the information 634 or 638 only during non-illuminated periods.

The replacement value provider 640 may average or filter samples of at least two different time periods of the input signal 602 during which the input signal fulfils a predetermined condition (e.g., the predetermined condition, such as the presence of illumination). At least some of the samples of the information 634 or 638, taken into consideration by the replacement value provider 640, may be taken from different periods of illumination. However, the replacement value provider 640 refrains from taking into account samples of the non-illuminated time periods.

In examples, samples of the information 634 or 638 may be chosen on the basis of configuration data and/or a lookup table in dependence on a configuration or in dependence of a communication scenario.

As explained above, the receiver signal processing 600 may have at least two or three modes:
the feedback mode, in which the sample timing information 638 of the feedback path 630 is activated;
the replacement value provision mode, in which the sample timing information 638 is deactivated (in turn the replacement information 642 may be provided);
(optionally) the intermediate mode.

The intermediate mode may be provided for avoiding hard-switching when transitioning from the replacement value provision mode to the feedback mode. The processing 600 may operate as follows:
for transitioning from the feedback mode to the replacement value provision mode (e.g., when illumination is terminated):
transitioning from the feedback mode to the intermediate mode; and, subsequently,
transitioning from the intermediate mode to the replacement value provision mode; and/or
for transitioning from the replacement value provision mode to the feedback mode (e.g., when illumination is determined):
transitioning from the replacement value provision mode to the intermediate mode; and, subsequently,
transitioning from the intermediate mode to the feedback mode.

The processing 600 may be configured, for example, to smoothen the transition, e.g., by avoiding a "jump", or performing an interpolation and/or adaptation with the replacement value as a baseline. As shown in FIG. 6, in the intermediate mode, the value 646 (which may be a version of the replacement sample timing information 642) may be provided to the loop filter 636, which therefore may filter the replacement value 646 (or a value intermediate between the replacement value 646 and the value 634) and provide the filtered value as sample timing information to the timing interpolator 604. The value 646 may be an example of reconfiguration information provided by the replacement value calculator 640 to the loop filter 646 for the intermediate mode.

In addition or in alternative, the loop gain associated to the loop filter 636 may be increased and/or the loop filter characteristic may be modified during an initial transitory interval in which the loop filter 636 is modified. In some cases, when the SNR is detected as being reduced with respect to the previous SNR, the loop gain may be increased or loop filter characteristic may be modified. In examples, it is possible to increase the loop gain and/or change the loop filter characteristic (e.g. wider low-pass bandwidth) of the loop filter 636 for an input signal with a comparatively higher signal to noise ratio, SNR, with respect to a signal with a comparatively lower SNR, and/or to decrease the loop gain and/or change the loop filter characteristic (e.g. smaller low-pass bandwidth) of the loop filter 636 for a signal with a comparatively lower SNR with respect to a signal with a comparatively higher SNR.

In examples, the activation of the feedback mode and of the replacement value provision mode (and/or the transition through the intermediate mode, in some examples) is performed by a freezing controller 650, which may operate on the basis of a power information 656 (e.g., by recognizing the status of illumination or non-illumination).

Figure 6A:
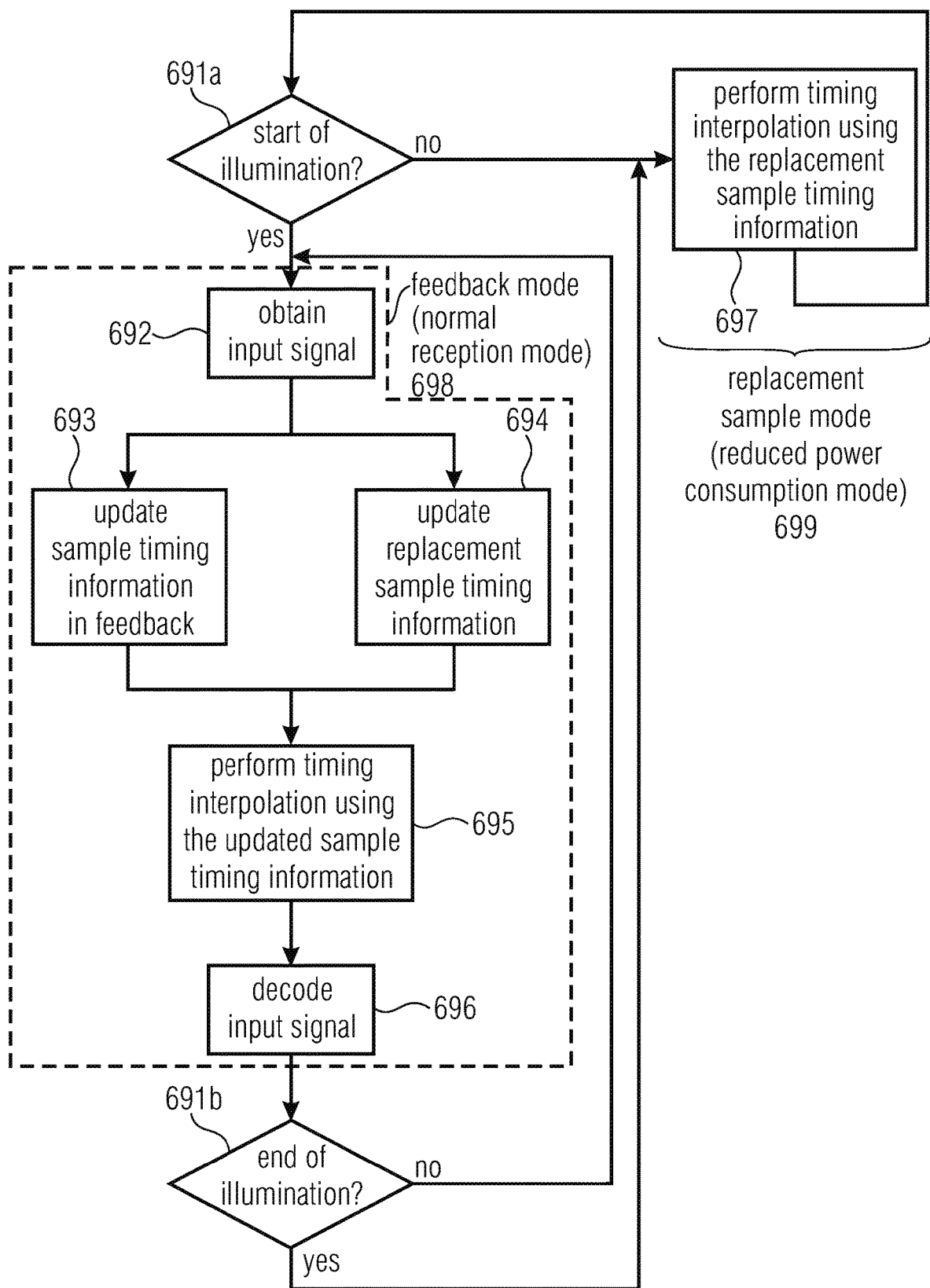
FIG. 6a: shows a flow chart diagram of a timing loop

FIG. 6a shows a diagram 690 which shows operations according to the Aspect 1. At 691a, the freezing controller 650 checks whether an illumination is present (which may be the predetermined requirement, for example), e.g., by detecting a start of illumination has occurred. If illumination has started, steps 692-696 of a feedback mode 698 are invoked. In these steps 692-696 a feedback processing is activated. At 692, an input signal 602 is obtained. Then, at 693, the sample timing information 638 is updated by the feedback path 630. In parallel (or in series in other examples), at 694 the replacement sample information 642 is updated by the replacement value provider 640, even if it is currently not output (not in all cases the update is activated; for example, the step 694 is actually activated at a distance of 1000 snapshots, for example, or at another distance as discussed above, e.g., on the basis of the determined SNR). At 695, the timing is applied by the adjustable sample provider 604, so as to interpolate the timing on the basis of instantaneous feedback. At 696, the signal is decoded at block 620. Then, a new check is performed at 691b. If at step 691b it is verified that the illumination is absent (e.g., by determining an end of illumination), a replacement sample timing provision mode 699 (block 697) is entered, in which the replacement sample timing information 642 is continuously output to perform timing interpolation on the basis of the replacement sample timing information 642.

Notably, the feedback mode 698 may also be considered a normal reception mode, during the components 604, 608, 612, 616, 620 operate to permit the decoding of data from the signal 602 under the timing conditioned by the feedback path 630. To the contrary, the replacement sample timing provision mode 699 may also be a reduced-power-consumption mode, in which also the components 612, 616, 620, and/or the feedback path 630 are deactivated, so as to reduce power consumption during non-illumination periods.

Figure 6B:
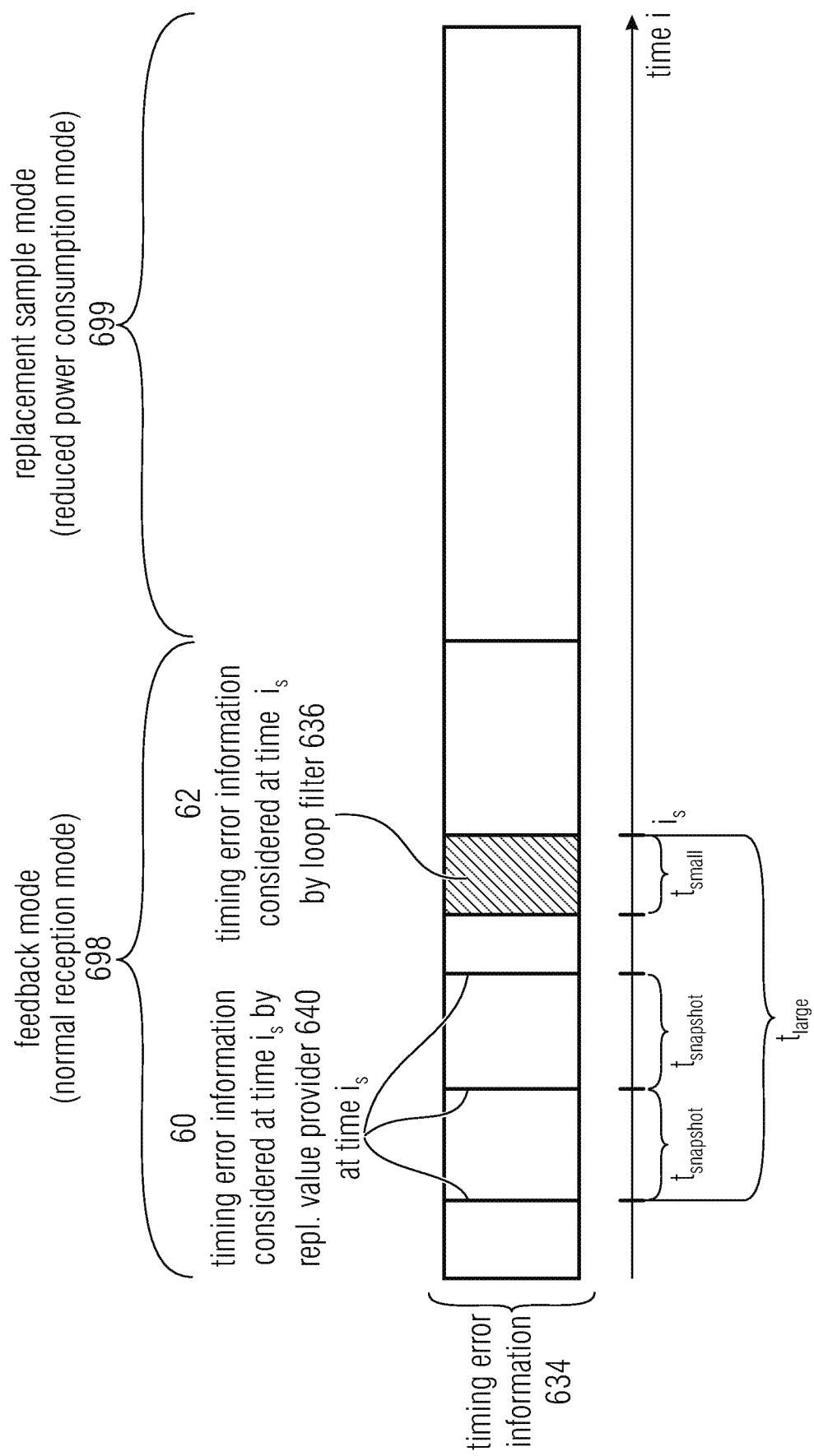
FIG. 6b: shows a filtering and/or averaging according to an example

FIG. 6b resumes operations according to the first aspect in a one-dimensional graph. A time axis is represented as a discrete succession of samples i, each associated to a sample of the timing error information 634 used to generate the sample timing information 638. The feedback mode 698 (during illumination) and the replacement sample mode 699 (in absence of illumination) are shown. At a generic instant $i_s$ in the feedback mode 698, the loop filter 636 processes the timing error information 634 relative to samples in a small time period $t_{small}$ (formed, for example, by the last 32 samples, indicated with 62, of the timing error information 634), to obtain a sample of the sample timing information 638 to be provided to the adjustable sample provider or timing interpolator 604 (see step 693). At instant is also the replacement value provider 640 processes the timing error information 634, so as to update the replacement sample timing information 642. The samples of the timing error information 634 averaged (e.g., at step 694) by the replacement value provider 640 are taken from a large time period $t_{large}$, (with $t_{large} > t_{small}$). However, as explained above, not all the samples in the large time period $t_{large}$ are processed by the replacement value provider 640: for example, only samples 60, with a relative distance $t_{snapshot}$ (snapshot distance), may be selected. Notably, however, in the feedback mode 698 the samples of the sample timing information 638 are provided to the timing interpolator 604, while the updates of the replacement sample timing information 642 are not output by the replacement value provider 640. In the replacement sample mode 699, neither the replacement value provider 640 nor the loop filter 636 perform any averaging or filtering. However, in the replacement sample mode 699, the replacement value provider 640 may continuously provide a constant value of the replacement sample timing information 642 to the timing interpolator 604, while no timing information is provided from the loop filter 636 to the timing interpolator 604.

In examples, the averages or filter operations performed by the loop filter 636 and/or the replacement value provider 640 may be weighed. For example, the samples closer to $i_s$ may be awarded of a higher weight than the samples more distant from $i_s$. In other cases, the weights may be unitary and/or equal among the samples.

As explained above, the length of $t_{snapshot}$ may be adapted to the receive signal 602. Noisy signals may need a smaller length for $t_{snapshot}$. In examples, therefore, the higher the SNR, the smaller $t_{snapshot}$.

The replacement value provider 640 may also temporally smoothen the sample timing information 638 provided by the loop filter 636 to obtain a more accurate replacement sample timing information 642 than the sample timing information 638.

A discussion on operations described above is here carried out.

Compared to the conventional approach of FIG. 3, the feedback path 630 is enhanced in accuracy by larger bit-width and the module 640 for replacement value calculation using the loop filter output (and/or the TED output 634, in another embodiment). In case of freezing is activated, the depicted switch 644 (or any other data path control mechanism) is used to forward the accurate replacement value to the timing interpolator 604 instead of the loop filter output 638. When freezing is deactivated, the switch 644 moves back to forward the loop filter output 638 towards the timing interpolator 604. In preparation for this case, the replacement value calculation module 640 optionally provides re-initialization information and data 646 to the loop filter 636. This has two benefits: avoiding a control signal jump when switching and continuing the interpolation and adaptation process with the replacement value as baseline.

Instead of a hard switching, one could also (optionally) use soft switching in another embodiment (see above). This means calculation and providing of some intermediate values for smooth transition between the replacement value 642 and the new loop filter values 638.

Note that another embodiment may have the proposed scheme (=replacement value calculation and switching between replacement value and loop filter value) located within the loop filter module applied to module internal signals/variables/values.

An approach of the replacement value calculation may be to do massive averaging over loop filter values. However, this could cost memory and increase complexity. Instead some embodiments (optionally) exploit knowledge about low-pass and averaging character of the loop filter. So, consecutive output samples 368 of the loop filter 363 are expected to be correlated. Different loop filter configurations and optimizations are possible cf. [7] and [8] depending on the target SNR range, supported timing offset range, supported carrier frequency offset range, and convergence speed requirements. All this will influence the correlation characteristic of the loop filter output signal. Furthermore, it also depends on the used TED scheme and the present data signal characteristics, e.g. the used roll-off of the transmit-side pulse-shaping filter and the used roll-off of the receiver-side matched filter. Therefore, the innovative replacement value calculator 640 may optionally perform one or more of the following functionalities:

Averaging over snapshots of the loop filter signal 638, where the snapshot distance is optionally configurable according to different timing loop module configurations and signal properties (e.g. the level of included noise represented by SNR)
Maximum averaging gain for a given averaging depth/filter length may be achievable.
Linear averaging is in general advantageous over other methods (e.g. IIR) but not necessary
Maximum averaging gain due to equal weighting of all values may be achieved.

For a timing loop configuration, investigations have shown that a snapshot distance of 1000 brings the same averaging gain than averaging over all values. Thus, the memory requirement reduces by 1000, e.g. from averaging over 500.000 values to 500 values. Even if the TED 632 and the loop filter 636 are configured static, different roll-offs used in the matched filter and noise levels within the received signal justify scaling the snapshot distance by a factor of up to 20 (optional). Note that in some cases the snapshot distance cannot be up-scaled arbitrarily because there is a given minimum illumination time (worst case). One can either care for getting enough statistics during each illumination or do the averaging of snapshots over more than one illumination assuming that the timing offset stays rather constant.

To achieve an optimum snapshot distance, one can (for example) do either offline optimization for the different configurations and scenarios and store a table look up in the receiver. Or online optimization is made by analyzing the loop filter signal, e.g. by correlation. Of course, the first approach represents an advantageous low complexity solution. Other solutions are also possible.

A final goal of the whole optimization is that the accumulated timing offset after the duration of illumination absence lies with only a fraction of symbol duration, e.g. 0.1. Due to the free-running timing interpolator based on the replacement value, the inaccuracy is integrated over time. This is in order to limit signal distortion to other modules until timing loop is successfully un-frozen and re-synchronized back on track.

Innovative Aspect 2: Freeze control driven by power level analyzer (usable independently or together with aspect 1)

It is here explained how to perform a determination of a received signal according to examples. A controller 650 may be used, for example, to determine the reception of a signal (e.g., the signal 602).

As explained above, there arises the necessity of discriminating:
- a signal intended to the particular coverage area in which the receiver is positioned; from
- a signal intended to a different coverage area.

If the different coverage area is close to the coverage area in which the receiver is positioned, there arises the possibility that a beam (which, according to the BSTP, is indented to be transmitted to the different coverage area) is detected and incorrectly assumed as part of the signal 602 do be decoded.

A controller unit may be used, with reference to FIG. 2A, for distinguishing between the higher illumination at power level $P_2$ of beam C (which is meant for the receiver) and the lower illumination (e.g., directed to a different device) at power $P_1$ of beam D.

The controller unit may, in examples, comprise a freezing controller 650 downstream to and/or cooperating with a power detector 654. The power detector 654 may check whether the power of a signal is within a particular interval, for example. In examples, the power detector 654 may also determine a particular power interval (see below) to be used subsequently. Notably, in examples, at least some functions of the controller 650 may be performed by the power detector 654 or vice versa. In examples, the power detector 654 may be integrated in the controller 650. In the following, the terminology "controller unit 650, 654" may be used for indicating at least one of the power detector 654 and the controller 650.

Notably, the controller unit 650, 654 may activate or deactivate the replacement value provision (e.g., identified by the control signal line 652 which commands the selector 644) discussed above. The controller unit 650, 654 may determine whether an input signal 602 is a transmission to be received or not on the basis of power information or another quantity associated to the power. In some cases, other conditions, besides the power information or the quantity associated to the power, may be taken into consideration as well. The operations of the unit 650, 654 may, however, be used also for different or independent purposes. (With commands 652', 652", 652''' the controller unit may also freeze the loop filter 636, the AGC 612, and the TED 632, for example.)

In examples, the controller unit 650, 654 may be configured to perform a determination whether a power of a receive signal 602, or a quantity 656 derived from the power [for example, a low-pass-filtered version of a power level information], lies within a limited interval, and to recognize the transmission 602 to be received based on the determination. On the basis of the determination, the controller unit 650, 654 may control the activation/deactivation of the switch 644.

In examples, the controller unit 650, 654 supports a special activation mode "exploit other illumination" based on the detection of different illumination power levels and qualification of the other illumination(s) to be in a suitable power level range to be exploitable by the receiver in order to improve synchronization. Also side information like decoded coverage ID from the received signal can be taken into account for qualification. This special activation mode may control the modules differently compared to the activation mode according to the prior art. For example, the scaling adaptation of the AGC 612 can be frozen or intentionally biased by the power difference, but the feedback path 630 will be activated.

In examples, if the controller unit 650, 654 recognizes:
- that the input signal 602 is a transmission to be received (hence verifying that the predetermined requirement, such as the current illumination, is fulfilled), to switch the selector 644 to activate the feedback mode (so that the timing interpolator 604 is fed with sample timing information 638 based on a timing error information 634 of the current samples of the signal); and/or
- that the input signal 602 is a transmission which is not to be received (hence verifying that the predetermined requirement, such as the current illumination, is not fulfilled), to switch the selector 644 to activate the replacement value provision mode (so that the timing interpolator 604 is fed with replacement sample timing information 642).

In at least one of the cases, the intermediate mode as discussed above may also be triggered by the controller unit 650, 654.

The controller unit 650, 654 may understand, for example, that the signal 602 is a signal to be received and decoded when the controller unit 650, 654 determines that the power level is within a particular interval (this operation may be performed by the power detector 654, in examples). With reference to FIG. 7b, interval 702 may be bounded by a lower interval boundary value 704 and an upper interval boundary value 706. This may for example constitute an identification of a "power level" or of a "power range". The controller unit 650, 654 may therefore identify whether the received signal presents a previously determined power level [for example, a power niveau][for example out of more than two power levels to be distinguished, wherein the at least two power levels or niveaus may be associated with different signal contents, different beams, different receivers . . . ]. For example, in FIG. 7b the sample 708 is within the power range 702, while the sample 710 is outside the power range 702.

The controller unit 650, 654 may, in examples, additionally determine how long the power of the receive signal 602 (and/or the quantity derived from the receive signal such as, for example, the low-pass-filtered version of a power level information) lies within the limited interval. Hence, the controller unit 650, 654 may determine the time length of the interval. Accordingly, the controller unit 650, 654 may recognize a length of at least one limited time period [for example, a length of a signal burst, or a length 712 of an illumination of a certain spatial region] during which the receive signal 602 comprises a power level [e.g., by counting the number of consecutive samples in the same power level and/or by analysing the time distance between samples within a predetermined search time period].

In examples, the limited interval 702 may have fixed and its upper and lower interval values 704, 706 may be fixed and predetermined (e.g., defined offline).

In other examples, the limited interval (and the values 704, 706) may be dynamically defined. E.g., at least one power level may be dynamically defined on the basis of the determination that a predetermined number of (e.g., at least two) consecutive power samples lie within limited intervals associated with a particular power level. The controller unit 650, 654 may determine how long the power of the receive signal 602, or the quantity derived from the receive signal lies within the limited interval. Accordingly, it is possible to recognize a time length 712 of at least one limited time period [for example, a length of a signal burst, or a length of an illumination of the certain spatial region (coverage area 104-108) in which the receiver 110-114 is positioned] during which the received signal 602 comprises a particular power level (e.g., 702). For example, it is possible to recognize the time length 712 of the power level 702 by counting the number of consecutive samples in the same power level and/or by analysing the time distance between samples within a predetermined search time period. In examples, the power level 702 may be dynamically defined on the basis of the determination that at least two consecutive power samples lie within limited intervals associated with a particular power level.

In examples, the controller unit 650, 654 may check whether the recognized length of the limited time period 712 during which the received signal comprises the power level 702 fulfils a predetermined condition. For example, the predetermined condition may be: "is the recognized length of the limited time period (during which the received signal comprises the power level) at least approximately a multiple of a scheduling granularity?" or "does the recognized length of the limited time period (during which the received signal comprises the power level) comply with a time schedule of a given transmission out of a plurality of different transmissions?". By verifying the at least one of the conditions ("YES"), it is possible to support the recognition that the input signal 602 is associated to a transmission to be received. Evaluating more than one criterion allows to recognize erroneous determination. By verifying that the at least one of the conditions is not verified ("NO"), it is possible to recognize an erroneous determination of the signal. Therefore, error detection capabilities are increased.

The number of power levels that may be determined by the controller unit 650, 654 (and in examples, by the power detector 654) may be at least two (in FIG. 2A, for example, three power levels $P_1, P_2, P_0$ are recognized; in FIG. 2B four power levels $P_1, P_2, P_3, P_0$ are recognized). (For the sake of simplicity, FIGS. 2A and 2B do not show the upper and lower interval values which are indicated with 704, 706 in FIG. 7B.) Therefore, it is possible to distinguish different power levels. Notably, in some cases, at least one of the levels may be noise power level (e.g., $P_0$), while the highest power level (e.g., the higher one, such as $P_2$ in FIG. 2A and $P_3$ in FIG. 2B) may be understood as being associated to the transmission that is intended to be received and decoded by the receiver. The other power levels may be power levels associated to beams that are intended for different receivers and may also considered as noise or secondary power levels (see also below).

Accordingly, the processing 600 may refrain from decoding the input signal 602 when the latter is associated to a noise power level: for example, the controller unit 650, 654 may transmit a notification 660 to the data processor 620 that the incoming signal is not to be decoded. In addition or alternative, the controller unit 650, 654 may activate (e.g., via command 652 and selector 644) the replacement sample timing provider 640, so that the latter starts providing the replacement sample timing information 640 to the timing interpolator 604.

In examples, the controller unit 650, 654 may track durations during which the different power levels are present, to derive a scheduling information. For example, the controller unit 650, 654 may be configured to recognize that, within a predetermined search time period, a plurality of samples are within a particular power range so as to recognize a particular power level. This technique may allow the receiver to learn the scheduling without necessity of explicitly signalling the scheduling information from the transmitter (e.g., satellite 602), for example, and may be carried out in a particular initialization session.

In examples, as initialization is performed to obtain parameters associated to at least one or a combination of power so as to determine at least one power level to be subsequently used to recognize a transmission to be received; time information; and/or quality information. The controller unit 650, 654 may analyze a temporal evolution of the power, or of the quantity derived from the power, over a period of the receive signal in order to perform the initialization, or to receive a signalled information in order to perform the initialization.

In examples in which the transmitter (e.g., satellite 102) also signals the scheduling plan (e.g., BSTP), the duration of the time period for receiving may notwithstanding be checked by the controller unit 650, 654, so as to verify the correctness of the scheduling information and/or to verify the correctness of the transmission which is being received. Here, the controller unit 650, 654 checks whether a current power lies within a limited interval, interval boundaries of which are determined on the basis of the previously derived scheduling information.

The controller unit 650, 654 may store time information characterizing [and/or describing] time portions of different levels of the receive signal 602 (e.g., scheduling), store information on the power levels of the receive signal, or the quantity derived from the power. The controller unit 650, 654 may also be configured to recognize, in subsequent instants, time periods associated to the transmission to be received on the basis of at least the stored time information (e.g., scheduling).

The controller unit 650, 654 may use stored information on the power levels of the receive signal during different time portions for the recognition of the time periods and power levels associated to the transmission to be received [for example, for setting interval boundaries 704, 706].

In examples, the processing 600 (and the receiver as well) may be in at least one of the two modes:
- a reduced-power-consumption mode (e.g., 699) on the basis of the derived scheduling information [for example, for periods of time for which it is estimated, on the basis of the derived scheduling information, that there is no transmission to be received by the receiver]
- a normal reception mode (e.g., 698) when a transmission to be received (e.g., 602) is expected on the basis of the derived scheduling information.

In the reduced power consumption mode 699, the processing 600 may be in the replacement sample timing provision mode (such that the timing interpolator 604 is fed with replacement sample timing information 642, while the loop filter 636 and/or the TED 632 are deactivated). Further, in the reduce power consumption mode 699, the received signal 602 may be not subjected to decoding. In the normal reception mode 698, the processing 600 may be in the feedback mode (such that the timing interpolator 604 is fed with sample timing information 638, and/or the loop filter 636 and/or the TED 632 are activated, and/or the replacement sample value provider 640 does not provide the replacement sample timing information 642, even if it may continue to perform averaging). Further, in the normal mode, the input signal 602 may be actually decoded.

The controller unit 650, 654 may recognize periods of time during which different power levels are present, so as to rank the different time periods to recognize the time periods for the transmission to be received. For example, the controller unit 654, 650 may determine during which periods of time there is the highest power level, the second highest power level, and so on. For example time period during which there is the highest power level may be chosen as the illumination period. The lower power level may be associated to noise. The remaining power levels may be considered secondary power levels). Hence, while the lowest measured power level (e.g., $P_0$ in FIGS. 2A and 2B) may be interpreted as noise, the remaining non-highest-ranked power levels (e.g., $P_1$ in FIG. 2A and $P_1$ and $P_2$ in FIG. 2B) may be interpreted as secondary power levels. The secondary power levels may be used for possible hand-over (e.g., in case of impossibility of obtaining the signal at the highest power level anymore) and/or for tracking the power level differences over time in order to identify a suitable beam for hand-over. Hand-over may be needed when a receiver is mobile and goes from one coverage area to the next coverage area (e.g., it moves from area 104 to area 106). In this case, the user data is no longer provided by the beam of the one coverage area but by the beam of the next coverage area. This observation and tracking of the power levels and/or power level differences also allows for determination whether the signal of a secondary power level can be used to enhance the receiver synchronization. For example, if the secondary power level is very close to the main power level, i.e. above a given threshold, good signal quality can be expected from the signal of the secondary power level. So exploiting this is provides enhanced synchronization performance/accuracy/stability.

Figure 7:
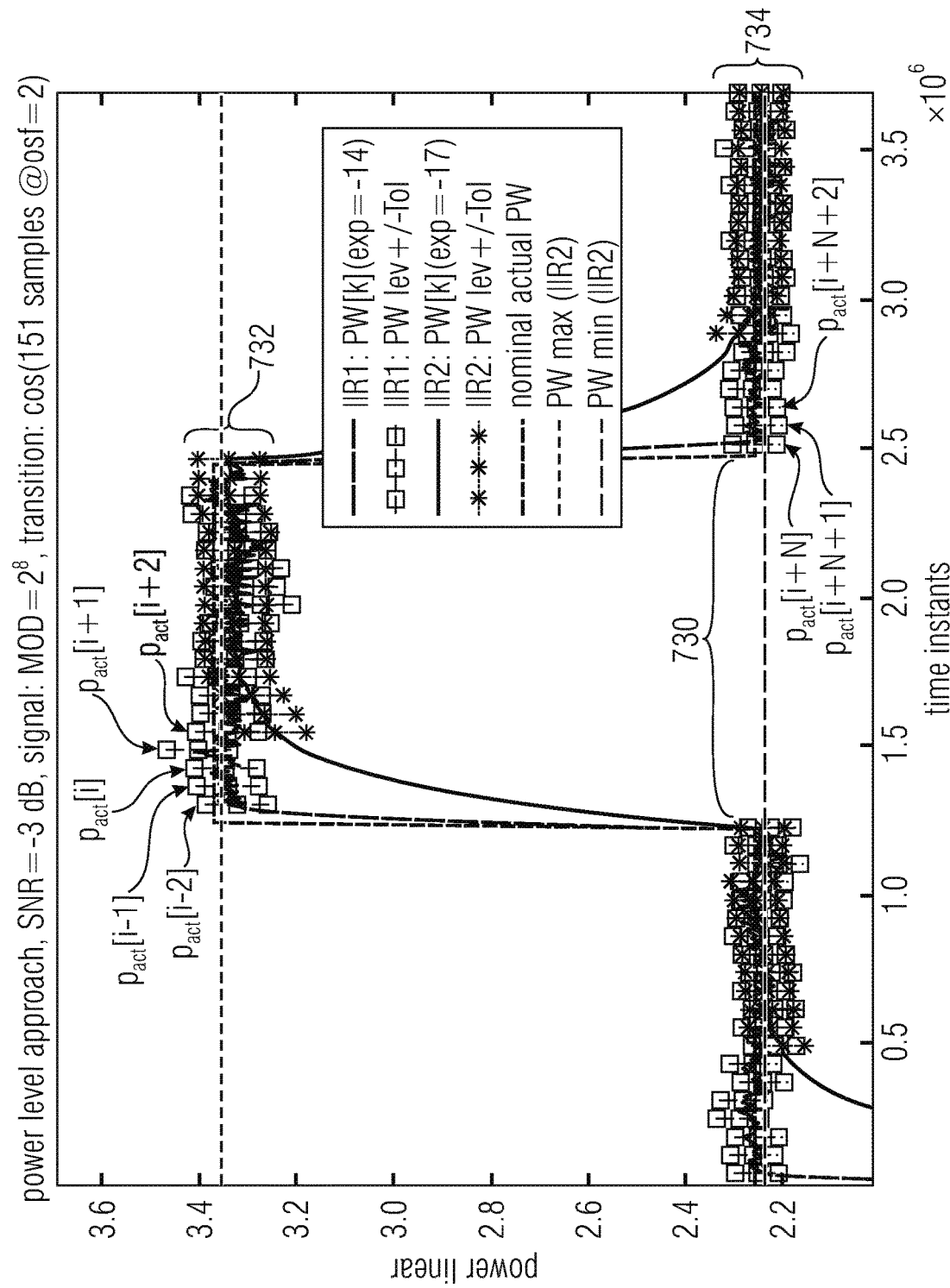
FIG. 7: shows a power detection using power level detection.
Figure 7A:
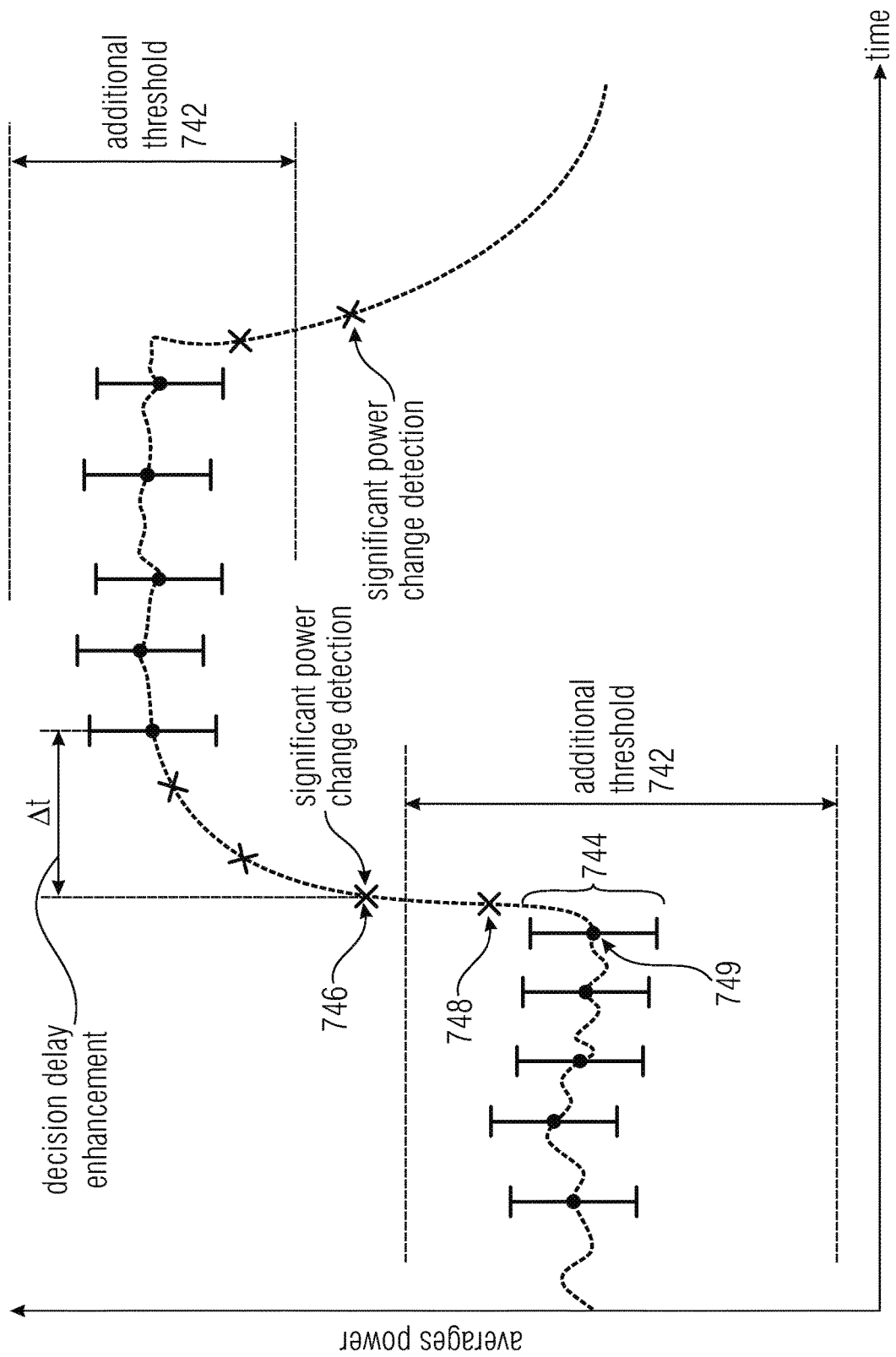
FIG. 7a: shows an enhanced power detection and analysis by means of an additional threshold check to identify significant change in power.
Figure 7B:
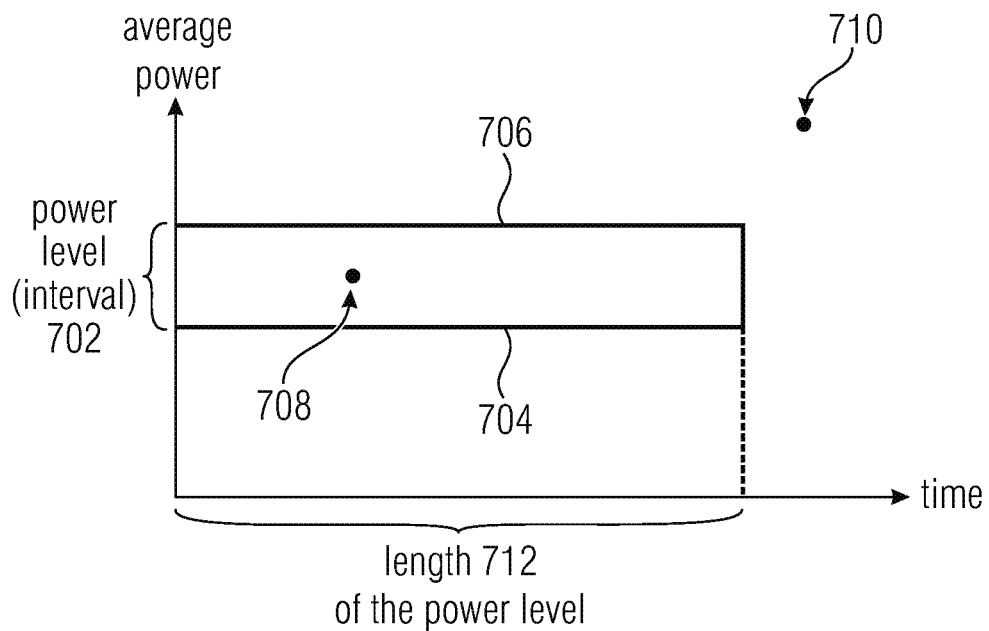
FIG. 7b: shows an example of power level.
Figure 7C:
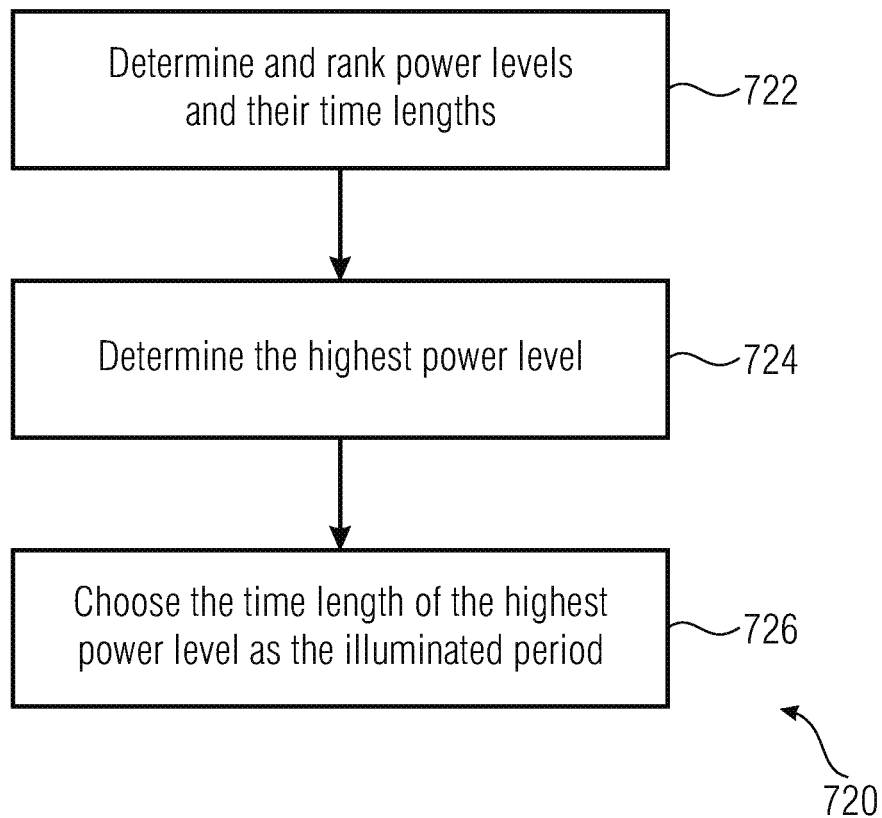
FIG. 7c: shows a method according to an example.

FIG. 7c shows an example of a method 720 which may be performed by the controller unit 654, 650. At step 722, the power levels of an input signal and their time lengths are determined. With reference to FIG. 2A, the controller unit 650, 654 may obtain the knowledge of the power level (e.g., so as to describe each of $P_0$, $P_1$, and $P_2$ in terms of its boundaries 704, 706, so as to describe) and the time periods associated to the power levels. The retrieved power levels are ranked, e.g., from the highest power level (e.g., $P_2$ in FIG. 2A) to the lower power level (e.g., $P_0$). At step 724, the power level with highest power (highest power level, e.g., $P_2$ in FIG. 2A) is determined (e.g., determining the time period with highest ranking). With reference to FIG. 2A, the controller unit 654, 650 may therefore determine that the illuminated period corresponds to the length of the interval associated to the power level $P_2$ (with highest ranking), hence understanding the super-frames SF7 and SF8 as the illuminated period. Analogously, the controller unit 654, 650 may understand the other time periods (e.g., super-frames SF1-SF6 and super-frames SF9-SF12) as noise periods. In particular, the periods associated to super-frames SF9 and SF10 will be understood as a period in which a beam directed to a different coverage area causes an unintended illumination which is to be considered as noise. At step 726, the period of illumination with highest power level (e.g., $P_2$) is chosen as the correct illumination period. Therefore, for subsequent super-frames, the input signal 602 will be decoded only when it is in the correct illumination period (e.g., super-frames SF9 and SF10).

FIG. 7d shows a possible result of the method 720 applied to the scenario of FIG. 2A. A table 750 may be obtained and stored in a memory unit. Each row may be associated to a different interval ($P_0$, $P_1$, and $P_2$). The column 752 is associated to the particular time period associated to each to the power intervals interval ($P_0$, $P_1$, and $P_2$). In this case, the column 752 is subdivided into two sub-columns: a start sub-column 752a indicating the frame in which the period begins and an end sub-column 752b indicating the frame in which the period ends. The column 754 may indicate the retrieved power levels ($P_0$, $P_1$, and $P_2$). The column 754 is in this case subdivided into two sub-columns: a lower power boundary sub-column 754a indicating the lower boundary (e.g., $P_x - \varepsilon_1$) of the power interval (e.g., 704 in FIG. 7b) and a higher power boundary sub-column 754b in which the period begins and an end sub-column 752b indicating the higher boundary (e.g., $P_x + \varepsilon_2$) of the power interval (e.g., 706 in FIG. 7b). The column 756 indicates the rank of the particular power level. The noise is assumed to be $P_0$, as being the lower-ranking-interval. The illumination period is chosen as the super-frames SF7-SF8 (power level $P_2$), as being the highest-ranking-interval. The secondary power level is $P_1$.

The processing 600 may decode and/or detect at least one information [e.g., a sequence and/or a preamble and/or a particular bitstream] encoded in the receive signal 602, so as to determine the start (e.g., 120a, 122a, 124a) and/or the end (e.g., 120b, 122b, 124b) of a period of the transmission to be received. In some examples, both the power level and the decoding may be used, and a transmission to be received may be recognized already when a characteristic information has been decoded and/or detected, even if the power is still not within the limited interval.

The processing 600 may receive signalling transmissions from a transmitter (e.g., the satellite 102) regarding time information [e.g., scheduling-related and/or BTSP-related information and/or modification] and/or lower interval boundary value and/or an upper interval boundary value associated to at least one power levels [e.g., range]. The controller unit 654, 650 may obtain signalling transmissions so that the controller unit 654, 650 is at least partially controlled by the signalling transmissions and/or obtain side-information.

In some examples, a redundancy strategy may be used, so as to verify the correctness of the determination of the power level. For example, it is possible to:
perform the determination whether the power of a receive signal 602 is within the interval 702; and
verify the correctness of the determination on the basis of at least one of the following strategies:
detecting a slope in the power under or over a predetermined threshold. For example:
if a positive increment in the detected power of the received signal in respect to the time is greater than an upper threshold, a fast increment of the detected power is determined, and/or
if a negative increment in the detected power of the received signal in respect to the time is lower than a negative lower threshold, a fast decrease of the detected power is determined; and/or
using time information obtained with previous power level determinations [for example, to predict a time when the transmission to be received is expected to start using a time extrapolation]; and/or
decoding [or detecting] a particular information [e.g., a sequence and/or a preamble and/or a particular bitstream] encoded in received signal; and/or
detecting quality information [e.g., signal to noise ratio] or deducing it from other modules [e.g. signal to noise ratio estimator]; and/or
using data signalled from and/or commands from a transmitter.

For example, a fast increment or fast decrease of the detected power may be associated to the fact that the received signal 602 is now in a different power level (which may lead to the information that the signal is the signal to be actually received in case of fast positive increment, and to the information that the signal is not to be received anymore if the fast decrease). In addition or alternative, the power level may be validated using one of the other strategies listed above.

In examples, the controller unit 654, 650 may dynamically determine the value of the power level (e.g., the method 720 may be performed in real time). For example, the power level may be considered dynamically determined when a certain number (e.g., 2) of consecutive power samples (e.g., 706, 708) is recognized to be within a particular range. The controller unit 654, 650 may be configured to determine, for example:
as a first condition, if a current power sample lies within an interval determined by a first preceding sample of the power of a receive signal [for example, an interval extending upward and downward from the first preceding sample value], and
as a second condition, if the current power sample, also lies within an interval determined by a second preceding sample of the power of a receive signal, or of the quantity derived from the power.

A continuation of the power level if both the first condition and the second condition are fulfilled.

With reference to FIG. 7, a method for determining a power interval 732 and a time length 730 is now discussed. The power sample $p_{ACT}[i]$ verifies the first condition, as $p_{ACT}[i]$ lies within an interval defined by the previous power sample $p_{ACT}[i-1]$. In fact, the condition $$p_{act}[i] \in [p_{act}[i-1] \pm p_{margin}]$$

is verified where $p_{margin}$ indicates a margin. Further, $p_{ACT}[i]$ verifies the second condition, as $p_{act}[i] \in [p_{act}[i-2] \pm p_{margin}]$.

Therefore, the power interval 730 is identified. For the subsequent power sample $p_{ACT}[i+1]$, the same two conditions are also verified w.r.t. $p_{ACT}[i]$ and $p_{ACT}[i-1]$. Hence, $p_{ACT}[i+1]$ lies in the same time interval of $p_{ACT}[i]$. The same applies to the subsequent power sample $p_{ACT}[i+2]$, and so on. At a particular time instant $p_{ACT}[i+N]$, the conditions are not fulfilled any more: therefore, the time length 730 of the interval is understood as being N+2. Notably, at time instant $p_{ACT}[i+N+2]$, the power interval 734 is identified. Hence, the condition $$p_{act}[i] \in [p_{act}[i-1] \pm p_{margin}] \cap p_{act}[i] \in [p_{act}[i-2] \pm p_{margin}]$$

may be used for checking if a new interval is found and for obtaining, recursively, the time length of an interval.

Notably, in the interval, $[p_{act}[i-1] \pm p_{margin}] \cap p_{act}[i] \in [p_{act}[i-2] \pm p_{margin}]$, the lowest value may be understood as the lower boundary 704, and may be stored in the column 754a of the table 750. The highest value may be understood as the highest value of the higher boundary 706, and may be stored in the column 754b of the table 750. The value $p_{act}[i-2]$ may be understood as $P_0$, $P_1$, or $P_2$.

The controller unit 654, 650 may be configured to:
tolerate a predetermined number of consecutive power samples [for example, one sample], which do not fulfil the first condition and/or the second condition without recognizing an end of a power level, and
recognize an end of a power level if more than the predetermined number of consecutive power samples, do not fulfil the first condition or the second condition.

With reference to FIG. 7a, the controller unit 654, 650 may determine whether a current sample of a power of a receive signal lies outside of a tolerance interval 742 [described by "additional thresholds" in FIG. 7a]. The tolerance interval 742 is larger than an interval 744 (e.g., $p_{act}[i-1] \pm p_{margin}$ as above) determined by a directly preceding sample of the power of the receive signal. Sample 746 is outside the tolerance interval 742 of sample 749, while sample 748 is inside the tolerance interval 742 (although outside the interval 744 of the sample 749). The controller unit 654, 650 may be configured to [e.g., immediately] recognize an end of a power level at sample 746 when the sample of the power of the receive signal lies outside of the tolerance interval 742 for the first time. Moreover, it is tolerated (at least one time) that the sample 748 lies outside of the interval 744 determined by the directly preceding sample 749. In this case, an end of a power level is not recognized.

In examples, the controller unit 654, 650 may:
operate according at least a first and a second operational mode [e.g., the second mode being initiated in correspondence with the end of the first mode], wherein in at least one of the first and second modes the controller is configured to perform at least one of the following techniques or a combination of at least two of the following techniques:
determining if a power of a receive signal lies within a limited interval;
verifying if a power is determined at an expected time period [e.g., as extrapolated from previous measurements];
decoding or detecting a particular information [e.g., a sequence and/or a preamble and/or a particular bitstream] encoded in the signal to be received;
checking quality information [e.g., signal to noise ratio];
checking a fulfilment of criteria according to information signalled from a transmitter;

detecting whether a slope in the power is under or over a predetermined threshold [e.g., by determining that an increment in the detected power of the received signal in respect to the time is greater an upper threshold, indicating a fast increment of the lower, and/or by determining that a negative increment in the detected power of the received signal in respect to the time is lower than a negative lower threshold, indicating a fast decrease of the detected power];

In the first mode, the controller unit 654, 650 may determine if a sample power lies within a limited interval [e.g. on the basis of power measurements], without considering information encoded in the signal. In the second mode, [e.g., initiated in correspondence with the end of the first mode] the controller unit 654, 650 does both:

It determines if the power sample lies within a limited interval [e.g. on the basis of power measurements]; and it verifies the correctness of the determination on the basis of whether information encoded in the received signal is compliant to a recognition of a transmission to be received on the basis of the power.

In examples above, reference is often made to power (e.g., values such as $p_{act}[i]$). However, the power values may be substituted in some examples by values of a quantity associated to the power, such as an infinite impulse response, IIR,-filtered version of the power.

In some examples, techniques of the second aspect may be independent from techniques of the first aspect. For example, the control unit 654, 650 may be used even without the replacement timing provider 640. FIG. 6d shows an example of a processing 600' in which, when no-illumination is detected, no replacement timing information 642 is provided. In that case, the last sample timing information 638 as provided by the loop filter 636 may be frozen.

A discussion on the techniques described above is here carried out.

In one embodiment, the controller unit 650, 654 relies only on the feedback of the power level detector and analyzer 656. This a robust configuration because it is non-data aided and not sensitive to synchronization offsets w.r.t. timing or frequency. Therefore, this is the baseline and fallback solution if other more precise methods fail. For example, the power level detector and analyzer tracks and provides all information about the different power levels detected as well as notification about power level end or start.

In other embodiments, the freeze control (optionally) evaluates also exchanged data with the block "further data processing", as shown in FIG. 6. For example, a preamble/known sequence detection algorithm provides information about detection events. Since the preamble will be included in the signal at least at the beginning of each illumination, this may help to signal freezing OFF earlier than waiting for the power level detection signal, which may have some decision delay.

The preamble detection may (optionally) also be used in combination or as verification of the "end of low power level" information from the power level detection.

On the other hand, the freeze control may (optionally) forward its freeze signals also to the block "further data processing" 620, where modules may need it to cope with the bursty input data. This case is likely to happen during acquisition when the terminal is switched ON:

For example, initially the freeze control relies only on the power detection until e.g. timing and frequency offsets are sufficiently compensated. The freeze signal may also (optionally) be provided to the preamble detection algorithm in the block "further data processing" so that it can adapt its preamble detection threshold. Once the detection threshold is converged, the preamble detection events may optionally be feedback to the freeze control.

In further embodiments, also information about measured SNR and/or signaled information via the satellite signal about beam-ID/coverage-ID/BSTP status and updates etc. is received from the block "further data processing". It can be forwarding to other modules like the replacement value calculation for reconfiguration. In addition to that the freeze control may keep this data in a history table to do identification of the recurring nature of the BSTP and use this for freezing prediction and/or sleep mode signaling to other modules during absence of illumination.

As mentioned above, the power level detector and analyzer is the baseline algorithm feeding the freeze control. It may use the receive signal before AGC as shown in FIG. 6. This makes sense since the power level detector and analyzer will not get confused when the AGC scales the signal up or down according to its control target. In case of very slow AGC adaptation or other means to compensate for the AGC power scaling effect, the power level analyzer can be placed also after the AGC. Furthermore, it may optionally be placed after the matched filter to limit the incoming noise power to the power level analyzer. Since the AGC anyway calculates the power of the receive signal and does averaging, the power level analyzer can optionally be placed within the AGC as well to save resources.

While the two approaches discussed above search for identifying the start and end of illumination directly (detection of rising/falling edge), the invented approach searches for power levels. According to a configurable snapshot distance, these snapshots are compared whether consecutive snapshots lie within a configurable margin. As shown in FIG. 7, this works well for analyzing both averages, IIR1 and IIR2. Since a short history of (for example, but not necessarily, minimum 2) snapshots may be helpful for power level detection, end of power level can be identified immediately, while start of power level decision may be delayed by the used history length. For the example of FIG. 7, a history of 2 snapshots is considered and compared against the actual snapshot. Note that longer history allows to be more error tolerant, if one (or more) snapshot(s) is/are by chance out of margin.

More specifically, snapshots from the smoothed power envelopes of two IIR filters are considered, i.e. actual snapshot $p_{act}[i]=p_{IIR1}[k=i\cdot\Delta k]$ or $p_{IIR2}[k=i\cdot\Delta k]$, where $\Delta k$ denotes a configurable time interval between two snapshots. Identifying constant power levels (within some margin) and the duration of these power levels works as follows:

Snapshot counter i

Analyse snapshots $p_{act}[i]$ w.r.t. constant power levels considering a sliding history of e.g. two snapshots. Evaluate for each i the interval check criterion $p_{act}[i] \in [p_{act}[i-1]\pm p_{margin}[1]] \cap p_{act}[i] \in [p_{act}[i-2]\pm p_{margin}[2]]$ If criterion is met, mark these three indices as "power level found". If met for the first time, set Indices: $i_{first}=i$.

If equation does not hold any more="power level end". Then $i_{last}=i$

At each power level end, store data to a list:

Mean over N detected power levels:

$$\overline{p}_{level} = \frac{1}{N} \sum_{n=1...N} p_{act}[i-n]$$

Calculate power level duration from $i_{first}$ and $i_{last}$
List analyser does on every update:
  Checks and calculates duration of power level w.r.t. multiples super-frames
    E.g. erroneously separated power levels of same level $\bar{p}_{level,A} \approx \bar{p}_{level,B}$ can be identified and re-combined.
  Performs pattern analyses to identify a BSTP period and number of different illuminations/beams detected
  Potential collection of additional information available from other modules like SNR and Coverage-ID per each illumination
  Consistency checks like one coverage-ID per power level can be done as well.

For the results in FIG. 7, a relative margin for power level detection of 2% is used.
I.e. $p_{margin}[x] = p_{act}[i-x] \cdot 2\%$ with x=1, 2.

As an optional extension to the pure detection of power levels and their start and end, a power level analyzer stores the identified power levels (average power of the snapshots or representative snapshot values) and makes sanity checks: E.g. the length of power level compared to the granularity of illumination duration. The analyzer can, for example, also do identification of recurring power levels and power level patterns. With this information the freeze control can optionally cross-check against BSTP information. Moreover, this identification can optionally be used to verify the signaling of start and end of power level as well as the events start of illumination (rising power after verified low power level) and/or end of illumination (falling power after verified high power level). Therefore, different power levels of different beams, as shown in FIG. 2A can be distinguished and tracked.

Of course, this approach can optionally be combined with the above mentioned threshold-based detector. E.g. the event end of power level can be cross-checked against thresholds, which can, for example, either be calculated from min/max powers or other snapshot power values stored in the analyzer. The power level detector and analyzer can optionally also be used in combination with the slope-based detector, to verify detections.

Note that possible power detection delay (between real rising edge of power and detection of the rising edge) is not critical thanks to the highly accurate timing extrapolation by the replacement value. As mentioned above, the freezing ON/OFF trigger can optionally also be related to known sequence detection feedback as soon as available.

A further optional extension of the power level detector and analyzer employs another threshold/interval comparison to enhance the above mentioned decision delay due to averaging. It detects the "leaving/end of a power level". The event "actual power value is significantly away from recently tracked power level" is interpreted as "start of new power level", which is often called negative indication. Note that the pure interpretation of "leaving/end of a power level" as "start of new power level" only based on the power level detection without the additional threshold provides no reliable decision and check whether there is a significantly changing power ongoing or not.

And in order to determine, what is significant, the additional threshold/interval is used (relative to recent power level or previous power values). This threshold/interval is of course bigger than the margin used for power level detection. This approach is shown in the figure below, where the decision delay enhancement is reflected. As can be seen from the figure, the cases "rising power" and "falling power" can be distinguished depending on which threshold is hit.

Figure 6C:
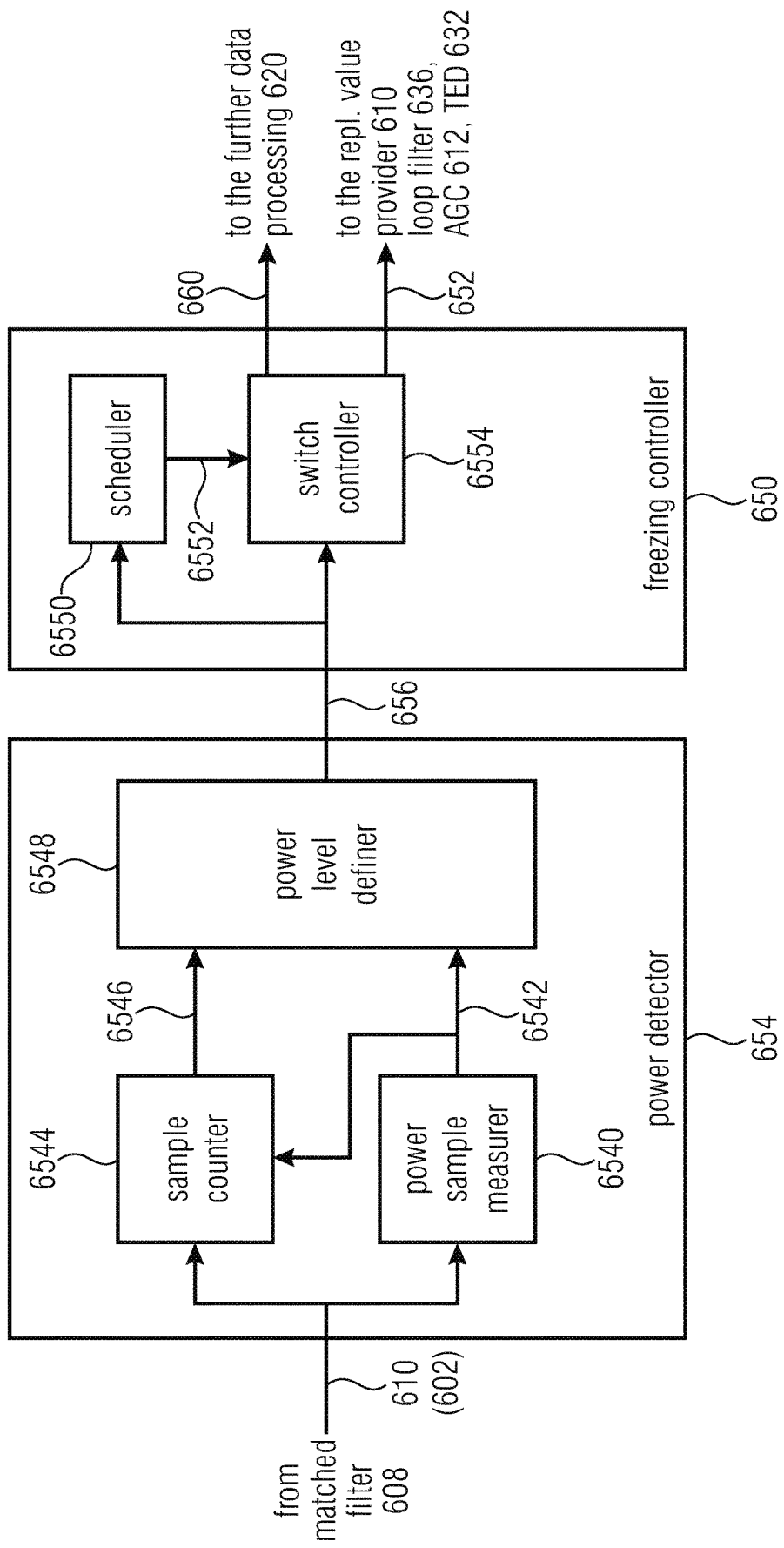
FIG. 6c: shows components according to an example.
Figure 6D:
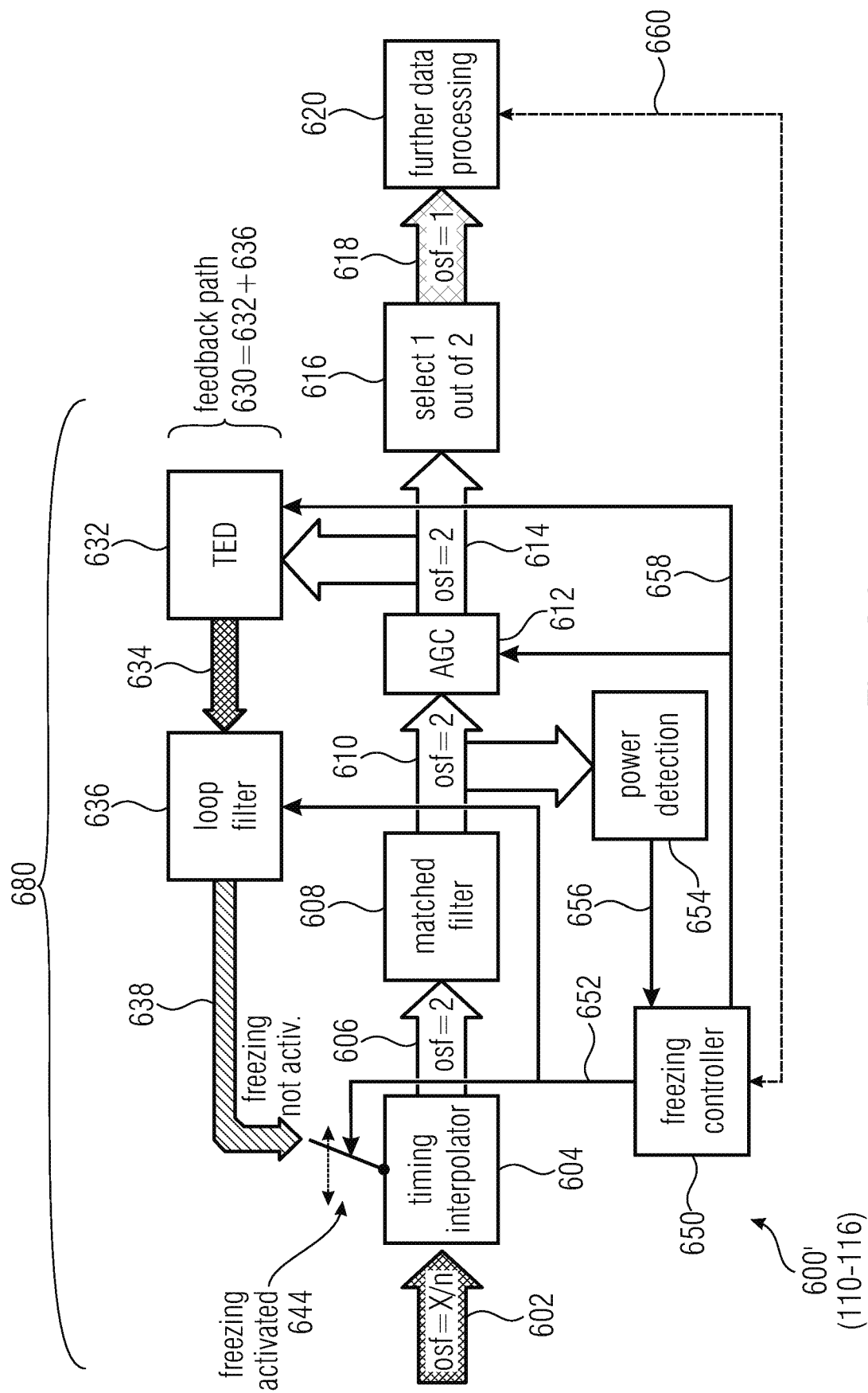
FIG. 6d: shows a variant of the example of FIG. 6.

FIG. 6c shows an example of the control unit 650, 654. The power detector 654 may receive an input, for example from the matched filter 608, to obtain a version 610 of the input signal 602 (different version of the input signals may be used in other examples, e.g. signal taken from before the matched filter 606). The power detector 654 may comprise a power sample measurer 6540, which may, for example, obtain a sample 6542 (e.g., $p_{act}[i]$) associated to the current sample of the version 610 of the signal 602. The power sample measurer 6540 may provide, in addition or in alternative, an filtered or averaged version of the power. The power sample measurer 6540 may comprise a sample counter 6544, which may provide a current index 6546 of the present sample of the version 610 of the signal 602. The sample counter 6544 may count, for example, how many consecutive power samples are within the interval 744 and/or how may samples 748 are out of the current interval 744. The power detector 654 may comprise a power level definer which determines the current power level from the samples 6542 and the current index 6546. The power level definer 6548 may therefore provide a power information 656 to be provided to the freezing controller 650. The freezing controller 650 may comprise a scheduler 6550 which may obtain scheduling information 6552 from the power information 656. (The scheduler 6550 may also obtain, in some examples, information from other components, such as from signalling.) A switch controller 6554 may obtain the scheduling information 6552 and the power information 656. In some examples, the switch controller 6554 may check whether the current power level is compliant to the scheduling information 6552. On the basis of the scheduling information and/or the power information 656, the switch controller 6554 may determine whether the receiver is currently illuminated or not (and/or fulfils the predetermined condition). On the basis of the scheduling information and/or the power information 656, the switch controller 6554 may actuate the switch 644, so as to perform a selection between a provision of the feedback signal 638 to the timing interpolator 604 and a provision of the replacement sample timing information 642 to the timing interpolator 604.

Innovative Aspect 3: Framing Verification and Correction to Tackle Sporadic Symbol Offsets The signal processing 600 of the receiver (e.g., 110, 112, 114) may comprise a further data processing block 620, which is represented in detail in FIG. 8. Timing loop components of the processing 600 may be understood as being included in block 680 cf. FIG. 6 (or "burst-mode capable timing loop").

It is now examples how frames may be re recognized from sequences of symbols. Data 618 are provided from the block 680 to the block 620, for example in the form of a succession of symbols. The block 620 may comprise, for example, a preamble detector 802 and/or a framing verification and correction block 808 (framing verification and correction). The blocks 802 and 808 may form a data processor 820 which identifies the start and end of frames in the sequence of frames. The block 802 may provide the block 808 with symbols in ordered sequences 804 which may be, for example, frame candidates. The block 802 (which may be a preamble detector) may perform known strategies, such as, for example, recognizing particular sequences (e.g., a preamble in the header of a frame) which are assumed to be uniquely positioned in fixed fields of the frames (e.g., according to a particular standard, protocol, etc.). Additionally or alternatively, the block 802 may compare the time instant at which a new frame is expected.

The start of each frame or data field within the frame may be signalled by block 802 using signal 806, for example. The signal 806 may be a binary signaling information flags (framing data flag), which may be synchronous to the symbols. Each flag/bit may mark a different field. E.g. the flag may be 1 in presence of pilot symbols (e.g., when a pilot sequence is determined), while the flag may be 0 in absence of pilot symbols (e.g., when a pilot sequence is not determined anymore, e.g., in the presence of payload). At a start-of-frame, the flag may therefore be 1 and may be maintained at 1 for all the initial symbols of the frame, while the flag may return to 0 when the pilot sequence is ended.

Figure 10:
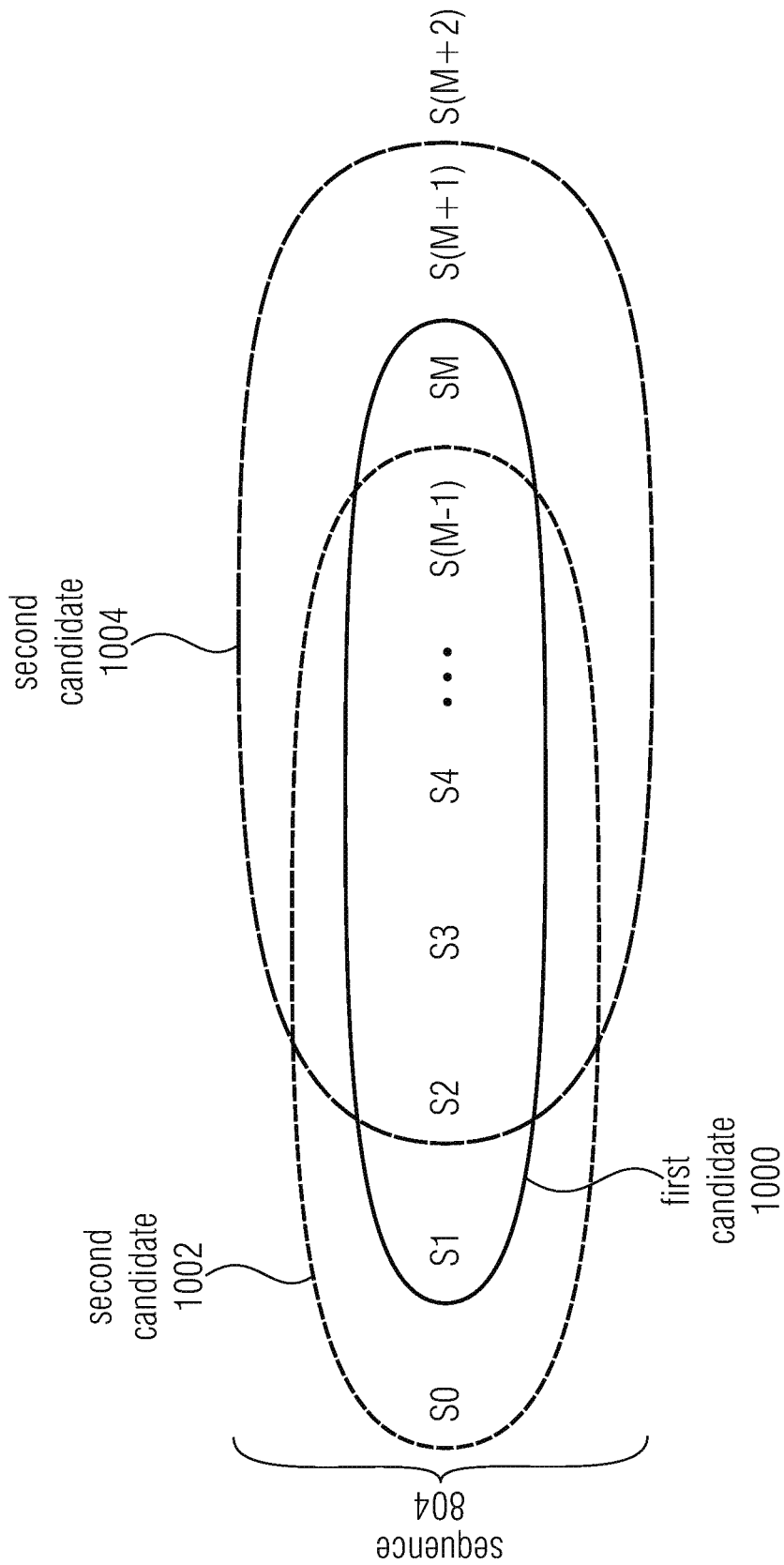

An example is provided by FIG. 10. Here, a sequence of symbols S0, S1, . . . , SM, S(M+1), S(M+2) . . . is sequentially obtained by the block 808 from the block 802. The block 802 has recognized a start of a frame (e.g., by analyzing the preamble or by the fact that the first symbol is associated to the expected time instant) at symbol S1. Therefore, block 808 may evaluate:
- the first frame candidate 1000, constituted by the sequence S1 . . . SM (and is associated with the signal 806);
- a second frame candidate 1002, constituted by the sequence S0 . . . S(M−1) (and shifted for one symbol before the first symbol of the first frame candidate 1000 and its signalling via signal 806);
- another second frame candidate 1004, constituted by the sequence S2 . . . S(M+1) (and shifted for one symbol after the first symbol of the first frame candidate 1000 and its signalling via signal 806).

The block 808 may evaluate properties of the signal 804 with respect to frame candidates 1000-1004 so as to identify which is the correct start of frame among the candidates. The block 808 may perform hypothesis testing.

For example, the block 808 may perform correlation processes on the signal 804 with respect to candidates, so as to recognize the most suitable one.

For example, the block 808 may perform cross correlation processes between each frame candidate and a known sequence of symbols (e.g., the expected preamble), so as to identify the correct frame on the basis of the cross correlation processes. With the correlation process it is possible to understand which frame candidate is the correct frame with highest probability.

In examples, the block 808 may demodulate and/or decode a frame header of the first and second frame candidates, re-modulate and/or re-encode the sequence of symbols, and perform the cross correlation processes between each frame candidate frame header and the re-modulated and/or re-encoded version of the frame candidate frame header, so as to identify the correct frame on the basis of the cross correlation processes. This is of particular relevance if there is no known sequence available for verification. Commonly the frame header decoding is much less complex than frame data decoding (using much longer code words).

In some examples, it is possible to compare the amplitude and/or the phase (e.g., the complex phase) with an expected amplitude and/or phase, for example. If a candidate has not the correct phase or correct amplitude (or an amplitude or phase within a predetermined range), the frame candidate may be discarded. Hence, the frame candidate with the phase and/or amplitude which is most similar to the expected phase and/or amplitude will be identified as correct.

If one of the second frame candidates 1002 and 1004 is identified as the correct frame, the framing signalling 806 is shifted so as to be in the correct position corresponding to the expected time instant. Then this updated and verified signalling is referred to as 812 (correct framing data flag).

Figure 9:
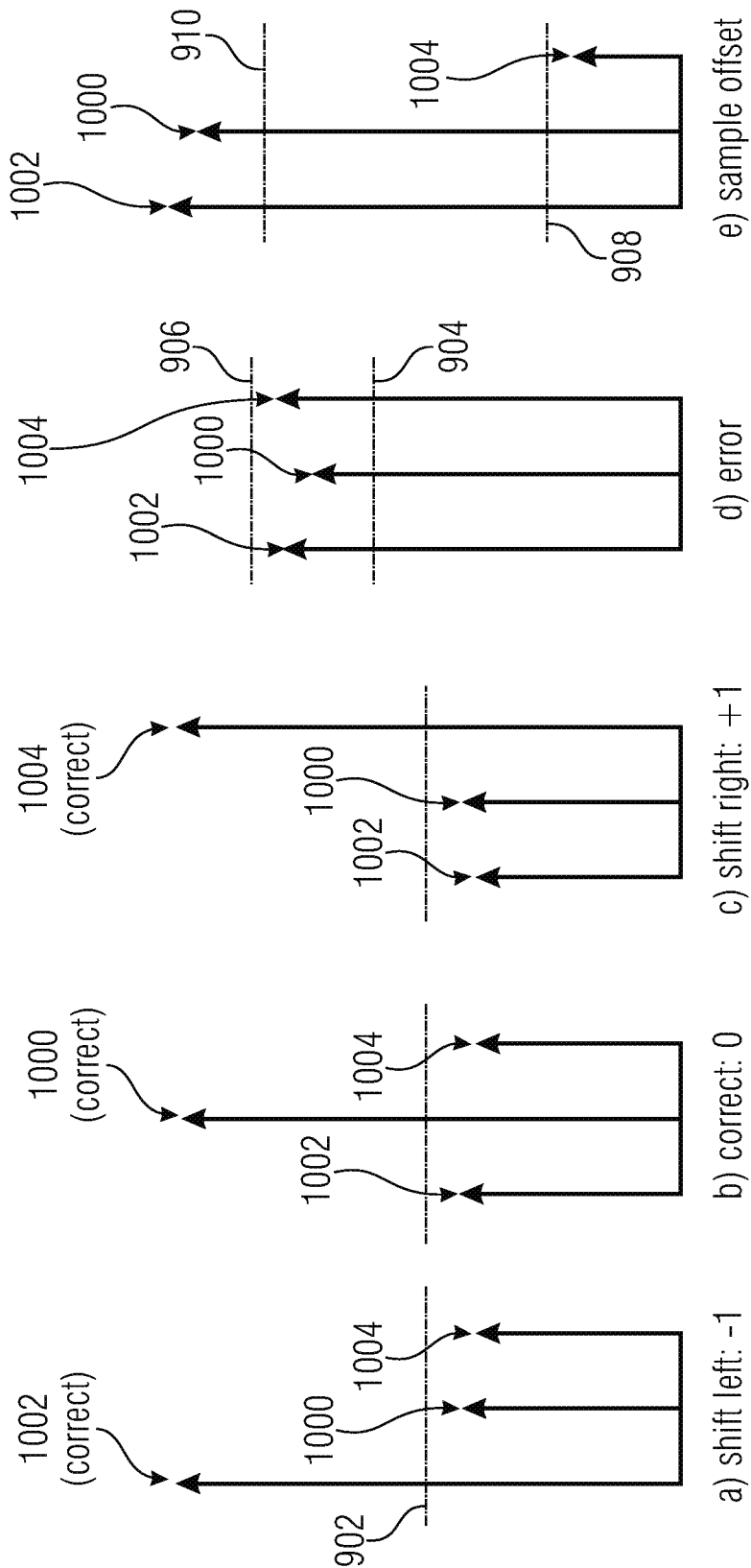
FIGS. 9 and 10: shows different detection cases of a correct frame.

With reference to the methods for which the cross correlation processes are performed, FIG. 9 shows some validation strategies which may permit to validate the identified correct frame.

It is possible to validate the correct frame, for example, by performing comparisons in the cross correlation amplitudes.

Examples of validation are provided in FIG. 9 with reference to the examples of FIG. 10. In abscissa there is provided the obtained cross correlation value. In FIG. 9a, the detected start of frame is the first of the second frame candidates 1002 (which is shifted of one symbol before, i.e. "−1"). In FIG. 9b, the detected start of frame is the first frame candidate 1000 (as correctly indicated by the block 802). In FIG. 9c, the detected start of frame is the frame candidate 1004 (which is shifted of one symbol after, i.e. "+1"). In the three cases, the identified frame shift is validated, as the correct frame is the only frame with cross correlation value larger than a threshold 902, while the incorrect candidates have cross correlations below the threshold 902. When the correct candidate is validated, the frame may be decoded.

FIG. 9d shows an error state, in which the values of the cross correlations of all the candidates are within a range defined by a smaller predetermined threshold 904 and a larger predetermined threshold 906. In this case, an error notification is transmitted, as it is not possible to identify the correct frame.

FIG. 9e shows an intermediate timing synchronization state in which two candidates (1002, 1000) have cross correlations larger than a larger predetermined threshold 910 (which in examples may be the same of the threshold 906 or 902), while one candidate (1004) has cross correlation smaller that a predetermined threshold 908 (which in examples may be the same of the threshold 904).

The validated frames 810 (together with the validated and corrected frame signalling 812) may be provided to further data processing modules 814 which may use the information contained in the received (and decoded) data.

In some examples, the validation of a correct frame alignment with respect to the signalling 806 may trigger the transmission of a notification 840 (which may be understood as the communication 660 or part of it) to the freezing controller 650, which may therefore use this information for the purposes of controlling the other components of the processing 600. In particular, the freezing controller 650 may use the notification 840 (660) to verify the power level 656 as detected by the power detector 654. On the basis of the notification 840 (660) and/or of the detected power 656, the freezing controller 650 may also switch between the feedback mode and the replacement value provision mode (and/or the intermediate mode).

Notably, however, the block 620 may also be deactivated by the command 842 (660), which may be sent by the freezing controller 650, e.g., when non-illuminated status is identified. Therefore, the block 620 will not decode useless data when the controller unit 650, 654 determines the non-illumination of the receiver (e.g., 110-114).

A discussion on the third inventive aspect is now provided.

As shown in Fig., the additional module "Framing Verification and Correction" 808 is placed directly after the preamble sequence detection 802. It receives the data symbols 804 as well as the corresponding framing information 806 generated in the preamble detector 802. As this information can be inaccurate as already explained, the module "Framing Verification and Correction" 808 checks the framing information 806. Different types of framing check methods can be:

Detection of another data sequence (known to the receiver) appearing (once or repetitively) after the preamble sequence:
For example a cross correlation can be applied. Here, a low complexity implementation can be achieved by exploiting that another data sequence is expected to appear only in the range of +/−1 symbol around the nominally expected time instance signaled by the framing information. In this case, three correlation results are then compared in amplitude. Symbol offset detection decision is made based on the largest of the three correlation amplitudes.

Production of another data sequence for comparison:
For example by demodulation & decoding of a received code word and re-encoding & modulation of this code word at the different framing hypotheses with respective symbol offsets −1, 0, +1. Then, the above mentioned cross correlation method is used, where each received code word hypothesis is correlated with its corresponding re-encoded & modulated code word version. Then, symbol offset detection decision is made again based on the largest of the three correlation amplitudes.

Detecting change in data characteristics:
For example the amplitude or the complex phase of the received signal changes in such an expectable manner that a detector can determine the correct time instant of change and compares it against the framing information to determine the symbol offset.

Figure 8:
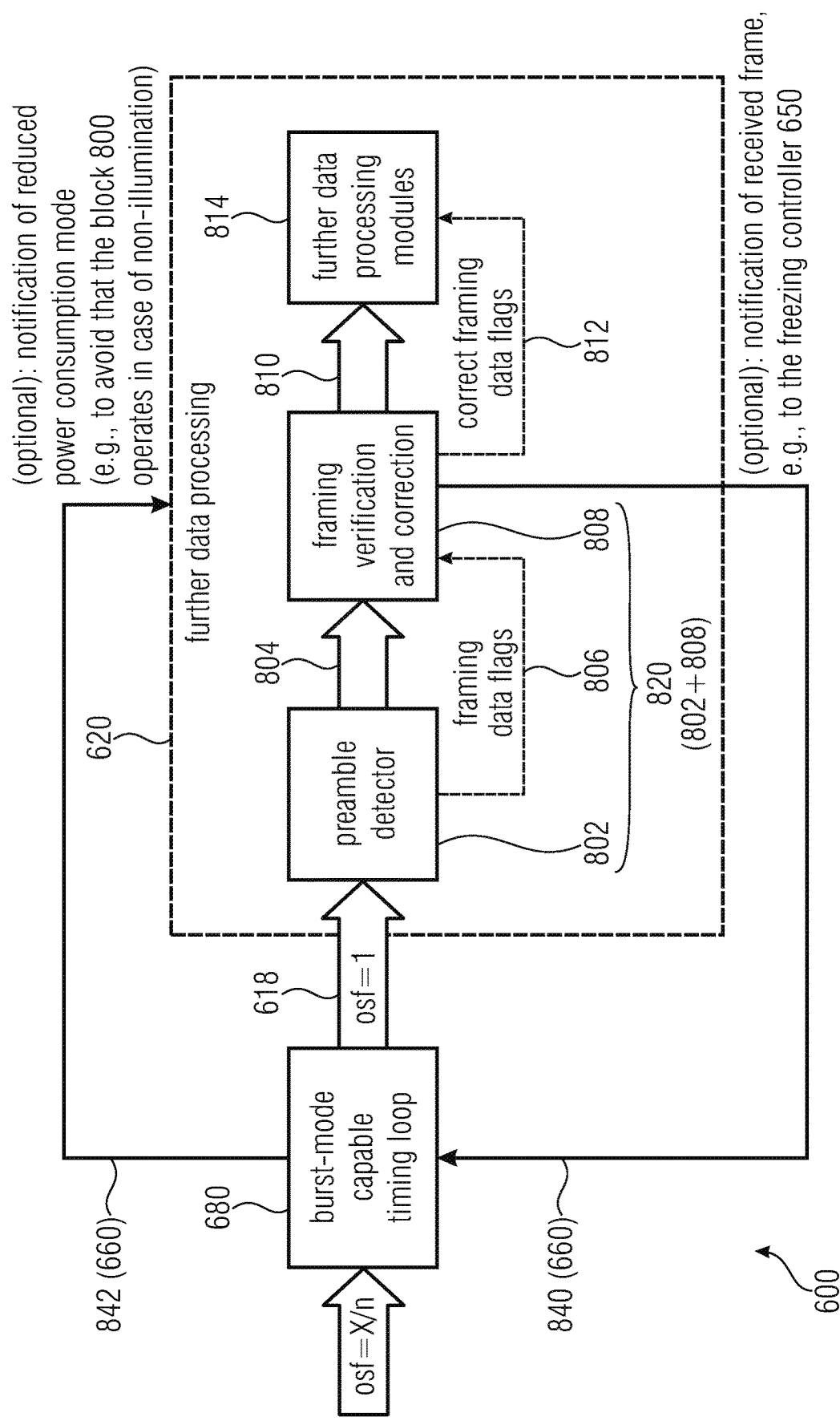
FIG. 8: shows a block scheme of a component of a receiver signal processing of a receiver. The component includes a "Framing Verification and Correction" block after the module "Preamble Detector" in the block "Further data processing".

Having identified a non-zero symbol offset, correction can be accomplished either by insertion/deletion of data symbols (modification 804→810) or by a correcting shift of the framing information (modification 806→812). The latter correction is shown in FIG. 8 where information 812 is called "correct framing data flags".

Of course, further checks and analyses can be made on top of only deciding for the maximum amplitude hypothesis. This is visualized in FIG. 9, where different detection cases and applied thresholds are shown. Although the following description of analyses considers the actual hypothesis correlation amplitudes, the history of them can be taken into account as well.

"Peak Validation" by testing that the lower two correlation amplitudes are below a threshold derived from the current (and potentially also previous) maximum correlation amplitude. Thus, the three detection cases in FIGS. 9a), b), and c) are validated because below the dash-dotted threshold line.

"Timing Convergence Ongoing"
If there is a second correlation amplitude very close to the maximum correlation amplitude as shown in FIG. 9e), it reflects that the correct sampling time instant should be in between the two high correlation amplitude. This means that the timing synchronization has not yet settled and convergence is ongoing. The first threshold is needed to identify the second high correlation amplitude and the second threshold is needed to distinguish this case from the error case of FIG. 9d).

"Error" if all three amplitudes exhibit very similar values within a confidence interval (i.e. upper and lower threshold). This can happen due to larger symbol offset than covered by the amount of hypotheses or no signal is present. Also implausible amplitude values will lead to "Error" like two very high correlation amplitudes at symbol offsets +1 and −1 while low value at 0.

Of course, the flow of data has to be buffered until the decision is available and correction can be applied.

Possible Aspects (Optionally Usable in Embodiments of the Invention, Individually or in Combination):
Timing loop concepts, cf. [7] and [8]
Using DA- or NDA-timing error detectors, and/or
Using loop filters and averaging of timing error signal, and/or
Freezing the timing loop feedback so that the interpolator keeps running according to latest feedback value
Freezing the AGC scaling adaptation
Power detection focused on rise/falling edge detection, e.g. threshold-based or slope-based
Algorithms for Preamble/known sequence detection, c.f. e.g. [9]

Inventive Aspects (Usable Individually or in Combination With Any of the Embodiments Described Herein):
Main Aspect: Calculate a replacement value from the loop filter output signal and/or a loop filter internal signal and apply this value instead of the instantaneous loop filter output, when the freeze signal is set ON. Optionally prepare re-initialization information for the loop filter re-activation. Optionally switch back when freeze signal is OFF and loop filter restarts processing based on the re-initialization information.
Optionally configurable w.r.t. snapshot distance depending e.g. on the used roll-off
Optionally use enhanced bit-width for the NCO input compared to standard approach
Freezing Control (sub-aspect, useable in combination with the main aspect but also useable individually) can be driven by power-level detection plus (optionally) any combination of the other following methods. Note that "combination" can be either joint/simultaneous usage (e.g. with changing prioritization) or consecutive usage or even both.
Power detection that identifies power levels (baseline for acquisition because robust but delay) rather than exact start and end of illumination
Optionally Tracks history of previously identified power levels to rate actual detections
Optionally Adaptive threshold calculations and updates
Optionally Use power detection also for cross-check of valid freezing ON/OFF
Optionally enhanced detection delay by applying a further threshold/interval check to identify significant power change to have early indication on start of new power level.
Preamble/known sequence detection (in tracking mode)
Freezing control can optionally also drive an adaptive threshold calculation freeze of the preamble/known sequence detection algorithm based on power detection info!
Internal triggers for freezing signal ON/OFF like counters (¾ of a super-frame)
External indicators/triggers for freezing signal ON/OFF Freezing Control additional optional features (one or more features can optionally be used)
  Controller can also be used to signal sleep mode to other modules of the receiver.
    For this, illumination statistics of the history and/or signaled side information can optionally be used to assure not missing an illumination.
  Ability to detect and distinguish between bursty or continuous signal reception:
    Bursty signal reception:
      Reception of one or multiple illuminations of one or different coverages is optionally identified by evaluating the history of detected power levels. From this statistics, for example, the strongest power levels can be recognized and are used to un-freeze and adapt. Complementary information about measured SNR or correlation peak detections and peak amplitude or signaled information like coverage-ID can be taken into account for joint evaluation and for fine tracking of the differences.
    Continuous signal reception:
      If the power level detection does not detect a change in power levels or significantly different power levels, for example, first the hypothesis is tested that a continuous signal may be received. So freezing is set OFF to start the timing loop and e.g. a preamble/known sequence detection algorithm is applied to confirm the hypothesis. If negative, only noise but no signal is received.
  Above concepts, where timing loop configuration can be modified/adjustable:
    Loop filter configuration: Higher loop gain for faster convergence during an initial time duration; and/or
    Loop filter configuration: Higher loop gain for faster convergence in case of higher SNR and less loop gain in case of lower SNR; and/or
    Timing-Error Detector: Switching calculation mode/principle, e.g. between NDA- and DA-mode
  Supporting module for assuring correct framing synchronization
    Implementation exploiting that only very few symbol offset hypothesis have to be checked, e.g. three in case of checking symbol offsets −1, 0, +1 with respect to expected framing after timing loop convergence
    Rating of the decision of the derived hypothesis by sanity checks: "Peak Validation" and/or "Timing Convergence Ongoing" and/or "Error".
  Implementation Alternatives Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

Examples above may refer to wireless transmissions, such as radio frequency (e.g., RF) transmissions.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] J. Anzalchi, A. Couchman, C. Topping, P. Gabellini, G. Gallinaro, L. D'Agristina, P. Angeletti, N. Alagha, A. Vernucci, "Beam Hopping in Multi-Beam Broadband Satellite Systems," 2010 5th Advanced Satellite Multimedia Systems (ASMS) Conference and the 11th Signal Processing for Space Communications (SPSC) Workshop, Cagliari, 2010, pp. 248-255.

[2] X. Alberti and J. M. Cebrian and A. Del Bianco and Z. Katona and J. Lei and M. A. Vazquez-Castro and A. Zanus and L. Gilbert and N. Alagha, "System capacity optimization in time and frequency for multibeam multi-media satellite systems," 2010 5th Advanced Satellite Multimedia Systems Conference and the 11th Signal Processing for Space Communications Workshop, Cagliari, 2010, pp. 226-233.

[3] H. Fenech; S. Amos, Eutelsat Quantum-a Game Changer, 33rd AIAA International Communications Satellite Systems Conference (ICSSC), QT Surfers Paradise, Gold Coast QLD Australia, 7-10 Sep. 2015.

[4] E. Feltrin, S. Amos, H. Fenech, E. Weller, "Eutelsat Quantum-Class Satellite: Beam Hopping", 3rd ESA Workshop on Advanced Flexible Telecom Payloads. March 2016.

[5] ETSI EN 302 307-2 V1.1.1 (2014-10), Digital Video Broadcasting (DVB); Second generation framing structure, channel coding and modulation systems ( . . . ); Part 2: DVB-S2 Extension (DVB-S2X).

[6] C. Rohde, R. Wansch, G. Mocker, S. Amos, E. Feltrin, H. Fenech, "Application of DVB-S2X Super-Framing for Beam-hopping Systems," 23rd Ka and Broadband Communications Conference, October 2017, Trieste, Italy.

[7] Mengali, D'Andrea, "Synchronization Techniques for Digital Receivers", Plenum Press, New York, USA, 1997. (Chapter 7+8, pp. 353-476)

[8] Meyr, Moeneclaey, Fechtel, "Digital Communication Receivers: Synchronization, Channel Estimation, and Signal Processing", Wiley Series in Telecommunications and Signal Processing, John Wiley & Sons, Inc., New York, USA, 1998 (pp. 79-147, 229-232)

[9] C. Rohde, N. Alagha, R. De Gaudenzi, H. Stadali, G. Mocker, "Super-Framing: A Powerful Physical Layer Frame Structure for Next Generation Satellite Broadband Systems," Int. Journal of Satellite Communications and Networking (IJSCN), Wiley Press, vol. 34, no. 3, pp. 413-438, November 2015, SAT-15-0037.R1. Available: http://dx.doi.org/10.1002/sat.1153

The invention claimed is:

1. A controller unit for recognizing a transmission to be received, wherein the controller unit is configured to:
   perform a determination whether a power of a receive signal, or a quantity derived from the power, lies within a limited interval, and
   recognize the transmission to be received based on the determination that the power of the receive signal, or the quantity derived from the power, lies within the limited interval, and
   recognize different power levels of the receive signal, or of the quantity derived from the power, and periods of time during which the different power levels are present, so as to rank the different time periods to recognize the time periods for the transmission to be received and/or to re-configure a receiver differently for different time periods.

2. The controller unit of claim 1, configured to identify whether the receive signal comprises a power level associated to a previously determined power interval.

3. The controller unit of claim 1, configured to determine how long the power of the receive signal, or the quantity derived from the receive signal, lies within the limited interval, in order to recognize a length of at least one limited time period during which the receive signal is at a power level associated to the limited interval.

4. The controller unit of claim 3, configured to check whether the recognized length of the limited time period during which the receive signal comprises the power level fulfils a predetermined condition, to recognize a transmission to be received.

5. The controller unit of claim 1, configured to track durations during which the different power levels are present, to derive a scheduling information from the different power levels of the receive signal.

6. The controller unit according to claim 5, configured to check whether a current power level lies within a limited interval, and to determine interval boundaries of the limited interval based on the previously derived scheduling information.

7. The controller unit according to claim 5, configured to selectively switch a receiver or a processing or components of the receiver or of the processing to a reduced-power-consumption mode based on the derived scheduling information.

8. The controller unit of claim 1, configured to recognize different power levels of the receive signal, or of the quantity derived from the power, so as to choose, as the time period for the transmission to be received, a time period with comparatively higher power level with respect to a time period with comparatively lower power level.

9. The controller unit of claim 1, configured to store time information characterizing time portions of different levels of the receive signal, and to store information on the power levels of the receive signal, or the quantity derived from the power,
   and wherein the controller unit is configured to recognize, in subsequent instants, time periods associated to the transmission to be received based on at least the stored time information.

10. The controller unit of claim 1 further comprising a special activation mode based on the detection of power levels of transmissions which are not to be received and qualification of the transmissions which are not to be received.

11. The controller unit of claim 1, configured to recognize a start and/or an end of the period of the transmission to be received based on the recognized different power levels.

12. The controller unit of claim 1, configured to decode and/or detect at least one information encoded in the receive signal, so as to determine the start and/or the end of a period of a transmission to be received.

13. The controller unit of claim 1, configured to recognize a start and/or an end of the period of the transmission to be received by a redundant or supporting technique, the redundant or supporting technique verifying the correctness of the determination, the redundant or supporting technique comprising at least:
   detecting whether a slope in the power is under or over a predetermined threshold.

14. The controller unit of claim 1, configured to recognize and/or dynamically define at least one power level based on the determination that at least two consecutive power samples lie within limited intervals associated with a particular power level.

15. The controller unit of claim 1, configured to recognize a continuation of a power level by recognizing that both the first condition and the second condition are fulfilled:
   first condition: a current sample of a power of a receive signal, or of a quantity derived from the power, lying within an interval determined by a first preceding sample of the power of the receive signal, or of the quantity derived from the power, and
   second condition: the current sample of the power of the receive signal, or of the quantity derived from the power, also lying within an interval determined by a second preceding sample of the power of a receive signal, or of the quantity derived from the power.

16. The controller unit according to claim 1, configured to tolerate a predetermined number of consecutive samples of the power of the receive signal, or of the quantity derived from the power, which do not fulfil the first condition and/or the second condition without recognizing an end of a power level, and to recognize an end of a power level if more than the predetermined number of consecutive samples of the power of the receive signal, or of the quantity derived from the power, do not fulfil the first condition or the second condition.

17. The controller unit of claim 1, configured to also determine whether a current sample of a power of a receive signal, or of a quantity derived from the power, lies outside of a tolerance interval, which is larger than an interval determined by a directly preceding sample of the power of the receive signal, or of the quantity derived from the power, and wherein the controller unit is configured to recognize an end of a power level when the current sample of the power of a receive signal, or of the quantity derived from the power, lies outside of the tolerance interval for the first time.

18. The controller unit of claim 1, further configured to operate according at least a first and a second operational mode, wherein in at least one of the first and second operational modes the controller unit is configured to perform at least one of the following techniques:

determining if a power of a receive signal, or a quantity derived from the power lies within a limited interval;

verifying if a power is determined at an expected time period;

decoding or detecting a particular information encoded in the signal to be received;

checking quality information;

checking a fulfilment of criteria according to information signalled from a transmitter;

detecting whether a slope in the power is under or over a predetermined threshold;

wherein the controller unit is configured to use at least one different technique in the first operational mode with respect to the second operational mode.

19. The controller unit of claim 1, configured to operate according to at least two operational modes:

a first mode in which the controller unit determines if a power of the receive signal, or the quantity derived from the power, lies within a limited interval, without considering information encoded in the signal; and a second mode in which the controller unit performs both the following operations:

determining whether a power of the receive signal, or the quantity derived from the power, lies within a limited interval; and verifying the correctness of the determination based on whether information encoded in the received signal is compliant to a recognition of a transmission to be received based on the power.

20. The controller unit of claim 1, configured to derive or acquire, from an automatic gain control, AGC, and/or matched filter a quantity derived from the power.

21. The controller unit of claim 1, wherein the quantity associated to the power is an infinite impulse response, IIR,-filtered version of a power information.

22. The controller unit of claim 1, configured to perform an initialization procedure to acquire parameters associated to at least one or a combination of:

power so as to determine at least one power level to be subsequently used to recognize a transmission to be received;

time information;

quality information;

wherein the controller unit is configured to analyze a temporal evolution of the power, or of the quantity derived from the power, over a period of the receive signal in order to perform the initialization, or to receive a signalled information in order to perform the initialization.

23. The controller unit of claim 1, configured to adaptively modify a lower interval boundary value and an upper interval boundary value for the power based on historical values of the power.

24. The controller unit of claim 1, configured to control a wireless receiver so as to select between:

a first status, in which the feedback path provides the feedback signal to the adjustable sample provider; and a second status, in which the replacement value provider provides the replacement sample timing information to the adjustable sample provider.

25. The controller unit of claim 1, configured to control a wireless receiver so as to determine the predetermined requirement to be fulfilled by the input signal.

26. The controller unit of claim 1, configured to control a wireless receiver so as to select that:

the feedback path provides the feedback signal to the adjustable sample provider when the controller unit recognizes that the transmission is to be received; and/or the replacement value provider provides the replacement sample timing information to the adjustable sample provider when the controller unit recognizes no transmission or that the transmission is not a transmission to be received.

27. The controller unit of claim 9, configured to recognize a start and/or an end of the period of the transmission to be received by a redundant or supporting technique, the redundant or supporting technique verifying the correctness of the determination, the redundant or supporting technique comprising:

using the stored time information acquired with previous power level determinations.

28. The controller unit of claim 12, configured to recognize a start and/or an end of the period of the transmission to be received by a redundant or supporting technique, the redundant or supporting technique verifying the correctness of the determination, the redundant or supporting technique comprising:

decoding the at least one information encoded in receive signal.

29. The controller unit of claim 1, configured to recognize a start and/or an end of the period of the transmission to be received by a redundant or supporting technique, the redundant or supporting technique verifying the correctness of the determination, the redundant or supporting technique comprising:

detecting quality information or deducing the quality information from a signal to noise ratio estimator.

30. The controller unit of claim 1 configured to recognize a start and/or an end of the period of the transmission to be received by a redundant or supporting technique, the redundant or supporting technique verifying the correctness of the determination, the redundant or supporting technique comprising:

using data signalled from and/or commands from a transmitter.

31. A method for recognizing a transmission to be received, comprising:

determining if a power of a receive signal, or a quantity derived from the power lies within a limited interval, and recognizing the transmission to be received based on the determination that the power of the receive signal, or the quantity derived from the power, lies within the limited interval recognizing different power levels of the receive signal, or of the quantity derived from the power, and periods of time during which the different power levels are present, so as to rank the different time periods to recognize the time periods for the transmission to be received and/or to re-configure a receiver differently for different time periods.

32. A non-transitory digital storage medium having a computer program stored thereon to perform the method for recognizing a transmission to be received, comprising:

determining if a power of a receive signal, or a quantity derived from the power lies within a limited interval, and recognizing the transmission to be received based on the determination that the power of the receive signal, or the quantity derived from the power, lies within the limited interval recognizing different power levels of the receive signal, or of the quantity derived from the power, and periods of time during which the different power levels are present, so as to rank the different time periods to recognize the time periods for the transmission to be received and/or to re-configure a receiver differently for different time periods, when said computer program is run by a computer.

* * * * *